US012615900B2

(12) United States Patent
Lee et al.

(10) Patent No.: US 12,615,900 B2
(45) Date of Patent: Apr. 28, 2026

(54) DISPLAY DEVICE AND METHOD OF MANUFACTURING THE SAME

(71) Applicant: Samsung Display Co., LTD., Yongin-si (KR)

(72) Inventors: Seung Geun Lee, Yongin-si (KR); Min Woo Kim, Yongin-si (KR); Byung Ju Lee, Yongin-si (KR); Dae Ho Song, Yongin-si (KR); Jin Woo Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 936 days.

(21) Appl. No.: 17/704,217

(22) Filed: Mar. 25, 2022

(65) Prior Publication Data

US 2022/0352251 A1 Nov. 3, 2022

(30) Foreign Application Priority Data

Apr. 30, 2021 (KR) ........................ 10-2021-0056838

(51) Int. Cl.
*H10H 20/84* (2025.01)
*H10H 20/812* (2025.01)
(Continued)

(52) U.S. Cl.
CPC ........ *H10H 29/142* (2025.01); *H10H 20/812* (2025.01); *H10H 20/833* (2025.01);
(Continued)

(58) Field of Classification Search
CPC .. H10H 20/812; H10H 20/833; H10H 20/851; H10H 20/8513; H10H 20/0361;
(Continued)

(56) References Cited

U.S. PATENT DOCUMENTS 8,942,269 B2 1/2015 Kasugai et al.
10,008,645 B2 6/2018 Bonar et al.
(Continued)

FOREIGN PATENT DOCUMENTS

CN 111165074 A 5/2020
CN 111580269 A 8/2020
(Continued)

OTHER PUBLICATIONS

Park Chan Keun, "English Translation of KR20180076497A"., 2018 (Year: 2018).*
(Continued)

*Primary Examiner* — Kretelia Graham
*Assistant Examiner* — Hamna Fathima Iqbal
(74) *Attorney, Agent, or Firm* — CANTOR COLBURN LLP

(57) ABSTRACT

The disclosure relates to a display device and a method of manufacturing the same. A display device includes a pixel including a first electrode, a light emitting element disposed on the first electrode, and a second electrode disposed on the light emitting element. The light emitting element includes: an emission layer that generates light of a first color; a first light conversion layer disposed between the emission layer and the first electrode to convert the light of the first color into light of a second color; a second light conversion layer disposed between the first light conversion layer and the first electrode to convert the light of the first color or the light of the second color into light of a third color; and a first semiconductor layer disposed between the emission layer and the second electrode and including a first conductivity type dopant.

11 Claims, 29 Drawing Sheets

(51) Int. Cl.

| | |
|---|---|
| *H10H 20/833* | (2025.01) |
| *H10H 20/851* | (2025.01) |
| *H10H 29/14* | (2025.01) |
| *H10H 20/01* | (2025.01) |

(52) U.S. Cl.
CPC .......... *H10H 20/84* (2025.01); *H10H 20/851* (2025.01); *H10H 20/032* (2025.01); *H10H 20/034* (2025.01); *H10H 20/0361* (2025.01)

(58) Field of Classification Search
CPC .. H10H 20/813; H01L 25/167; H01L 25/0753
See application file for complete search history.

(56) References Cited

U.S. PATENT DOCUMENTS

| | | | |
|---|---|---|---|
| 10,636,349 B2 | 4/2020 | Shin et al. | |
| 11,744,114 B2 | 8/2023 | Baek et al. | |
| 12,150,327 B2 | 11/2024 | Li | |
| 12,279,471 B2 * | 4/2025 | Utsumi | ................ H10K 59/353 |
| 2015/0185381 A1 * | 7/2015 | Wu | ........................ H10K 59/38 |
| | | | 977/774 |

| | | | |
|---|---|---|---|
| 2017/0186908 A1 | 6/2017 | Robin et al. | |
| 2019/0131356 A1 * | 5/2019 | Steckel | ................ H10K 50/115 |
| 2019/0320517 A1 | 10/2019 | Nakanishi et al. | |
| 2022/0139998 A1 * | 5/2022 | Herner | ................ H01L 23/5252 |
| | | | 257/89 |
| 2022/0352247 A1 | 11/2022 | Song et al. | |

FOREIGN PATENT DOCUMENTS

| | | | |
|---|---|---|---|
| CN | 112635523 A | | 4/2021 |
| KR | 10-2017-0142022 | | 12/2017 |
| KR | 10-2018-0076497 | | 7/2018 |
| KR | 20180076497 A | * | 7/2018 |
| KR | 10-2018-0118488 | | 10/2018 |
| KR | 10-1968592 | | 4/2019 |
| KR | 10-2020-0022575 | | 3/2020 |
| KR | 10-2022-0149883 | | 11/2022 |

OTHER PUBLICATIONS

Korean Notice of Allowance dated Jan. 25, 2025, in Korean Patent Application No. 10-2021-0056838.

* cited by examiner

FIG. 1
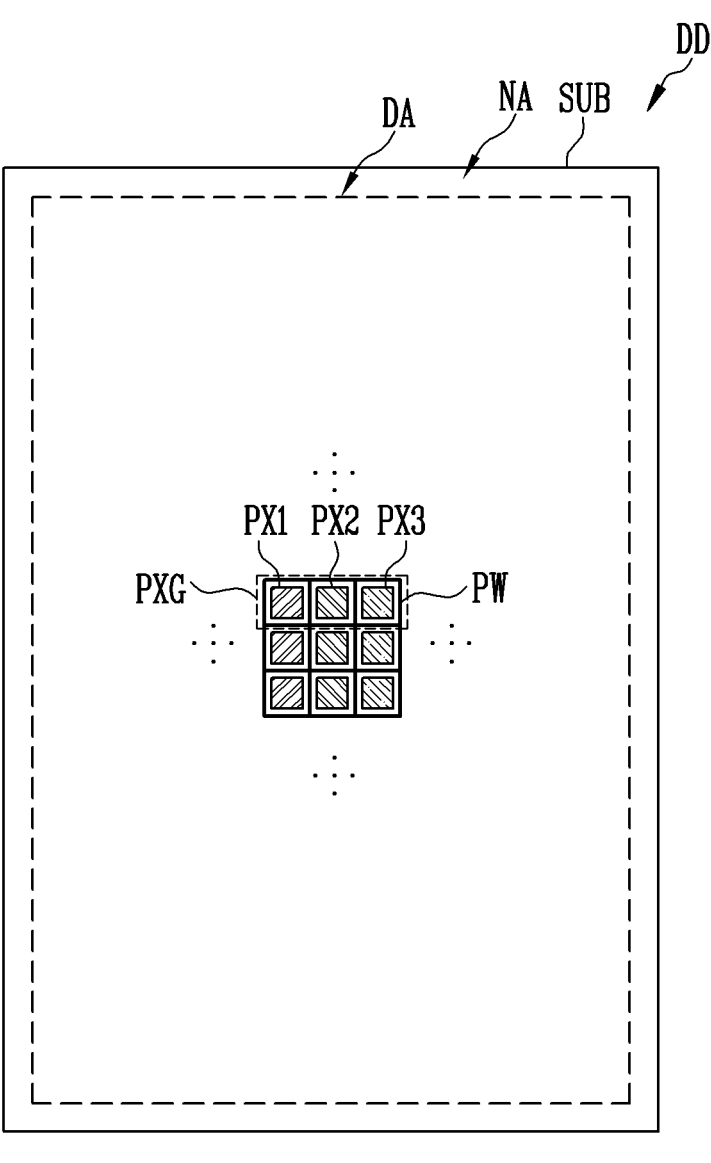
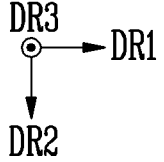
PX: PX1, PX2, PX3

M: M1, M2, M3

M: M1', M2', M3', M4, M5, M6, M7

CF: CF1, CF2, CF3
EMA: EMA1, EMA2, EMA3
PXA: PXA1, PXA2, PXA3

FIG. 7

CF: CF1, CF2, CF3
EMA: EMA1, EMA2, EMA3
PXA: PXA1, PXA2, PXA3

CF: CF1, CF2, CF3
EMA: EMA1, EMA2, EMA3
PXA: PXA1, PXA2, PXA3

FIG. 11

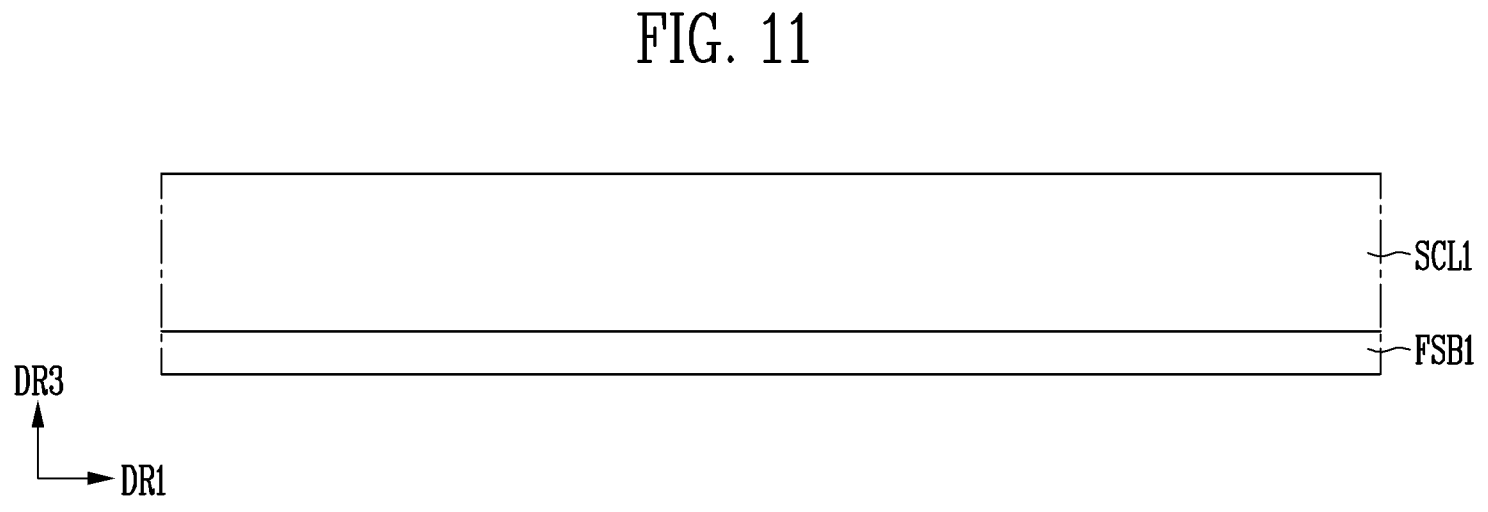

SCL1

FSB1

DR3

DR1

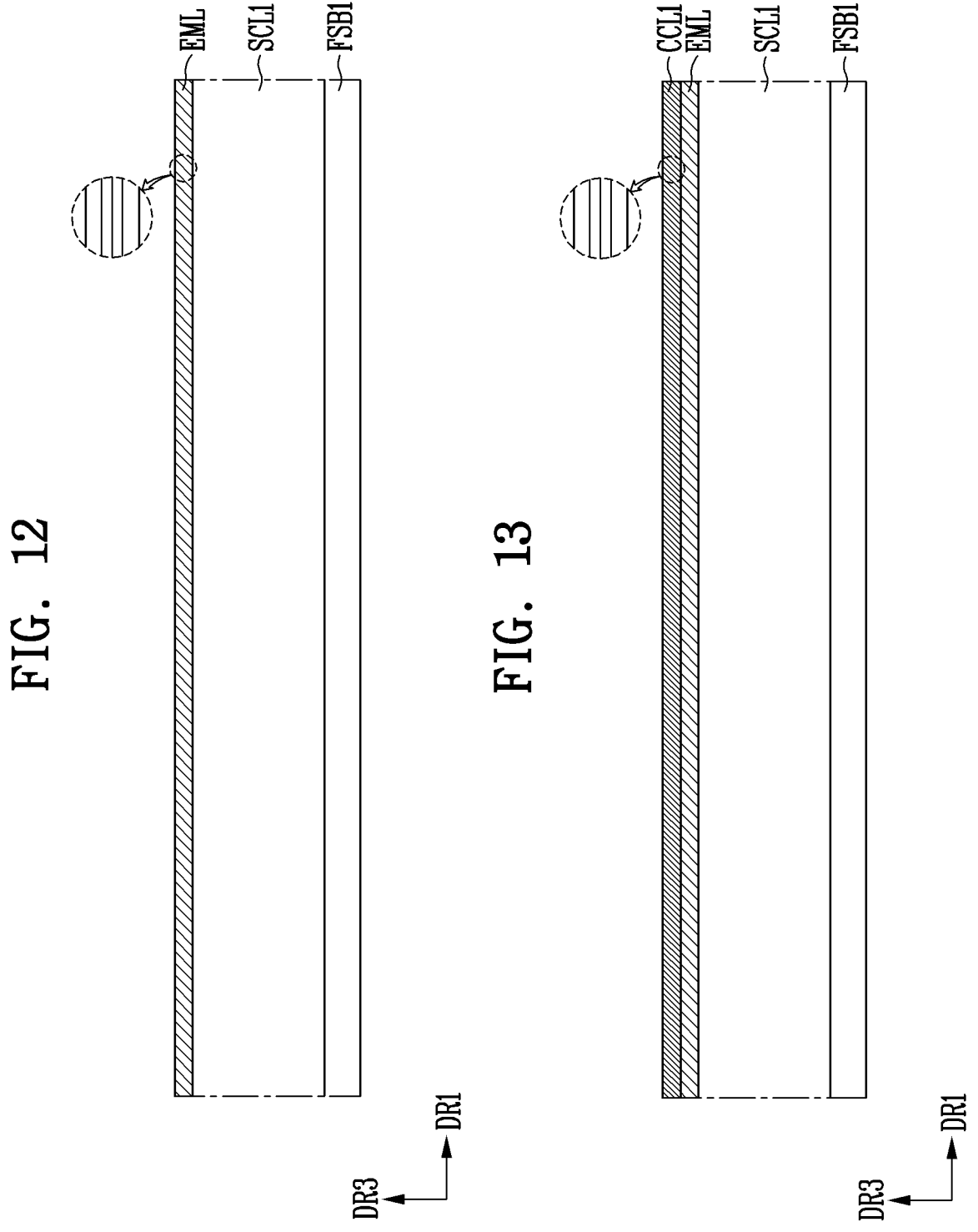

FIG. 14

LDS

CCL2
CCL1
EML

SCL1

FSB1

LDS

CDL
CCL2
CCL1
EML

SCL1

FSB1

TRE1
CCL1
EML

SCL1

FSB1

FIG. 25

TRE2
CCL2

BSL

FSB2

FSB2

BSL

CCL2
TRE
CCL1
EML

SCL1

FSB1

LDS'

CCL2
TRE
CCL1
EML

SCL1

FSB1

LDS'

CDL
CCL2
TRE
CCL1
EML

SCL1

FSB1

DR3
DR1

110: 110a, 110b

DISPLAY DEVICE AND METHOD OF MANUFACTURING THE SAME

CROSS-REFERENCE TO RELATED APPLICATION(S)

This application claims priority to and the benefit of Korean Patent Application No. 10-2021-0056838 under 35 U.S.C. § 119, filed in the Korean Intellectual Property Office (KIPO) on Apr. 30, 2021, the entire contents of which are incorporated herein by reference.

BACKGROUND

1. Technical Field

Embodiments of the disclosure relate to a display device and a method of manufacturing the same.

2. Description of the Related Art

Recently, interest in information display has been increasing. Accordingly, research and development on display devices are continuously being conducted.

SUMMARY

An object of the present disclosure is to provide a display device capable of simplifying a structure and a manufacturing process of a pixel including a light emitting element, and a method of manufacturing the same.

The objects of the present disclosure are not limited to the above object, and other objects that are not mentioned herein will be clearly understood by those of ordinary skill in the art from the following description.

A display device according to an embodiment of the present disclosure may include a pixel including a first electrode, a light emitting element disposed on the first electrode, and a second electrode disposed on the light emitting element. The light emitting element may include: an emission layer that generates light of a first color; a first light conversion layer disposed between the emission layer and the first electrode to convert the light of the first color into light of a second color; a second light conversion layer disposed between the first light conversion layer and the first electrode to convert the light of the first color or the light of the second color into light of a third color; and a first semiconductor layer disposed between the emission layer and the second electrode and including a first conductivity type dopant.

In an embodiment, the emission layer may include a single-quantum well or a multi-quantum well that emits the light of the first color. The first light conversion layer may include a single-quantum well or a multi-quantum well that absorbs the light of the first color and emits the light of the second color, and includes a second conductivity type dopant.

In an embodiment, the second light conversion layer may include a single-quantum well or a multi-quantum well that absorbs the light of the first color or the light of the second color and emits the light of the third color, and the second conductivity type dopant.

In an embodiment, the light emitting element may further include a transparent electrode disposed between the first light conversion layer and the second light conversion layer.

In an embodiment, the second light conversion layer may include a single-quantum well or a multi-quantum well that absorbs the light of the first color or the light of the second color and emits the light of the third color, and the first conductivity type dopant or the second conductivity type dopant.

In an embodiment, the pixel may further include an insulating film disposed on a surface of the light emitting element to surround side surfaces of the emission layer, the first light conversion layer, the second light conversion layer, and the first semiconductor layer.

In an embodiment, the display device may further include a color filter disposed on the light emitting element.

In an embodiment, the display device may further include a bank disposed outside the pixel and surrounding the light emitting element.

In an embodiment, the bank may include a light emitting stack structure, and the light emitting stack structure of the bank and the light emitting element may include a same material and a same stack structure.

In an embodiment, the display device may further include a pad electrode disposed under the bank; and an insulating layer disposed between the pad electrode and the bank.

In an embodiment, the first color, the second color, and the third color may be blue, green, and red, respectively.

A method of manufacturing a display device according to an embodiment of the present disclosure may include forming a first semiconductor layer including a first conductivity type dopant on a first fabrication substrate; forming an emission layer on the first semiconductor layer, the emission layer including a single-quantum well or a multi-quantum well that generates light of a first color; forming a first light conversion layer on the emission layer, the first light conversion layer including a single-quantum well or a multi-quantum well that converts the light of the first color into light of a second color and including a second conductivity type dopant; forming a second light conversion layer on the first light conversion layer, the second light conversion layer including a single-quantum well or a multi-quantum well that converts the light of the first color or the light of the second color into light of a third color and including the first or second conductivity type dopant; providing a driving substrate including a first electrode; disposing the first fabrication substrate on the driving substrate so that the second light conversion layer faces the first electrode, and connecting the second light conversion layer and the first electrode; removing the first fabrication substrate; and forming a light emitting element on the first electrode by etching the first semiconductor layer, the emission layer, the first light conversion layer, and the second light conversion layer.

In an embodiment, the forming of the first semiconductor layer, the emission layer, and the first light conversion layer may include sequentially forming the first semiconductor layer, the emission layer, and the first light conversion layer on the first fabrication substrate by epitaxial growth.

In an embodiment, the forming of the second light conversion layer may include forming the second light conversion layer on the first light conversion layer by epitaxial growth.

In an embodiment, the forming of the second light conversion layer may include forming the second light conversion layer on a second fabrication substrate by epitaxial growth; applying a bonding material on at least one of the first light conversion layer and the second light conversion layer; disposing the second fabrication substrate on the first fabrication substrate so that the first light conversion layer and the second light conversion layer face each other, connecting the second light conversion layer and the first light conversion layer; and removing the second fabrication substrate.

In an embodiment, the method may further include forming an insulating film on a surface of the light emitting element to surround side surfaces of the emission layer, the first light conversion layer, the second light conversion layer, and the first semiconductor layer; and forming a second electrode on the light emitting element.

In an embodiment, the method may further include forming a pad electrode under the bank; and forming an insulating layer disposed between the pad electrode and the bank.

In an embodiment, the first color, the second color, and the third color may be blue, green, and red, respectively.

In an embodiment, the method may further include disposing a color filter on the second electrode.

In an embodiment, in the etching of the first semiconductor layer, the emission layer, the first light conversion layer, and the second light conversion layer, a bank surrounding the light emitting element may be formed simultaneously with the forming of the light emitting element.

Specific matters of other embodiments are included in the detailed description and drawings.

BRIEF DESCRIPTION OF THE DRAWINGS

An additional appreciation according to the embodiments of the disclosure will become more apparent by describing in detail the embodiments thereof with reference to the accompanying drawings.

FIGS. 1 and 2 are plan views schematically illustrating a display device according to respective embodiments of the disclosure.

FIGS. 6 and 7 are cross-sectional views schematically illustrating a display device according to respective embodiments of the disclosure.

FIGS. 11 to 23 are cross-sectional views schematically illustrating a method of manufacturing a display device, according to an embodiment of the disclosure.

FIGS. 24 to 31 are cross-sectional views schematically illustrating a method of manufacturing a display device, according to an embodiment of the disclosure.

DETAILED DESCRIPTION OF THE EMBODIMENTS

Figure 2:
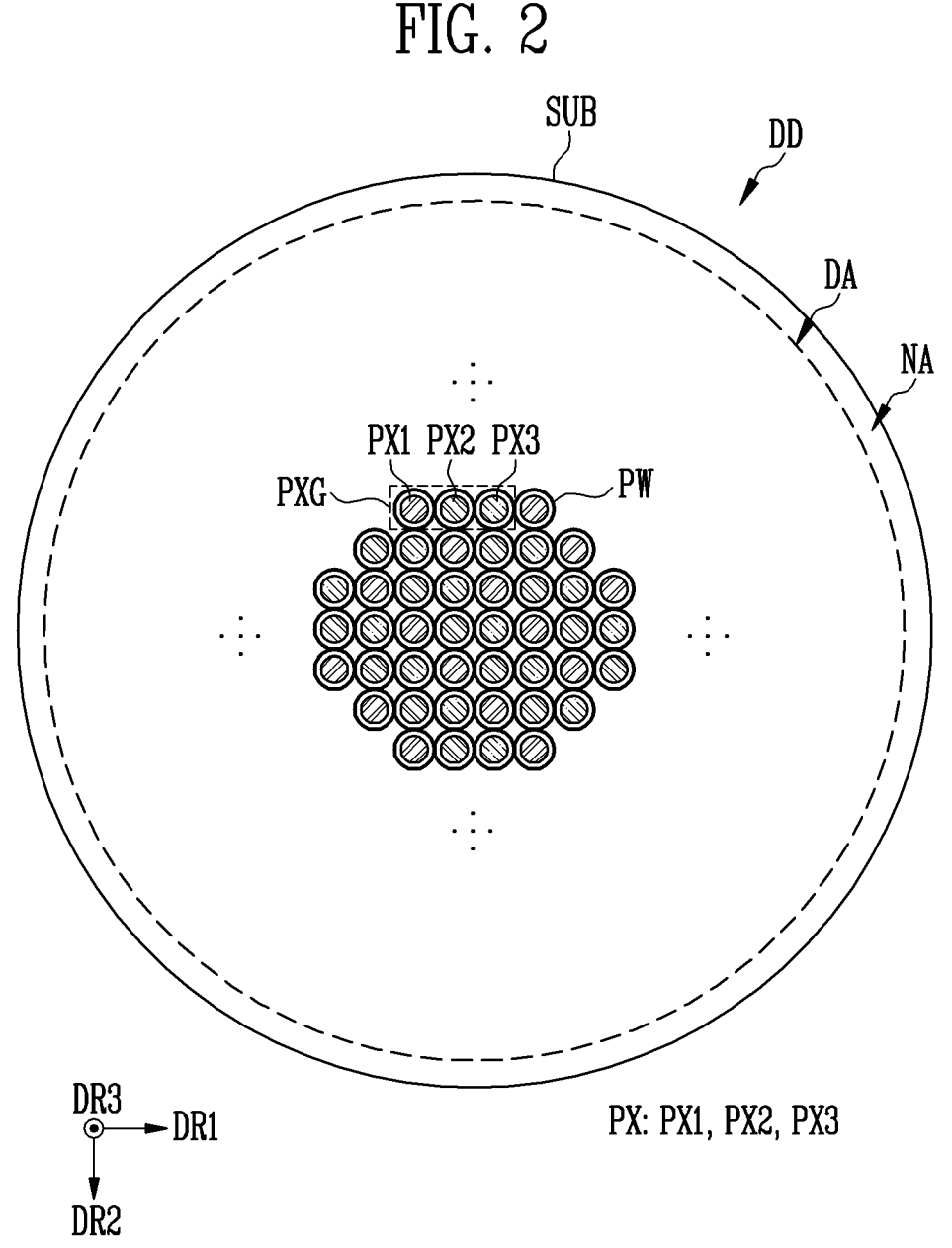

As the description allows for various changes and numerous embodiments, certain embodiments will be illustrated in the drawings and described in detail in the written description. The singular forms "a," "an," and "the" as used herein are intended to include plural meanings as well unless the context clearly indicates otherwise.

However, the disclosure is not limited to the following embodiments and may be embodied in various forms. In addition, each of the embodiments disclosed below may be implemented alone, or may be implemented in combination with at least one other embodiment.

In the drawings, some elements that are not directly related to the features of the disclosure may be omitted to clearly illustrate the disclosure. The same reference numerals and symbols are assigned to the same or similar elements throughout the drawings even when they are illustrated on different drawings, and redundant descriptions thereof will be omitted.

In describing the embodiments of the disclosure, the term "connection (or coupling)" may comprehensively mean a physical and/or electrical connection (or coupling). In addition, the term "connection (or coupling)" may comprehensively mean a direct or indirect connection (or coupling), and an integrated or non-integrated connection (or coupling).

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIGS. 1 and 2 are schematic plan views illustrating a display device DD according to embodiments. FIGS. 1 and 2 illustrate different embodiments with respect to the shapes of pixels PX and the display device DD and the arrangement structure of the pixels PX.

FIGS. 1 and 2 briefly illustrate the structure of the display device DD, centering on a display panel including a display area DA. The display device DD may further include a driving circuit (for example, a driving circuit including a scan driver, a data driver, and a timing controller) for driving the pixels PX. In an embodiment, at least a portion of the driving circuit may be formed and/or disposed inside the display panel. In an embodiment, the driving circuit may be provided outside the display panel and electrically connected to the display panel.

Referring to FIGS. 1 and 2, the display device DD may include a substrate SUB and pixels PX disposed on the substrate SUB.

The substrate SUB is a base member for forming the display device DD and may form, for example, a base surface of the display device DD. The substrate SUB may include a display area DA in which the pixels PX are disposed, and a non-display area NA excluding the display area DA. The display area DA may form (or constitute) a screen on which an image is displayed, and the non-display area NA may be an area other than the display area DA.

The display device DD may be provided in various shapes. As an example, as in the embodiment of FIG. 1, the display device DD may be provided in a rectangular panel, but the disclosure is not limited thereto. For example, as in the embodiment of FIG. 2, the display device DD may be provided as a panel having a circular shape or an elliptical shape. The display device DD may be provided as a flat panel or as a 3D panel that is curved in a thickness direction or the like.

For convenience, FIGS. 1 and 2 illustrate that the display device DD has a rectangular or circular flat plate shape. A horizontal direction (a row direction) of the display device DD is denoted by a first direction DR1, a vertical direction (a column direction) of the display device DD is denoted by a second direction DR2, and a thickness direction (or height direction) of the display device DD is denoted by a third direction DR3.

The display area DA may have various shapes. As an example, the display area DA may have a rectangular shape as in the embodiment of FIG. 1, or may have a circular shape as in the embodiment of FIG. 2.

In an embodiment, the display area DA may have a shape matching the shape of the display device DD. For example, in case that the display device DD has a rectangular shape, the display area DA may have a rectangular shape matching the size and/or the shape of the display device DD. Alternatively, in case that the display device DD has a circular shape or an elliptical shape, the display area DA may have a circular shape or an elliptical shape matching the size and/or the shape of the display device DD.

However, the disclosure is not limited thereto. For example, the display area DA may have a shape different from that of the display device DD.

Pixels PX may be arranged in the display area DA. For example, the display area DA includes pixel areas in which the pixels PX are provided and/or disposed, and the pixels PX may be respectively disposed in the pixel areas on the substrate SUB.

The display device DD may include pixels PX emitting light of different colors. For example, the display device DD may include first pixels PX1 emitting light of a first color, second pixels PX2 emitting light of a second color, and third pixels PX3 emitting light of a third color. At least one first pixel PX1, at least one second pixel PX2, and at least one third pixel PX3 disposed adjacent to each other may form a pixel group PXG. By individually controlling the emission luminance of the first, second, and third pixels PX1, PX2, and PX3 forming each pixel group PXG, various colors may be displayed in the pixel group PXG.

Each of the pixels PX may include at least one light emitting element that is driven by a control signal (for example, a scan signal and a data signal) and/or power (for example, first power and second power). In an embodiment, the light emitting element may be an inorganic light emitting diode including a nitride-based semiconductor material (for example, a nitride-based compound including GaN), and may have a small size ranging from nanometers to micrometers. For example, the light emitting element may have a diameter, width, length, and/or thickness in a range of tens of nanometers to tens of micrometers. The light emitting element may include a light emitting stack including at least one light conversion layer, an emission layer, and a first semiconductor layer sequentially stacked in a direction (for example, a thickness or height direction). However, the type, structure, size, and/or shape of the light emitting element that may be provided in the pixel PX are not limited thereto.

In an embodiment, the first, second, and third pixels PX1, PX2, and PX3 may include light emitting elements having the same color and/or structure. For example, each of the first, second, and third pixels PX1, PX2, and PX3 may include at least one white light emitting element, and the white light emitting elements provided in the first, second, and third pixels PX1, PX2, and PX3 may be light emitting elements having substantially a same type and/or structure. In an embodiment, since each of the white light emitting elements includes an emission layer generating light of a first color (for example, blue light), and at least one light conversion layer converting the light of the first color into light of a different color (for example, green or red light having a longer wavelength than the blue light), it is possible to emit white light in which light of colors (for example, red light, green light, and blue light) including light of the first color are mixed with each other.

In an embodiment, the light emitting elements of the first, second, and third pixels PX1, PX2, and PX3 may be formed simultaneously with each other. Accordingly, the structure and the manufacturing process of the display device DD may be simplified, and the manufacturing efficiency may be increased.

A color filter for a first color, a color filter for a second color, and a color filter for a third color may be disposed in the first, second, and third pixels PX1, PX2, and PX3 or on the first, second, and third pixels PX1, PX2, and PX3. Accordingly, it is possible to perform control so that the light of the first color, the light of the second color, and the light of the third color are emitted from the first, second, and third pixels PX1, PX2, and PX3, respectively. In an embodiment, the first color, the second color, and the third color may be different from each other.

In an embodiment, the first pixel PX1 may include at least one white light emitting element and a blue color filter disposed above the white light emitting element on a path through which light is emitted. Accordingly, blue light may be emitted from the first pixel PX1. The second pixel PX2 may include at least one white light emitting element and a green color filter disposed above the white light emitting element on a path through which light is emitted. Accordingly, green light may be emitted from the second pixel PX2. The third pixel PX3 may include at least one white light emitting element and a red color filter disposed above the white light emitting element on a path through which light is emitted. Accordingly, red light may be emitted from the third pixel PX3.

However, the disclosure is not limited thereto. For example, the type of the light emitting element included in each pixel PX, the color of light emitted from each pixel PX, and the number and/or type of pixels PX forming each pixel group PXG may be variously changed according to embodiments.

The pixels PX may have a structure according to at least one of embodiments to be described below. For example, the pixels PX may have a structure to which any of the embodiments to be described below is applied, or a structure to which at least two embodiments are applied in combination.

The pixels PX may be arranged in the display area DA according to various arrangement structures. For example, as in the embodiment of FIG. 1, the first pixels PX1, the second pixels PX2, and the third pixels PX3 may be arranged in a stripe shape in each pixel row extending in the first direction DR1 and each pixel column extending in the second direction DR2. As another example, as in the embodiment of FIG. 2, the first pixels PX1, the second pixels PX2, or the third pixels PX3 may be arranged in a diagonal direction inclined with respect to the first and second directions DR1 and DR2 (for example, a diagonal direction of the display device DD). The arrangement structure of the pixels PX may be variously changed. For example, the pixels PX may be arranged in the display area DA according to a PENTILE™ arrangement structure or the like.

A partition wall PW (also referred to as a "bank," a "wall pattern," or a "pixel defining film") surrounding the pixels PX may be further disposed in the display area DA. For example, the partition wall PW may be disposed outside the pixels PX so as to surround the emission areas of the pixels PX in which at least one light emitting element is disposed.

In an embodiment, the partition wall PW may be positioned between the pixels PX and/or outside the display area DA, and may be formed in an integral pattern including openings corresponding to each of the pixels PX. For example, the partition wall PW may include openings corresponding to the emission areas of the pixels PX, and may be formed in a mesh-shaped pattern that is connected in the display area DA as a whole.

In an embodiment, the partition wall PW may be formed simultaneously with the light emitting elements of the first, second, and third pixels PX1, PX2, and PX3. Accordingly, the structure and the manufacturing process of the display device DD may be simplified, and the manufacturing efficiency may be increased.

A non-display area NA may be disposed around the display area DA. Lines, built-in circuit units (or circuit parts), and/or pads electrically connected to the pixels PX of the display area DA may be disposed in the non-display area NA.

Figure 3:
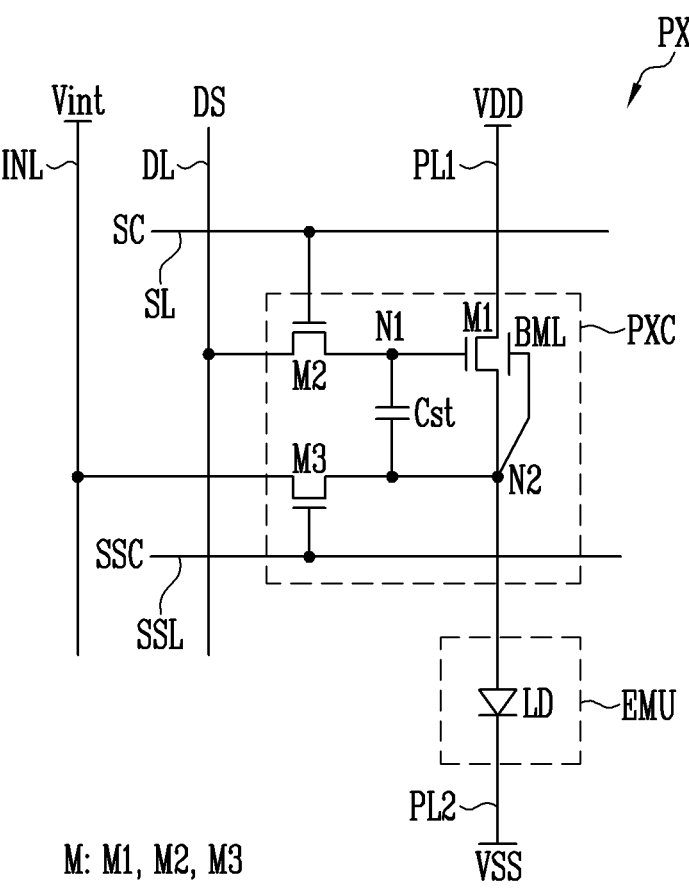
FIGS. 3 and 4 are schematic diagrams of equivalent circuits schematically illustrating a pixel according to respective embodiments of the disclosure.
Figure 4:
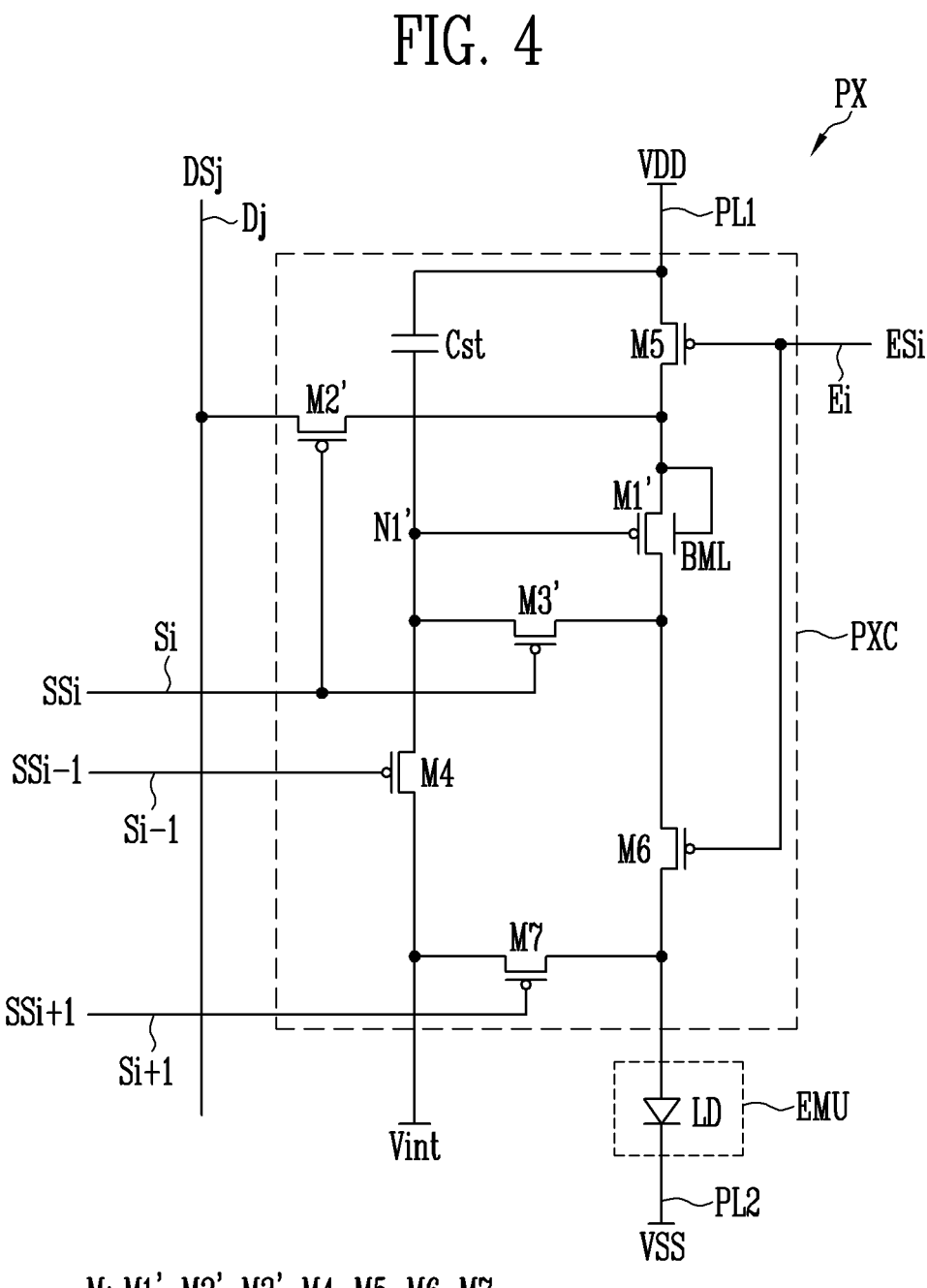

FIGS. 3 and 4 are schematic diagrams of equivalent circuits illustrating a pixel PX according to embodiments. For example, FIGS. 3 and 4 illustrate pixels PX including pixel circuits PXC having different structures.

According to an embodiment, each of the pixels PX illustrated in FIGS. 3 and 4 may be any of the pixels PX disposed in the display area DA of FIGS. 1 and 2. For example, the pixel PX of FIG. 3 or 4 may be any of the first pixel PX1, the second pixel PX2, and the third pixel PX3. The pixels PX disposed in the display area DA may have substantially the same or similar structure. The pixels PX may have various structures in addition to the structures disclosed in the embodiments of FIGS. 3 and 4.

Referring to FIG. 3, the pixel PX may be electrically connected to a scan line SL, a data line DL, a first power line PL1, and a second power line PL2. The pixel PX may be selectively further electrically connected to at least one other power line and/or signal line. For example, the pixel PX may be further electrically connected to an initialization power line INL (or a sensing line) and/or a control line SSL.

The pixel PX may include an emission part EMU for generating light having a luminance corresponding to each data signal DS. The pixel PX may optionally further include a pixel circuit PXC for driving the emission part EMU.

The pixel circuit PXC may be electrically connected to the scan line SL and the data line DL and may be electrically connected between the first power line PL1 and the emission part EMU. For example, the pixel circuit PXC may be electrically connected to the scan line SL to which a scan signal SC is supplied, the data line DL to which a data signal DS is supplied, the first power line PL1 to which a first power VDD is supplied, and the emission part EMU. Furthermore, the pixel circuit PXC may be optionally further electrically connected to the control line SSL to which a control signal SSC is supplied, and to the initialization power line INL electrically connected to initialization power Vint or electrically connected to the sensing circuit in correspondence with a display period or a sensing period.

In an embodiment, the control signal SSC may be the same as or different from the scan signal SC. In case that the control signal SSC is the same signal as the scan signal SC, the control line SSL may be selectively integral with the scan line SL.

The pixel circuit PXC may include at least one transistor M and a capacitor Cst. For example, the pixel circuit PXC may include a first transistor M1, a second transistor M2, a third transistor M3, and a capacitor Cst.

The first transistor M1 may be electrically connected between the first power line PL1 and a second node N2. The second node N2 may be a node to which the pixel circuit PXC and the emission part EMU are electrically connected. For example, the second node N2 may be a node to which an electrode of the first transistor M1 (for example, a source electrode) and an electrode of the emission part EMU (for example, an anode electrode of the emission part EMU) are electrically connected. A gate electrode of the first transistor M1 may be electrically connected to a first node N1. The first transistor M1 may control a driving current supplied to the emission part EMU in response to the voltage of the first node N1. For example, the first transistor M1 may be a driving transistor of the pixel PX.

In an embodiment, the first transistor M1 may further include a bottom metal layer BML (also referred to as a "second gate electrode" or a "back gate electrode"). In an embodiment, the bottom metal layer BML may be electrically connected to an electrode of the first transistor M1 (for example, a source electrode).

In an embodiment in which the first transistor M1 includes the bottom metal layer BML, a back-biasing technology (or sync technology) may be applied, which shifts a threshold voltage of the first transistor M1 in a negative or positive direction by applying a back-biasing voltage to the bottom metal layer BML of the first transistor M1. In case that the bottom metal layer BML is disposed to overlap a semiconductor pattern forming a channel of the first transistor M1, the operation characteristics of the first transistor M1 may be stabilized by blocking light incident on the semiconductor pattern.

The second transistor M2 may be electrically connected between the data line DL and the first node N1. A gate electrode of the second transistor M2 may be electrically connected to the scan line SL. In case that a scan signal SC of a gate-on voltage (for example, a logic high voltage or a high-level voltage) is supplied from the scan line SL, the second transistor M2 may be turned on and electrically connected to the data line DL and the first node N1.

The data signal DS of the frame may be supplied to the data line DL for each frame period, and the data signal DS may be transmitted to the first node N1 through the second transistor M2 during a period in which the scan signal SC of the gate-on voltage is supplied. For example, the second transistor M2 may be a switching transistor for transmitting each data signal DS to the inside of the pixel PX.

A first electrode of the capacitor Cst may be electrically connected to the first node N1, and a second electrode of the capacitor Cst may be electrically connected to the second node N2. The capacitor Cst is charged with a voltage corresponding to the data signal DS supplied to the first node N1 during each frame period.

The third transistor M3 may be electrically connected between the second node N2 and the initialization power line INL. The gate electrode of the third transistor M3 may be electrically connected to the control line SSL (or the scan line SL). In case that the control signal SSC of the gate-on voltage is supplied from the control line SSL, the third transistor M3 may be turned on to transmit the voltage (or reference voltage) of the initialization power Vint supplied to the initialization power line INL to the second node N2, or transmit the voltage of the second node N2 to the initialization power line INL. The voltage of the second node N2 transmitted to the initialization power line INL may be provided to the driving circuit (for example, the timing controller) through the sensing circuit, and may be used to compensate for deviations in characteristics of the pixels PX.

Although FIG. 3 illustrates that the transistors M included in the pixel circuit PXC are all N-type transistors, the disclosure is not limited thereto. For example, at least one of the first, second, and third transistors M1, M2, and M3 may be changed to a P-type transistor. The structure and driving method of the pixel circuit PXC and/or the pixel PX may be variously changed according to embodiments.

Referring to FIG. 4, the pixel PX may be electrically connected to at least one scan line and a data line. For example, in case that the pixel PX is disposed at an i-th horizontal line (for example, an i-th pixel row) (where i is a natural number greater than 0) and a j-th vertical line (for example, a j-th pixel column) (where j is a natural number greater than 0) in a display area DA, the pixel PX may be electrically connected to an i-th scan line Si (also referred to as "scan line Si" or "current scan line Si") and a j-th data line Dj (also referred to as a "data line Dj") in the display area DA. In an embodiment, the pixel PX may be further electrically connected to at least one other scan line and/or a control line in addition to the scan line Si of the corresponding horizontal line. As an example, the pixel PX disposed at the i-th horizontal line of the display area DA may be further electrically connected to one of the scan lines of the previous horizontal lines, for example, an (i−1)-th scan line Si−1 (also referred to as a "previous scan line Si−1"), and/or one of the scan lines of the next horizontal lines, for example, an (i+1)-th scan line Si+1 (also referred to as a "next scan line (Si+1)").

The pixel PX may be electrically connected to the first power VDD and the second power VSS through the first power line PL1 and the second power line PL2, respectively. In an embodiment, the pixel PX may be further electrically connected to power other than the first and second powers VDD and VSS. For example, the pixel PX may be electrically connected to the initialization power Vint.

The pixel circuit PXC may include transistors M and at least one capacitor Cst. For example, the pixel circuit PXC may include a first transistor M1', a second transistor M2', a third transistor M3', a fourth transistor M4, a fifth transistor M5, a sixth transistor M6, a seventh transistor M7, and a capacitor Cst.

The first transistor M1' may be electrically connected between the first power VDD and the emission part EMU. For example, an electrode (for example, a source electrode) of the first transistor M1' may be electrically connected to the first power VDD through the fifth transistor M5 and the first power line PL1, and another electrode (for example, a drain electrode) of the first transistor M1' may be electrically connected to the emission part EMU (for example, an anode electrode of the emission part EMU) through the sixth transistor M6. The gate electrode of the first transistor M1' may be electrically connected to a first node N1'. The first transistor M1' may control a driving current supplied to the emission part EMU in response to the voltage of the first node N1'.

In an embodiment, the first transistor M1' may further include a bottom metal layer BML. In an embodiment, the bottom metal layer BML may be electrically connected to an electrode of the first transistor M1' (for example, the source electrode).

The second transistor M2' may be electrically connected between the data line Dj and the electrode (for example, the source electrode) of the first transistor M1'. A gate electrode of the second transistor M2' may be electrically connected to the scan line Si. In case that a scan signal SSi of a gate-on voltage (for example, a logic high voltage or a low-level voltage) is supplied from the scan line Si, the second transistor M2' may be turned on and electrically connect the data line Dj to an electrode of the first transistor M1'. Accordingly, in case that the second transistor M2' is turned on, a data signal DSj supplied from the data line Dj may be transmitted to the first transistor M1'.

The third transistor M3' may be electrically connected between another electrode (for example, the drain electrode) of the first transistor M1' and the first node N1'. A gate electrode of the third transistor M3' may be electrically connected to the scan line Si. In case that the scan signal SSi of the gate-on voltage is supplied from the scan line Si, the third transistor M3' may be turned on to diode-connect the first transistor M1'. Accordingly, the first transistor M1' may be turned on in a diode-connected form during a period in which the scan signal SSi of the gate-on voltage is supplied. The data signal DSj from the data line Dj may be supplied to the first node N1' by sequentially passing through the second transistor M2', the first transistor M1', and the third transistor M3'. Therefore, the capacitor Cst may be charged with a voltage corresponding to the data signal DSj and the threshold voltage of the first transistor M1'.

The fourth transistor M4 may be electrically connected between the first node N1' and the initialization power Vint. A gate electrode of the fourth transistor M4 may be electrically connected to the previous scan line, for example, to the (i−1)-th scan line Si−1. In case that a scan signal SSi−1 of the gate-on voltage is supplied to the (i−1)-th scan line Si−1, the fourth transistor M4 may be turned on to apply the voltage of the initialization power Vint to the first node N1'.

According to an embodiment, the voltage of the initialization power Vint may be less than or equal to the lowest voltage of the data signal DSj. Before the data signal DSj of the frame is supplied to each pixel PX, the first node N1' may be initialized to the voltage of the initialization power Vint by the scan signal SSi−1 of the gate-on voltage supplied to the (i−1)-th scan line Si−1. Accordingly, regardless of the voltage of the data signal DSj of the previous frame, the first transistor M1' may be electrically diode-connected in the forward direction during a period in which the scan signal SSi of the gate-on voltage is supplied to the i-th scan line Si. Accordingly, the data signal DSj of the corresponding frame may be transmitted to the first node N1'.

The fifth transistor M5 may be electrically connected between the first power VDD and the first transistor M1'. A gate electrode of the fifth transistor M5 may be electrically connected to an emission control line of a corresponding horizontal line, for example, an i-th emission control line Ei (also referred to as an "emission control line Ei"). The fifth transistor M5 may be turned off in case that an emission control signal ESi of the gate-off voltage (for example, a logic low voltage or a high-level voltage) is supplied to the emission control line Ei; otherwise, may be turned on.

The sixth transistor M6 may be electrically connected between the first transistor M1' and the emission part EMU. A gate electrode of the sixth transistor M6 may be electrically connected to the emission control line Ei. The sixth transistor M6 may be turned off in case that an emission control signal ESi of the gate-off voltage is supplied to the emission control line Ei; otherwise, may be turned on.

The fifth and sixth transistors M5 and M6 may control the emission period of the pixel PX. For example, in case that the fifth and sixth transistors M5 and M6 are turned on, a current path through which a driving current may flow from the first power VDD to the second power VSS through the fifth transistor M5, the first transistor M1', the sixth transistor M6, and the emission part EMU in sequence, may be formed. In case that the fifth and/or sixth transistors M5 and M6 are turned off, the current path may be blocked to prevent light emission of the pixel PX.

The seventh transistor M7 may be electrically connected between one electrode of the emission part EMU (for example, an anode electrode of the emission part EMU) and the initialization power Vint. A gate electrode of the seventh transistor M7 may be electrically connected to a scan line for selecting the pixels PX of the next horizontal line, for example, to an (i+1)-th scan line Si+1. In case that a scan signal SSi+1 of the gate-on voltage is supplied to the (i+1)-th scan line Si+1, the seventh transistor M7 may be turned on to supply the voltage of the initialization power Vint to one electrode of the emission part EMU. Therefore, the voltage of one electrode of the emission part EMU may be initialized during each initialization period in which the voltage of the initialization power Vint is transmitted to the emission part EMU.

The control signal and/or the initialization power Vint for controlling the operation of the seventh transistor M7 may be variously changed. For example, in an embodiment, the gate electrode of the seventh transistor M7 may be electrically connected to a scan line of a corresponding horizontal line, for example, an i-th scan line Si, or the gate electrode of the seventh transistor M7 may be electrically connected to a scan line of a previous horizontal line, for example, to an (i−1)-th scan line Si−1. In this case, in case that a scan signal SSi or SSi−1 of the gate-on voltage is supplied to the i-th scan line Si or the (i−1)-th scan line Si−1, the seventh transistor M7 may be turned on to supply the voltage of the initialization power Vint to one electrode of the emission part EMU. Accordingly, during each frame period, the pixel PX may emit light with a more uniform luminance in response to the data signal DSj. According to an embodiment, the fourth transistor M4 and the seventh transistor M7 may be electrically connected to different initialization powers having different potentials. For example, according to an embodiment, the pixel PX may be electrically connected to initialization powers, and the first node N1' and one electrode (for example, the anode electrode) of the emission part EMU may be initialized by initialization powers having different potentials.

The capacitor Cst may be electrically connected between the first power VDD and the first node N1'. The capacitor Cst may store the voltage corresponding to the threshold voltage of the first transistor M1' and the data signal DSj supplied to the first node N1' in each frame period.

Although FIG. 4 illustrates that the transistors M included in the pixel circuit PXC are all P-type transistors, the disclosure is not limited thereto. For example, at least one of the first transistor M1', the second transistor M2', the third transistor M3', the fourth transistor M4, the fifth transistor M5, the sixth transistor M6, and the seventh transistor M7 may be changed to an N-type transistor. In this case, a gate-on voltage (for example, a logic high voltage) for turning on the N-type transistor may be a high-level voltage.

The structure and driving method of the pixel PX may be variously changed according to embodiments. For example, the pixel circuit PXC and/or the pixel PX may have various structures in addition to the structures according to the embodiments of FIGS. 3 and 4. The interconnection structure and/or operation timing of the transistors M and/or the capacitor Cst may be variously changed according to embodiments. Furthermore, the pixel PX may be configured as a passive pixel that does not include the pixel circuit PXC, and the emission part EMU may be directly electrically connected to at least one signal line and/or a power line.

The emission part EMU may include at least one light emitting element LD electrically connected between the first power VDD and the second power VSS. The first power VDD and the second power VSS may supply voltages of different potentials. A potential difference between the first power VDD and the second power VSS may be greater than or equal to the threshold voltage of the light emitting element LD.

In an embodiment, the emission part EMU may include a single light emitting element LD electrically connected in a forward direction between the pixel circuit PXC and the second power VSS, as in the embodiments of FIGS. 3 and 4. An anode electrode of the light emitting element LD may be electrically connected to the first power VDD through the pixel circuit PXC and/or the first power line PL1, and a cathode electrode of the light emitting element LD may be electrically connected to the second power VSS through the second power line PL2.

As another example, the emission part EMU may include light emitting elements LD electrically connected to each other in a forward direction between the first power VDD and the second power VSS. For example, the emission part EMU may include light emitting elements LD electrically connected in parallel to each other between the pixel circuit PXC and the second power VSS or electrically connected in series or in series-parallel between the pixel circuit PXC and the second power VSS.

In an embodiment, each of the light emitting elements LD may be an inorganic light emitting diode manufactured by epitaxial growth. For example, the emission part EMU may include at least one inorganic light emitting diode manufactured with a small size ranging from nanometers to micrometers by using a nitride-based semiconductor material or the like. The type, structure, and/or number of light emitting element(s) LD forming the emission part EMU may be variously changed according to embodiments.

At least one light emitting element LD electrically connected in a forward direction between the first power VDD and the second power VSS may form an effective light source of each pixel PX. In case that the driving current is supplied to the light emitting element LD of the pixel PX through the pixel circuit PXC of each pixel PX, the light emitting element LD may emit light with a luminance corresponding to the driving current. Therefore, the pixel PX may emit light with a luminance corresponding to the driving current.

Figure 5:
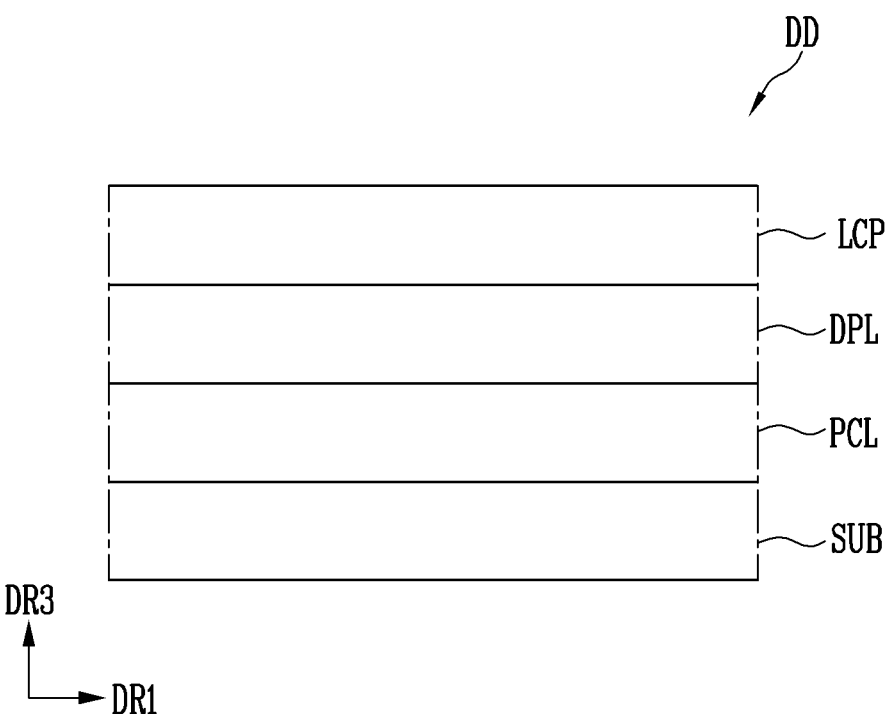
FIG. 5 is a cross-sectional view schematically illustrating a display device according to an embodiment of the disclosure.

FIG. 5 is a cross-sectional view schematically illustrating a display device DD according to an embodiment.

Referring to FIGS. 1 to 5, the display device DD may include a substrate SUB, a pixel circuit part PCL, a display element part DPL, and a light control part LCP. In an embodiment, the substrate SUB, the pixel circuit part PCL, the display element part DPL, and the light control part LCP may be sequentially disposed in the display direction (for example, the third direction DR3) of the display device DD.

The substrate SUB may form a base surface of the display device DD. Individual components of the display device DD may be disposed on the substrate SUB. For example, each of the pixels PX may be disposed in the pixel areas on the substrate SUB.

The pixel circuit part PCL may be disposed on the substrate SUB. The pixel circuit part PCL may include circuit elements forming the pixel circuits PXC of the pixels PX, and lines electrically connected to the circuit elements. For example, transistors M and capacitors Cst forming the pixel circuit PXC of the pixel PX may be disposed in each pixel area of the pixel circuit part PCL. Signal lines and/or power lines electrically connected to the pixels PX may be disposed inside and/or around the pixel areas. In an embodiment, in case that the pixels PX do not include the pixel circuits PXC, the pixel circuit part PCL may include only lines and/or pads for supplying at least one driving signal and/or driving power to the display element part DPL or may be integrated with (or integral with) the display element part DPL.

The display element part DPL may be disposed on the pixel circuit part PCL. The display element part DPL may include light emitting elements LD forming the emission parts EMU of the pixels PX, and electrodes and/or lines electrically connected to the light emitting elements LD. For example, at least one light emitting element LD forming the emission part EMU of each pixel PX may be provided in each pixel area of the display element part DPL, particularly in the emission area. At least one electrode and/or line electrically connected to the at least one light emitting element LD may be provided inside and/or around the emission area.

In an embodiment, the light emitting element LD provided in the emission part EMU of each pixel PX may be electrically connected to the pixel circuit PXC of the pixel PX and at least one power line (for example, the second power line PL2). The light emitting element LD may emit light with a luminance corresponding to an electrical signal (for example, a driving current) provided from the pixel circuit PXC. Light generated by the light emitting elements LD of the display element part DPL may be emitted to the outside through the light control part LCP.

The light control part LCP may be disposed on the display element part DPL. In an embodiment, the light control part LCP may include color filters that selectively transmit light having a specific color and/or a wavelength band corresponding thereto. For example, the light control part LCP may include a color filter for a first color (hereinafter referred to as a "first color filter") disposed above the first pixel PX1 (or inside the first pixel PX1), a color filter for a second color (hereinafter referred to as a "second color filter") disposed above the second pixel PX2 (or inside the second pixel PX2), and a color filter for a third color (hereinafter referred to as a "third color filter") disposed above the third pixel PX3 (or inside the third pixel PX3).

In an embodiment, the light control part LCP may further include additional components in addition to the color filters. For example, the light control part LCP may optionally further include a light scattering layer including light scattering particles.

Figure 6:
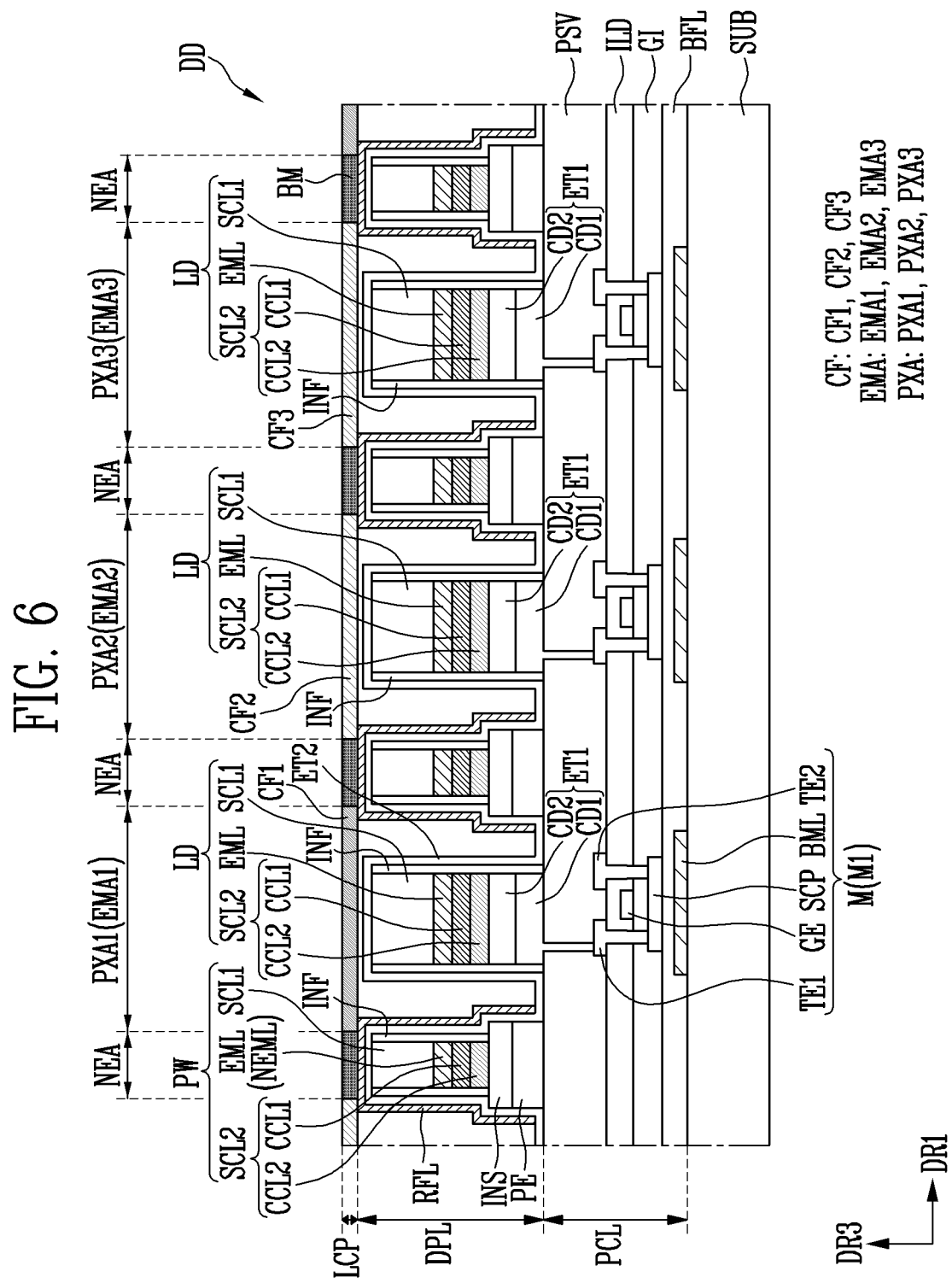
Figure 7:
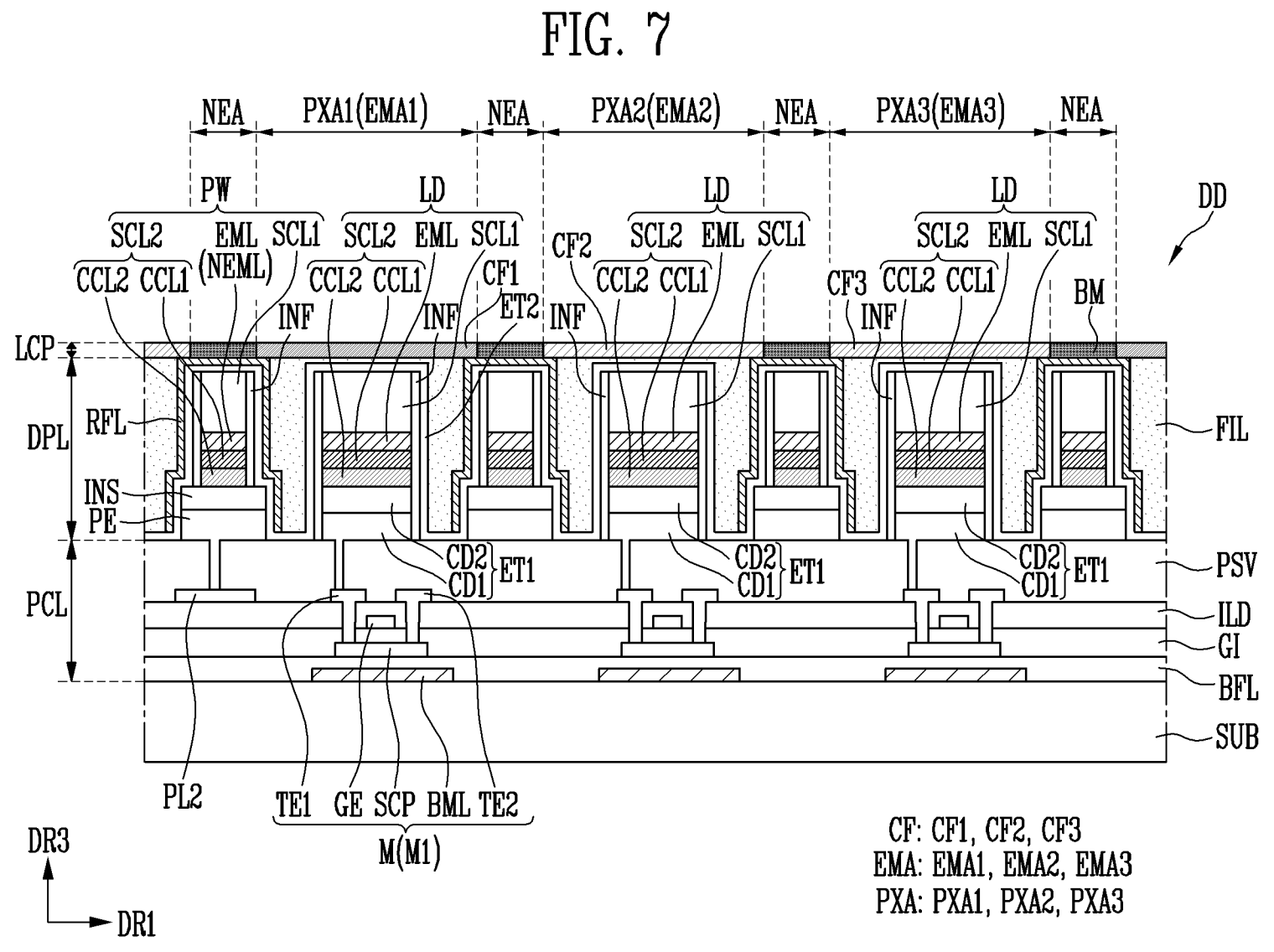

FIGS. 6 and 7 are schematic cross-sectional views illustrating a display device DD according to respective embodiments of the disclosure. Compared with the embodiment of FIG. 6, the embodiment of FIG. 7 further discloses a filler FIL and a second power line PL2.

FIGS. 6 and 7 illustrate examples of circuit elements that may be provided in each pixel area PXA of the pixel circuit part PCL, and illustrate a transistor M electrically connected to each light emitting element LD (for example, the first transistor M1 including the bottom metal layer BML). The pixel circuit part PCL may further include lines electrically connected to the circuit elements and/or the light emitting elements LD of the display element part DPL. For example, as illustrated in FIG. 7, the pixel circuit part PCL may include a second power line PL2 electrically connected to the light emitting elements LD through pad electrodes PE and a second electrode ET2. In an embodiment, the second power line PL2 may be electrically connected to the light emitting elements LD of the display element part DPL through at least one pad electrode PE, but the disclosure is not limited thereto. In an embodiment, the second power line PL2 may be electrically connected to the light emitting elements LD of the display element part DPL inside the display area DA, but the disclosure is not limited thereto. For example, the second power line PL2 may be electrically connected to the light emitting elements LD of the display element part DPL in the non-display area NA.

For convenience, FIGS. 6 and 7 illustrate the pixel area PXA in which the pixel PX is disposed, centering on the emission area EMA of each pixel PX. However, each pixel area PXA may include a pixel circuit area in which circuit elements forming each pixel circuit PXC are disposed, and an emission area EMA in which at least one light emitting element LD forming each emission part EMU is disposed. For example, a first pixel area PXA1 in which the first pixel PX1 is disposed may include at least one first emission area EMA1, and may optionally further include a portion of a non-emission area NEA located around the first emission area EMA1. Similarly, a second pixel area PXA2 in which the second pixel PX2 is disposed may include at least one second emission area EMA2, and may optionally further include a portion of the non-emission area NEA located around the second emission area EMA2. The third pixel area PXA3 in which the third pixel PX3 is disposed may include at least one third emission area EMA3, and may optionally further include a portion of the non-emission area NEA located around the third emission area EMA3. In an embodiment, the emission area EMA of each pixel PX may overlap the pixel circuit area of the pixel PX, but the disclosure is not limited thereto.

Referring to FIGS. 1 to 7, the display device DD may include a substrate SUB, a pixel circuit part PCL, a display element part DPL, and a light control part LCP, which are sequentially disposed on the substrate SUB.

The substrate SUB may be a rigid substrate, a flexible substrate, or a film, and the material or structure thereof is not particularly limited. For example, the substrate SUB may be a glass substrate, or an insulating substrate or an insulating film such as a polymer film, and may be a single-layer or multi-layer substrate or film.

The pixel circuit part PCL may be provided on a surface of the substrate SUB. The pixel circuit part PCL may include circuit elements forming each pixel PX. For example, transistors M and capacitors Cst forming the pixel circuit PXC of the pixel PX may be disposed in each pixel area PXA of the pixel circuit part PCL.

The pixel circuit part PCL may include various signal lines and power lines electrically connected to the pixels PX. For example, the pixel circuit part PCL may include scan lines SL (or Si−1, Si, Si+1, etc.), control lines SSL, emission control lines Ei, data lines DL or Dj, initialization power lines INL, and/or first and second power lines PL1 and PL2.

The pixel circuit part PCL may include insulating layers. For example, the pixel circuit part PCL may include a buffer layer BFL, a gate insulating layer GI, an interlayer insulating layer ILD, and/or a passivation layer PSV, which are sequentially disposed on a surface of the substrate SUB.

The pixel circuit part PCL may be disposed on the substrate SUB and may include a first conductive layer including a bottom metal layer BML of a first transistor M1. For example, the first conductive layer may include bottom metal layers BML of the first transistors M1 disposed between the substrate SUB and the buffer layer BFL and included in the pixels PX.

The first conductive layer may further include at least one line and/or bridge pattern. For example, the first conductive layer may include at least some lines extending in the second direction DR2 (or the first direction DR1) in the display area DA. For example, the first conductive layer may include a first power line PL1, an initialization power line INL, and/or data lines DL or Dj.

A buffer layer BFL may be disposed on a surface of the substrate SUB including the first conductive layer. The buffer layer BFL may prevent impurities from diffusing into each circuit element.

A semiconductor layer may be disposed on the buffer layer BFL. The semiconductor layer may include semiconductor patterns SCP of the transistors M. The semiconductor pattern SCP may include a channel region overlapping a gate electrode GE of the corresponding transistor M, and first and second conductive regions (for example, source and drain regions) disposed on both sides of the channel region. Each semiconductor pattern SCP may be a semiconductor pattern including polysilicon, amorphous silicon, or oxide semiconductor.

A gate insulating layer GI may be disposed on the semiconductor layer. A second conductive layer may be disposed on the gate insulating layer GI.

The second conductive layer may include gate electrodes GE of the transistors M. The second conductive layer may further include electrodes and/or bridge patterns of the capacitors Cst. In case that at least one power line and/or signal line disposed in the display area DA is provided as multiple layers, the second conductive layer may further include at least one conductive pattern forming the at least one power line and/or signal line.

The interlayer insulating layer ILD may be disposed on the second conductive layer. A third conductive layer may be disposed on the interlayer insulating layer ILD.

The third conductive layer may include source electrodes TE1 and drain electrodes TE2 of the transistors M. Each source electrode TE1 (also referred to as a "first transistor electrode") may be electrically connected to a region (for example, the source region) of the semiconductor pattern SCP included in the corresponding transistor M through a contact hole or the like, and each drain electrode TE2 (also referred to as a "second transistor electrode") may be electrically connected to another region (for example, the drain region) of the semiconductor pattern SCP included in the corresponding transistor M through another contact hole or the like.

FIG. 6 illustrates an embodiment in which the source electrodes TE1 and the drain electrodes TE2 of the transistors M are formed separately from the respective semiconductor patterns SCP, but the disclosure is not limited thereto. For example, in an embodiment, the source electrode TE1 and/or the drain electrode TE2 of at least one transistor M may be integrally formed with (or integral with) the semiconductor pattern SCP. As an example, the source electrode TE1 and the drain electrode TE2 may be formed by doping different regions of the semiconductor pattern SCP at a high concentration.

The third conductive layer may further include an electrode, at least one line, and/or a bridge pattern of each of the capacitors Cst. For example, the third conductive layer may include at least some lines extending in the first direction DR1 (or the second direction DR2) in the display area DA. For example, the third conductive layer may include scan lines SL (or Si−1, Si, Si+1, etc.), control lines SSL, emission control lines Ei, and/or a second power line PL2. In case that at least one power line and/or signal line disposed in the display area DA is provided as multiple layers, the third conductive layer may further include at least one conductive pattern forming the at least one power line and/or signal line.

The respective conductive patterns, electrodes, and/or lines forming the first to third conductive layers may have conductivity by including at least one conductive material, and the materials thereof are not particularly limited. For example, each of the conductive patterns, electrodes, and/or lines forming the first to third conductive layers may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), and may include other types of conductive materials. The conductive patterns, electrodes, and/or lines forming the first to third conductive layers may be provided as a single layer or multiple layers, and the cross-sectional structure thereof is not particularly limited.

A passivation layer PSV may be disposed on the third conductive layer. Each of the buffer layer BFL, the gate insulating layer GI, the interlayer insulating layer ILD, and the passivation layer PSV may be provided as a single layer or multiple layers, and may include at least one inorganic insulating material and/or at least one organic insulating material. For example, each of the buffer layer BFL, the gate insulating layer GI, the interlayer insulating layer ILD, and the passivation layer PSV may include various types of organic/inorganic insulating materials, including silicon nitride ($SiN_x$), silicon oxide ($SiO_x$), or silicon oxynitride ($SiO_xN_y$). In an embodiment, the passivation layer PSV may include an organic insulating layer and may planarize the surface of the pixel circuit part PCL.

A display element part DPL may be disposed on the passivation layer PSV.

The display element part DPL may include emission parts EMU of the pixels PX. For example, at least one light emitting element LD forming the emission part EMU of the pixel PX, and a first electrode ET1 and a second electrode ET2 electrically connected to the light emitting element LD may be disposed in each pixel area PXA of the display element part DPL.

For example, the display element part DPL may include a first electrode ET1 disposed in an emission area of the first pixel PX1 (hereinafter referred to as a "first emission area EMA1"), at least one light emitting element LD disposed on the first electrode ET1, a first electrode ET1 disposed in an emission area of the second pixel PX2 (hereinafter referred to as a "second emission area EMA2"), at least one light emitting element LD disposed on the first electrode ET1, a first electrode ET1 disposed in an emission area of the third pixel PX3 (hereinafter referred to as a "third emission area EMA3"), at least one light emitting element LD disposed on the first electrode ET1, and at least one second electrode ET2 disposed on each light emitting element LD. The display element part DPL may further include a partition wall PW disposed outside each pixel PX so as to surround at least one light emitting element LD disposed in each emission area EMA, a pad electrode PE disposed under the partition wall PW, and an insulating layer INS disposed between the pad electrode PE and the partition wall PW. In an embodiment, insulating films INF may be provided on the surfaces of the light emitting elements LD and the partition wall PW.

The first electrode ET1 of each pixel PX may be disposed on the pixel circuit part PCL so as to be positioned in each emission area EMA. For example, the first electrode ET1 of the first pixel PX1 may be disposed on the pixel circuit part PCL so as to be positioned in the first emission area EMA1, the first electrode ET1 of the second pixel PX2 may be disposed on the pixel circuit part PCL so as to be positioned in the second emission area EMA2, and the first electrode ET1 of the third pixel PX3 may be disposed on the pixel circuit part PCL so as to be positioned in the third emission area EMA3. In an embodiment, each of the first electrodes ET1 may be the anode electrode of the corresponding pixel PX. The first electrodes ET1 of the pixels PX may be separated from each other.

The first electrode ET1 may be electrically connected to at least one circuit element forming the pixel circuit PXC of the pixel PX. For example, the first electrode ET1 of the first pixel PX1 may be electrically connected to at least one circuit element forming the pixel circuit PXC of the first pixel PX1 (for example, the first transistor M1 of the first pixel PX1). Similarly, the first electrode ET1 of the second pixel PX2 may be electrically connected to at least one circuit element forming the pixel circuit PXC of the second pixel PX2 (for example, the first transistor M1 of the second pixel PX2), and the first electrode ET1 of the third pixel PX3 may be electrically connected to at least one circuit element forming the pixel circuit PXC of the third pixel PX3 (for example, the first transistor M1 of the third pixel PX3).

The first electrode ET1 may be electrically connected to the light emitting element LD of the pixel PX. For example, the first electrode ET1 of the first pixel PX1 may be electrically connected to a second light conversion layer CCL2 included in the light emitting element LD of the first pixel PX1. Similarly, the first electrode ET1 of the second pixel PX2 may be electrically connected to a second light conversion layer CCL2 included in the light emitting element LD of the second pixel PX2, and the first electrode ET1 of the third pixel PX3 may be electrically connected to a second light conversion layer CCL2 included in the light emitting element LD of the third pixel PX3.

The first electrode ET1 may have conductivity by including at least one conductive material, and the material thereof is not particularly limited. The first electrode ET1 may be provided as a single layer or multiple layers, and the shape and/or structure thereof is not particularly limited. For example, the first electrode ET1 may be provided as multiple layers including a first conductive pattern CD1 and a second conductive pattern CD2 which are sequentially disposed on the pixel circuit part PCL, but the disclosure is not limited thereto.

In an embodiment, the first electrode ET1 may include a reflective conductive layer. For example, at least one of the first conductive pattern CD1 and the second conductive pattern CD2 may include at least one metal film including at least one reflective metal material including metals with high reflectivity in a visible light wavelength band, for example, aluminum (Al), gold (Au), and silver (Ag). Accordingly, it is possible to increase the light efficiency of the pixels PX (for example, an emission rate of light generated by each light emitting element LD).

The pad electrodes PE may be disposed in the non-emission area NEA and may be electrically connected to each other. The pad electrodes PE may be electrically connected to the second power line PL2 provided in the pixel circuit part PCL and the second electrode ET2 provided in the display element part DPL. For example, the pad electrodes PE may be connection electrodes for electrically connecting the second power line PL2 of the pixel circuit part PCL to the second electrode ET2 of the display element part DPL.

In an embodiment, the pad electrodes PE are electrically connected to each other in a shape similar to the partition wall PW when viewed in a plan view, so that an integrated pad electrode may be configured. In this case, the pad electrodes PE may be physically and/or electrically regarded as a pad electrode. As another example, the pad electrodes PE are separated from each other, and may be electrically connected to each other through the second power line PL2 and/or the second electrode ET2.

The pad electrodes PE may be electrically connected to the second power line PL2 inside and/or outside the display area DA. For example, at least one pad electrode PE may extend to the non-display area NA and may be electrically connected to the second power line PL2 disposed below the non-display area NA (for example, the pixel circuit part PCL). As another example, as illustrated in FIG. 7, at least one pad electrode PE may be electrically connected to the second power line PL2 of the pixel circuit part PCL within the display area DA. Accordingly, the pad electrodes PE may be electrically connected to the second power line PL2.

The pad electrodes PE may have conductivity by including at least one conductive material, and the material of the pad electrodes PE is not particularly limited. The pad electrodes PE may be provided as a single layer or multiple layers, and the shape and/or structure thereof is not particularly limited.

In an embodiment, the pad electrodes PE may be formed simultaneously with the first electrodes ET1 in the process of forming the first electrodes ET1 of the pixels PX. As an example, the pad electrodes PE may be formed simultaneously with the first conductive patterns CD1 and/or the second conductive patterns CD2 in the process of forming the first conductive patterns CD1 and/or the second conductive patterns CD2 of the first electrodes ET1. In this case, the pad electrodes PE and first conductive patterns CD1 and/or the second conductive patterns CD2 may include the same conductive material.

The pad electrodes PE and the first electrodes ET1 may have a same structure or different structures. For example, the pad electrodes PE may be single-layer electrodes. The pad electrodes PE and the first conductive patterns CD1 or the second conductive patterns CD2 of the first electrodes ET1 may include the same material and may be formed simultaneously. As another example, the pad electrodes PE may be multi-layer electrodes. The pad electrodes PE and the first conductive patterns CD1 and the second conductive patterns CD2 of the first electrodes ET1 may include the same material and may be formed simultaneously. For example, the pad electrodes PE and the first electrodes ET1 may have substantially the same stack structure.

The light emitting element LD of the pixel PX may be disposed on each first electrode ET1. The insulating layer INS and the partition wall PW may be sequentially disposed on the pad electrodes PE.

The light emitting element LD may include a first semiconductor layer SCL1 (for example, a first conductivity type semiconductor layer), a second semiconductor layer SCL2 (for example, a second conductivity type semiconductor layer), and an emission layer EML disposed between the first and second semiconductor layers SCL1 and SCL2. In an embodiment, the first semiconductor layer SCL1 may be disposed on the emission layer EML so as to be positioned between the emission layer EML and the second electrode ET2, and the second semiconductor layer SCL2 may be disposed under the emission layer EML so as to be positioned between the first electrode ET1 and the emission layer EML. In an embodiment, the second semiconductor layer SCL2 may include a first light conversion layer CCL1 (also referred to as a "first color conversion layer") and a second light conversion layer CCL2 (also referred to as a "second color conversion layer").

For example, the light emitting element LD may include a light emitting stack structure including the second light conversion layer CCL2, the first light conversion layer CCL1, the emission layer EML, and the first semiconductor layer SCL1, which are sequentially disposed on the first electrode ET1. The first and second light conversion layers CCL1 and CCL2 may form a light conversion layer for converting the color of light generated inside the light emitting element LD and, at the same time, form a second semiconductor layer SCL2 of the light emitting element LD. In an embodiment, the light emitting element LD may further include at least one additional second semiconductor layer disposed between the first light conversion layer CCL1 and the second light conversion layer CCL2, and/or between the first light conversion layer CCL1 and the emission layer EML.

The emission layer EML may be formed in a single-quantum well structure or a multi-quantum well structure. In an embodiment, the emission layer EML may be formed in a double hetero-structure, but the disclosure is not limited thereto. In an embodiment, at least one material of GaN, InGaN, AlGaN, AlInGaN, AlGaInP, and AlGaInPAs may be used to form the emission layer EML, and various other materials may be used to form the emission layer EML.

The emission layer EML may be a layer in which light is generated by carrier recombination. For example, in case that a voltage higher than or equal to a threshold voltage is applied to both ends of the light emitting element LD, electron-hole pairs are recombined in the emission layer EML of the light emitting element LD, and thus the light emitting element LD emits light.

The emission layer EML may generate light in a visible light wavelength band, for example, light in a wavelength band of about 400 nm to about 900 nm. In an embodiment, the emission layer EML may generate light of a first color by including a single-quantum well or a multi-quantum well that emits light of a first wavelength band corresponding to the first color. For example, the emission layer EML may emit light in a blue wavelength band (for example, about 450 nm to about 480 nm) corresponding to light of a relatively short wavelength among light in a visible light wavelength band.

In an embodiment, the emission layer EML may include a nitride-based semiconductor material. By adjusting the composition ratio of at least one material forming the nitride-based semiconductor material, the color (or wavelength) of light generated in the emission layer EML may be adjusted. For example, the emission layer EML may be provided as multiple layers including a GaN layer and an InGaN layer alternately and/or repeatedly stacked with each other. By adjusting the composition ratio of indium (In) included in the InGaN layer of the emission layer EML, the emission layer EML may be controlled to generate light of a first color (for example, blue light).

In an embodiment, a clad layer (not illustrated) doped with a conductive dopant may be provided above and/or below the emission layer EML. The clad layer may be an AlGaN layer or an AlInGaN layer, but the disclosure is not limited thereto.

The first semiconductor layer SCL1 may be a first conductivity type semiconductor layer including a first conductivity type dopant. For example, the first semiconductor layer SCL1 may be an N-type semiconductor layer including an N-type dopant. For example, the first semiconductor layer SCL1 includes at least one semiconductor material selected from nitride-based semiconductor materials, for example, GaN, AlInGaN, AlGaN, InGaN, AlN, and InN, and may be an N-type semiconductor layer doped with an N-type dopant such as Si, Ge, and Sn. However, the material forming the first semiconductor layer SCL1 is not limited thereto, and the first semiconductor layer SCL1 may include various other materials.

The first semiconductor layer SCL1 may be disposed between the emission layer EML and the second electrode ET2 of each pixel PX, and may be electrically connected to the second electrode ET2. In case that the second electrodes ET2 of the pixels PX form a common electrode, the first semiconductor layers SCL1 provided in the light emitting elements LD of the pixels PX may be electrically connected to the common electrode. Accordingly, each light emitting element LD may be electrically connected to the second electrode ET2.

The first light conversion layer CCL1 may be disposed under the emission layer EML so as to be positioned between the emission layer EML and the first electrode ET1. In an embodiment, the first light conversion layer CCL1 may have a single-quantum well structure or a multi-quantum well structure. The first light conversion layer CCL1 may have a double hetero-structure, but the disclosure is not limited thereto. In an embodiment, the first light conversion layer CCL1 may have a substantially identical or similar structure to the emission layer EML, but the disclosure is not limited thereto. In an embodiment, at least one material of GaN, InGaN, AlGaN, AlInGaN, AlGaInP, and AlGaInPAs may be used to form the first light conversion layer CCL1, and various other materials may be used to form the first light conversion layer CCL1.

The first light conversion layer CCL1 may include a second conductivity type dopant to configure the second semiconductor layer SCL2 of the light emitting element LD. In an embodiment, in case that the first electrode ET1 is an anode electrode of each pixel PX, the first light conversion layer CCL1 may be a P-type semiconductor layer. For example, the first light conversion layer CCL1 may include a P-type dopant and may form a P-type semiconductor layer of the light emitting element LD.

For example, the first light conversion layer CCL1 may include at least one semiconductor material selected from nitride-based semiconductor materials, for example, AlInGaN, GaN, AlGaN, InGaN, AlN, and InN, and may be a P-type semiconductor layer doped with a P-type dopant such as Mg. However, the material forming the first light conversion layer CCL1 is not limited thereto, and the first light conversion layer CCL1 may include various other materials.

The first light conversion layer CCL1 may convert at least a part of the light of the first color (or the light in the first wavelength band corresponding to the first color) introduced from the emission layer EML into the light of the second color (or the light in the second wavelength band corresponding to the second color). For example, a part of the light of the first color (for example, blue light) generated in the emission layer EML may be incident on the first light conversion layer CCL1 and may be converted into the light of the second color (for example, green light) in the first light conversion layer CCL1. For example, the first light conversion layer CCL1 may include a single-quantum well or a multi-quantum well that absorbs the light of the first color introduced from the emission layer EML and emits the light of the second color having a wavelength longer than that of the light of the first color.

In an embodiment, the first light conversion layer CCL1 may include a nitride-based semiconductor material. By adjusting the composition ratio of at least one material forming the nitride-based semiconductor material, the color (or wavelength) of light emitted from the first light conversion layer CCL1 may be adjusted. For example, the first light conversion layer CCL1 may be provided as multiple layers including a GaN layer and an InGaN layer alternately and/or repeatedly stacked with each other. By adjusting the composition ratio of indium (In) included in the InGaN layer of the first light conversion layer CCL1, the first light conversion layer CCL1 may be controlled to emit the light of the second color (for example, green light).

In an embodiment, the first light conversion layer CCL1 and the emission layer EML may include a same material (for example, a nitride-based compound including GaN) and be formed on a same fabrication substrate. For example, the first light conversion layer CCL1 and the emission layer EML may include a same nitride-based semiconductor material (for example, GaN), and the first light conversion layer CCL1 is formed on a fabrication substrate on which the emission layer EML is formed. The composition ratios of at least one element (for example, indium (In)) forming the first light conversion layer CCL1 and the emission layer EML may be different from each other. Therefore, the emission layer EML may emit the light of the first color, and the first light conversion layer CCL1 may absorb the light of the first color incident from the emission layer EML and emit the light of the second color.

The first light conversion layer CCL1 may be electrically connected to the first electrode ET1 of each pixel PX through the second light conversion layer CCL2.

The second light conversion layer CCL2 may be disposed under the first light conversion layer CCL1 so as to be positioned between the first light conversion layer CCL1 and the first electrode ET1. In an embodiment, the second light conversion layer CCL2 may have a single-quantum well structure or a multi-quantum well structure. The second light conversion layer CCL2 may have a double hetero-structure, but the disclosure is not limited thereto. In an embodiment, the second light conversion layer CCL2, and the first light conversion layer CCL1 and/or the emission layer EML may have a substantially identical or similar structure, but the disclosure is not limited thereto. In an embodiment, at least one material of GaN, InGaN, AlGaN, AlInGaN, AlGaInP, and AlGaInPAs may be used to form the second light conversion layer CCL2, and various other materials may be used to form the second light conversion layer CCL2.

In an embodiment, the second light conversion layer CCL2 may include a second conductivity type dopant to configure the second semiconductor layer SCL2 of the light emitting element LD. For example, the second light conversion layer CCL2 may be a P-type semiconductor layer including a P-type dopant, and may configure the P-type semiconductor layer of the light emitting element LD together with the first light conversion layer CCL1.

For example, the second light conversion layer CCL2 may include at least one semiconductor material selected from nitride-based semiconductor materials, for example, AlInGaN, GaN, AlGaN, InGaN, AlN, and InN, and may be a P-type semiconductor layer doped with a P-type dopant such as Mg. However, the material forming the second light conversion layer CCL2 is not limited thereto, and the second light conversion layer CCL2 may include various other materials.

The second light conversion layer CCL2 may convert at least a part of the light of the first color and/or the light of the second color introduced from the emission layer EML and/or the first light conversion layer CCL1 into the light of the third color (or the light in the third wavelength band corresponding to the third color). For example, a part of the light of the first color (for example, blue light) generated in the emission layer EML and the light of the second color (for example, green light) converted in the first light conversion layer CCL1 may be incident on the second light conversion layer CCL2 and converted into the light of the third color (for example, red light) in the second light conversion layer CCL2. For example, the second light conversion layer CCL2 may include a single-quantum well or a multi-quantum well that absorbs the light of the first color and/or the light of the second color introduced from the emission layer EML and/or the first light conversion layer CCL1 and emit the light of the third color having a wavelength longer than that of the light of the first color and the second color.

In an embodiment, the second light conversion layer CCL2 may include a nitride-based semiconductor material. By adjusting the composition ratio of at least one material forming the nitride-based semiconductor material, the color (or wavelength) of light emitted from the second light conversion layer CCL2 may be adjusted. For example, the second light conversion layer CCL2 may be provided as multiple layers including a GaN layer and an InGaN layer alternately and/or repeatedly stacked with each other. By adjusting the composition ratio of indium (In) included in the InGaN layer of the second light conversion layer CCL2, the second light conversion layer CCL2 may be controlled to emit the light of the third color (for example, red light).

In an embodiment, the second light conversion layer CCL2, and the emission layer EML and/or the first light conversion layer CCL1 may include a same material (for example, a nitride-based compound including GaN) and be formed on a same fabrication substrate. For example, the emission layer EML, the first light conversion layer CCL1, and the second light conversion layer CCL2 include a same nitride-based semiconductor material (for example, GaN) and are sequentially formed on the same fabrication substrate, and the composition ratios of at least one element (for example, indium (In)) forming the emission layer EML, the first light conversion layer CCL1, and the second light conversion layer CCL2 may be different from each other. Accordingly, the emission layer EML may emit the light of the first color, the first light conversion layer CCL1 may absorb the light of the first color incident from the emission layer EML and emit the light of the second color, and the second light conversion layer CCL2 may absorb the light of the first color and/or the light of the second color incident from the emission layer EML and/or the first light conversion layer CCL1 and emit the light of the third color.

In an embodiment, the second light conversion layer CCL2 may be formed by using a material different from that of the emission layer EML and/or the first light conversion layer CCL1. For example, a phosphide-based and/or arsenic-based compound having high light conversion efficiency for red light, including AlGaInP or AlGaInPAs may be used to separately grow the second light conversion layer CCL2 on a fabrication substrate different from the emission layer EML and/or the first light conversion layer CCL1. The second light conversion layer CCL2 may be disposed to overlap the emission layer EML and/or the first light conversion layer CCL1 by a bonding process (or connecting process) or the like.

The second light conversion layer CCL2 may be electrically connected to the first electrode ET1 of each pixel PX. For example, the second light conversion layer CCL2 may be directly disposed and/or electrically connected to the first electrode ET1 of each pixel PX, so that the second light conversion layer CCL2 is electrically connected to the first electrode ET1. However, the disclosure is not limited thereto. For example, in an embodiment, at least one electrode layer may be provided between the second light conversion layer CCL2 and each of the first electrodes ET1.

The insulating layer INS and the partition wall PW may be disposed on the pad electrodes PE.

The insulating layer INS may include at least one insulating material and may have a single layer or multiple layers. For example, the insulating layer INS may include at least one insulating material selected from $SiO_2$ and undefined silicon oxide $(SiO_x)$, $Si_3N_4$ and undefined silicon nitride $(SiN_x)$, $Al_2O_3$ and undefined aluminum oxide $(Al_xO_y)$, and $TiO_2$ and undefined titanium oxide $(Ti_xO_y)$, but the disclosure is not limited thereto. The pad electrodes PE and the second semiconductor layer SCL2 of the partition wall PW (for example, the first and second light conversion layers CCL1 and CCL2) are electrically insulated by the insulating layer INS.

The partition wall PW may be disposed on the insulating layer INS. The partition wall PW may be disposed between the pixels PX. For example, the partition wall PW may be disposed in the non-emission area NEA to surround the emission areas EMA of the pixels PX.

In an embodiment, the partition wall PW and the light emitting elements LD of the pixels PX may include a same material and may be formed simultaneously. The partition wall PW and the light emitting elements LD may have a same stack structure.

For example, the partition wall PW and the light emitting elements LD of the pixels PX may include a same material and stack structure. For example, the partition wall PW may include a light emitting stack structure including the second light conversion layer CCL2, the first light conversion layer CCL1, the emission layer EML (also referred to as "non-emission layer NEML"), and the first semiconductor layer SCL1, which are sequentially disposed on the pad electrodes PE and the insulating layer INS. In an embodiment, the first and second light conversion layers CCL1 and CCL2 of the partition wall PW may form the second semiconductor layer SCL2 of the partition wall PW.

The first semiconductor layer SCL1 of the partition wall PW and the first semiconductor layers SCL1 of the light emitting elements LD may be formed simultaneously. The first semiconductor layer SCL1 of the partition wall PW and the first semiconductor layers SCL1 of the light emitting elements LD may include the same material and/or stack structure.

The emission layer EML of the partition wall PW and the emission layers EML of the light emitting elements LD may be formed simultaneously. The emission layer EML of the partition wall PW and the emission layers EML of the light emitting elements LD may include a same material and/or stack structure. As an example, the emission layer EML of the partition wall PW and the emission layers EML of the light emitting elements LD may include a same nitride-based semiconductor material, and may include multiple layers having the same stack structure.

The second semiconductor layer SCL2 of the partition wall PW and the second semiconductor layers SCL2 of the light emitting elements LD may be formed simultaneously. The second semiconductor layer SCL2 of the partition wall PW and the second semiconductor layers SCL2 of the light emitting elements LD may have a same material and/or stack structure.

For example, the second semiconductor layer SCL2 of the partition wall PW may include the second light conversion layer CCL2 and the first light conversion layer CCL1, which are sequentially disposed on the insulating layer INS. The second light conversion layer CCL2 of the partition wall PW and the second light conversion layers CCL2 of the light emitting elements LD may include a same material and/or stack structure, and may be formed simultaneously. The first light conversion layer CCL1 of the partition wall PW and the first light conversion layers CCL1 of the light emitting elements LD may include a same material and/or stack structure, and may be formed simultaneously.

In an embodiment, the light emitting elements LD and the partition wall PW may be simultaneously grown and/or manufactured on a fabrication substrate, and may be formed to have substantially the same height. In this case, the light emitting elements LD and the partition wall PW may be provided at substantially the same height with respect to the substrate SUB.

The partition wall PW may be formed to be completely electrically isolated by the insulating layer INS and/or the insulating film INF provided on the surface thereof, or at least one of the first and second semiconductor layers SCL1 and SCL2 (for example, the second semiconductor layer SCL2) may be electrically isolated and/or floated. For example, the second semiconductor layer SCL2 of the partition wall PW may maintain an electrically floating state by the insulating layer INS and the insulating film INF.

Accordingly, the partition wall PW may include a light emitting stack structure and may maintain a deactivated state. For example, the partition wall PW may not be provided with an electrical signal capable of activating the light emitting stack structure. Accordingly, the partition wall PW may remain as a deactivated light emitting element. For example, the emission layer EML of the partition wall PW may not receive holes and electrons required for light emission, so that the non-emission state may be maintained.

Insulating films INF may be provided on the surfaces of the light emitting element LD and the partition wall PW. For example, the insulating film INF may be provided on the surface of the light emitting element LD to surround side surfaces of the first and second light conversion layers CCL1 and CCL2, the emission layer EML, and the first semiconductor layer SCL1 of the light emitting element LD. The insulating film INF may also be provided on the surface of the partition wall PW to surround side surfaces of the first and second light conversion layers CCL1 and CCL2, the emission layer EML, and the first semiconductor layer SCL1 of the partition wall PW. As the insulating film INF is provided, it is possible to reduce or prevent surface defects of the light emitting elements LD and the partition wall PW, and it is possible to prevent short-circuit defects through the light emitting elements LD and the partition wall PW.

The insulating film INF may at least partially expose the upper surfaces of the light emitting elements LD. For example, the insulating film INF may expose the upper surfaces of the first semiconductor layers SCL1 of the light emitting elements LD. Accordingly, the first semiconductor layers SCL1 of the light emitting elements LD may be electrically connected to the second electrode ET2.

The insulating film INF may or may not expose the upper surface of the partition wall PW. For example, the insulating film INF may be selectively disposed on the upper surface of the partition wall PW. In an embodiment, in case that the insulating film INF is also provided on the upper surface of the partition wall PW, it is possible to stably block the application of an electric signal to the partition wall PW. In an embodiment, in case that the insulating film INF at least partially exposes the upper surface of the partition wall PW (for example, in case that the insulating film INF is removed from the upper portion of the partition wall PW), light propagation to the upper portion of the partition wall PW through the insulating film INF may reduce or prevent the occurrence of light loss.

The insulating film INF may include a transparent insulating material. Accordingly, light generated from each emission layer EML may pass through the insulating film INF and may be emitted to the outside of the light emitting element LD. For example, the insulating film INF may include at least one insulating material selected from $SiO_2$ and undefined silicon oxide $(SiO_x)$, $Si_3N_4$ and undefined silicon nitride $(SiN_x)$, $Al_2O_3$ and undefined aluminum oxide $(Al_xTiO_2$ and undefined titanium oxide $(Ti_xO_y)$, and hafnium oxide $(HfO_x)$, but the disclosure is not limited thereto. The insulating film INF may include a single layer or multiple layers.

The second electrode ET2 may be disposed on the light emitting element LD of each pixel PX. The second electrode ET2 may be electrically connected to the first semiconductor layer SCL1 of the light emitting element LD. For example, the second electrode ET2 may be formed directly on the first semiconductor layer SCL1 of the light emitting element LD, and may be electrically connected to the first semiconductor layer SCL1. As another example, the second electrode ET2 may be electrically connected to the first semiconductor layer SCL1 of the light emitting element LD through at least one electrode layer or the like.

In an embodiment, the second electrodes ET2 of the pixels PX may be integrally formed with (or integral with) each other to substantially form a second electrode ET2 (also referred to as a "common electrode"). For example, the second electrodes ET2 of the pixels PX may be electrically connected to each other as the cathode electrodes of the pixels PX.

For example, a second electrode ET2 may be entirely formed in the display area DA, and the second electrode ET2 may be commonly electrically connected to the light emitting elements LD of the pixels PX. However, the disclosure is not limited thereto. For example, the second electrode ET2 may be formed entirely in the display area DA, and may include openings formed in the non-emission area NEA including the upper portion of the partition wall PW and the like. As another example, the second electrodes ET2 of the pixels PX may be separated from each other and individually formed in each pixel area PXA, and may be electrically connected to each other through the pad electrodes PE and/or the second power line PL2.

In the embodiment in which the pixels PX are formed in a structure in which the anode electrode is shared, the first electrodes ET1 of the pixels PX may be separated from each other as cathode electrodes of the pixels PX, and the second electrodes ET2 may be electrically connected to each other as the anode electrodes of the pixels PX. In this case, the first semiconductor layers SCL1 of the light emitting elements LD may be P-type semiconductor layers including a P-type dopant, and the second semiconductor layers SCL2 of the light emitting elements LD may be N-type semiconductor layers including an N-type dopant.

The second electrode(s) ET2 may be electrically connected to the pad electrodes PE. For example, the second electrode ET2 may be disposed on at least side surfaces of the pad electrodes PE and directly connected to the pad electrodes PE.

The second electrode ET2 may have conductivity by including at least one conductive material. In an embodiment, the second electrode ET2 may include a transparent conductive material. For example, the second electrode ET2 may include at least one transparent electrode layer including a transparent conductive material such as indium tin oxide (ITO), indium zinc oxide (IZO), indium tin zinc oxide (ITZO), zinc oxide (ZnO), or indium oxide $(In_xO_y)$, and may be substantially transparent. Accordingly, the light emission efficiency (for example, front light emission rate) of light generated by each light emitting element LD may be increased. The second electrode ET2 may be provided as a single layer or multiple layers, and the shape and/or structure thereof is not particularly limited.

In an embodiment, a reflective film RFL may be provided on at least a portion of the partition wall PW. For example, the reflective film RFL may be provided on the side surface of the partition wall PW to surround the emission areas EMA of the pixels PX. In case that the insulating film INF and/or the second electrode ET2 are provided on the side surface of the partition wall PW, the reflective film RFL may be disposed on the insulating film INF and at least a portion of the second electrode ET2 to surround the side surface of the partition wall PW.

The reflective film RFL may face each light emitting element LD. Accordingly, the emission efficiency of light generated by the light emitting elements LD may be increased.

In an embodiment, the reflective film RFL may be provided on both the side surface and the upper surface of the partition wall PW as in the embodiments of FIGS. 6 and 7, but the disclosure is not limited thereto. For example, in an embodiment, the reflective film RFL may be provided only on the side surface of the partition wall PW, and may not be provided on the upper surface of the partition wall PW. For example, the reflective film RFL may be provided on at least a portion of the partition wall PW, and at least a portion of the reflective film RFL may be formed to face the light emitting elements LD in consideration of the light efficiency of the pixels PX.

In an embodiment, the reflective film RFL may include a single-layer metal film or a multi-layer metal film including at least one type of metal or alloy. For example, the reflective film RFL may include a single-layer metal film including at least one of various metal materials including a metal having high reflectivity in a visible light wavelength band, for example, aluminum (Al), gold (Au), and silver (Ag).

In an embodiment, a filler FIL may be selectively formed in each emission area EMA. For example, the display device DD may not include a separate filler FIL as in the embodiment of FIG. 6, or may include a filler FIL provided in each emission area EMA as in the embodiment of FIG. 7.

In an embodiment, the filler FIL may fill a gap between the light emitting elements LD, color filters CF (for example, first, second and third color filters CF1, CF2, and CF3), and the partition wall PW. The filler FIL may include a low refractive index material, in which a refractive index is matched, in order to increase light emission efficiency of each pixel PX. For example, the filler FIL may include a low refractive index material (for example, silicon oxide ($SiO_x$)) having a refractive index of about 1.4 to about 1.6.

The filler FIL may optionally include light scattering particles. For example, the filler FIL may include at least one type of light scattering material including silica.

A light control part LCP may be disposed on the display element part DPL. The light control part LCP may be disposed on a path through which light generated by the light emitting elements LD is emitted.

The light control part LCP may include color filters CF disposed in the emission area EMA of each pixel PX. For example, the light control part LCP may include a first color filter CF1 disposed in the first emission area EMA1 of the first pixel PX1, a second color filter CF2 disposed in the second emission area EMA2 of the second pixel PX2, and a third color filter CF3 disposed in the third emission area EMA3 of the third pixel PX3.

The first color filter CF1 may be positioned above the light emitting element LD of the first pixel PX1, and may selectively transmit light of the first wavelength band corresponding to the first color among white light emitted from the light emitting element LD of the first pixel PX1. Accordingly, the light of the first color may be emitted from the first pixel PX1.

The second color filter CF2 may be positioned above the light emitting element LD of the second pixel PX2, and may selectively transmit light of the second wavelength band corresponding to the second color among white light emitted from the light emitting element LD of the second pixel PX2. Accordingly, the light of the second color may be emitted from the second pixel PX2.

The third color filter CF3 may be positioned above the light emitting element LD of the third pixel PX3, and may selectively transmit the light of the third color emitted from the emitting element LD of the third pixel PX3. Accordingly, the light of the third color may be emitted from the third pixel PX3.

In an embodiment, the first color filter CF1, the second color filter CF2, and the third color filter CF3 may be a blue color filter, a green color filter, and a red color filter for selectively transmitting blue light, green light, and red light, respectively. In this case, the first pixel PX1 may be a blue pixel for emitting blue light, and the second pixel PX2 may be a green pixel for emitting green light. The third pixel PX3 may be a red pixel for emitting red light.

In an embodiment, the light control part LCP may further include a black matrix BM disposed in the non-emission area NEA so as to be positioned between the color filters CF. For example, the light control part LCP may include a black matrix BM disposed on the partition wall PW and including at least one light blocking material.

In an embodiment, the light control part LCP may not include the black matrix BM. For example, instead of forming a separate black matrix BM on the partition wall PW, the first, second, and third color filters CF1, CF2, and CF3 are disposed to overlap each other, thereby blocking light from passing through the non-emission area NEA.

Figure 8:
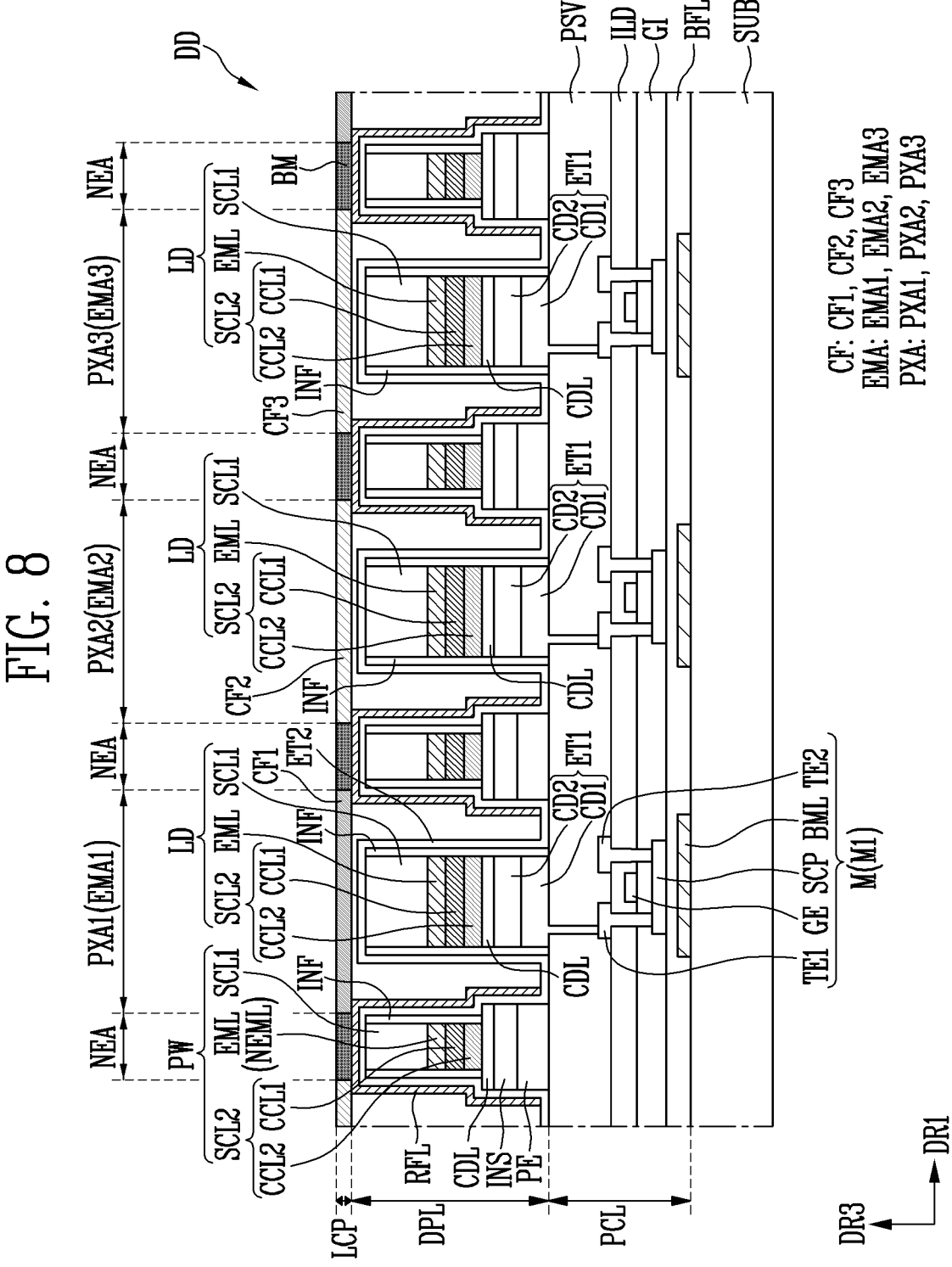
FIGS. 8 to 10 are cross-sectional views schematically illustrating a display device according to respective embodiments of the disclosure.
Figure 9:
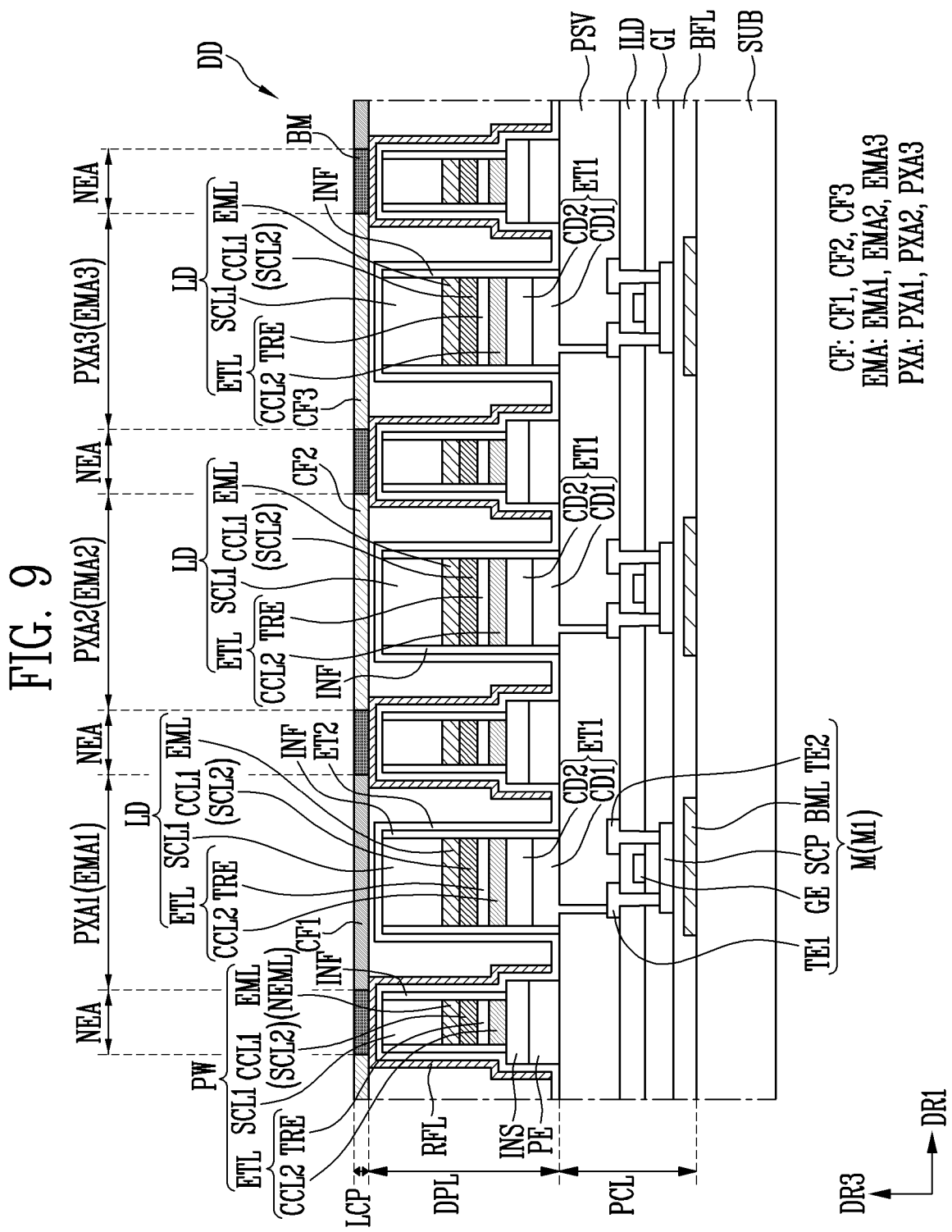
Figure 10:
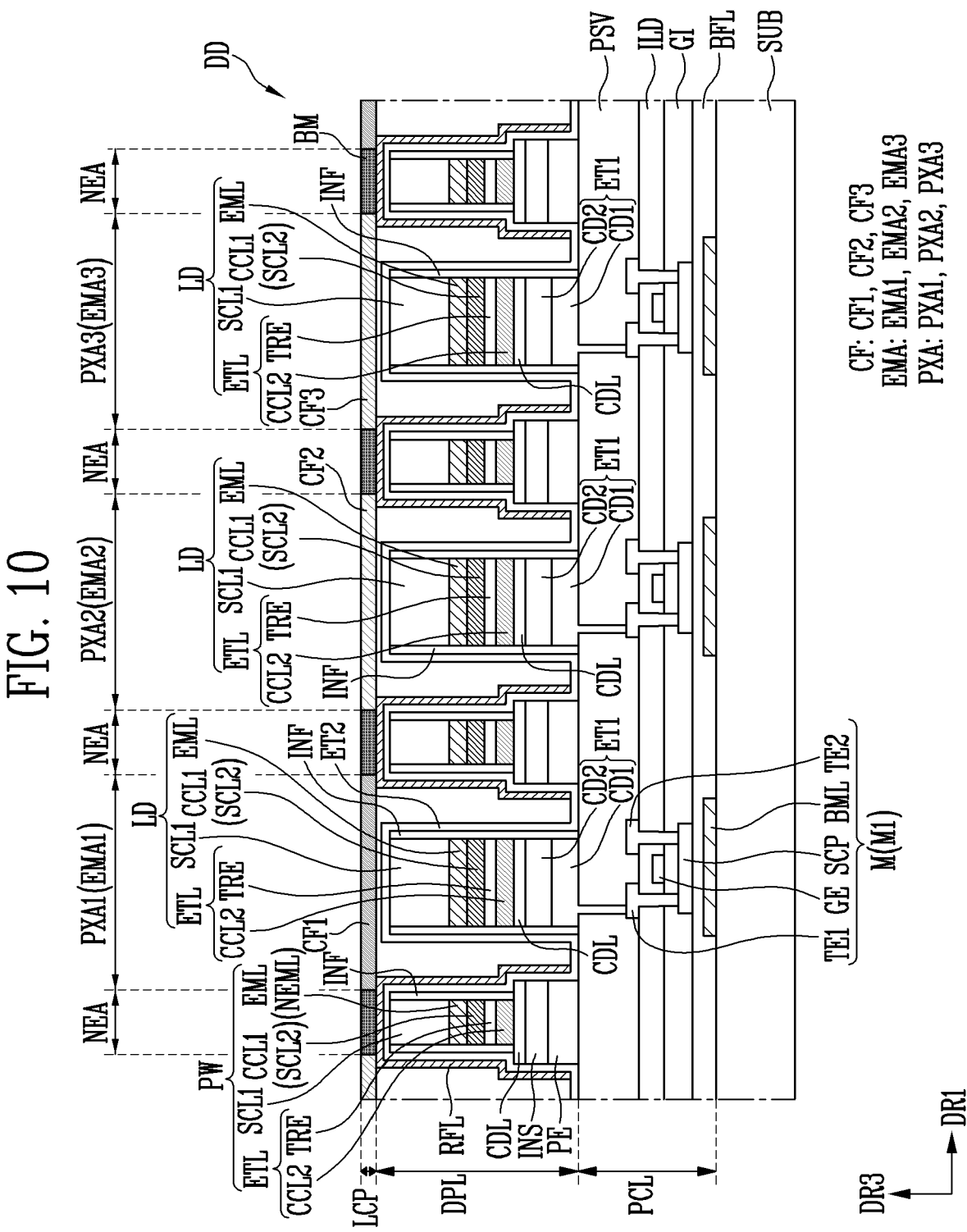

FIGS. 8 to 10 are schematic cross-sectional views illustrating a display device DD according to respective embodiments. For example, FIGS. 8 to 10 illustrate different modifications of the embodiment of FIG. 6. In describing the embodiments of FIGS. 8 to 10, the components that are similar or identical to those of the above-described embodiments (for example, the embodiments of FIGS. 6 and/or 7 are denoted by the same reference numerals, and detailed descriptions thereof will be omitted.

Referring to FIG. 8, the display device DD may further include a conductive layer CDL positioned under each light emitting element LD and/or the partition wall PW. In an embodiment, in a bonding process for bonding a light emitting element substrate, on which the light emitting elements LD are formed, to a driving substrate, on which the first electrodes ET1 and the pad electrodes PE are formed, the conductive layer CDL may be formed by curing a bonding material applied to the fabrication substrate and/or the driving substrate. In an embodiment, the conductive layer CDL may be formed by using, solely or in combination, metals such as gold (Au), copper (Cu), aluminum (Al), chromium (Cr), titanium (Ti), nickel (Ni), or alloys or oxides thereof, or transparent conductive materials such as indium tin oxide (ITO), indium zinc oxide (IZO), indium tin zinc oxide (ITZO), zinc oxide (ZnO), or indium oxide ($In_2O_3$). For example, in case that the bonding process can be performed smoothly and the conductivity for electrically connecting the first electrodes ET1 to the light emitting element LD, etc. can be sufficiently secured, the material of the conductive layer CDL is not particularly limited.

Referring to FIG. 9, the light emitting elements LD and/or the partition wall PW may further include a transparent electrode TRE disposed between the first light conversion layer CCL1 and the second light conversion layer CCL2. In this case, the first light conversion layer CCL1 may include a second conductivity type dopant to configure the second semiconductor layer SCL2 of the light emitting element LD, and the second light conversion layer CCL2 may include a first conductivity type dopant or a second conductivity type dopant. For example, the second light conversion layer CCL2 may include a single-quantum well or a multi-quantum well that absorbs the light of the first color or the light of the second color and emits the light of the third color, and may include a first conductivity type dopant or a second conductivity type dopant. For example, in the embodiment of FIG. 9, the doping type of the second light conversion layer CCL2 is not particularly limited. In an embodiment, the second light conversion layer CCL2 may configure the electrode layer ETL of the light emitting element LD together with the transparent electrode TRE, but the disclosure is not limited thereto.

In an embodiment, in a bonding process for bonding a first fabrication substrate, on which the first semiconductor layer SCL1, the emission layer EML, and/or the first light conversion layer CCL1 are formed, to a second fabrication substrate, on which the second light conversion layer CCL2 is formed, the transparent electrode TRE may be formed by curing a bonding material applied on the first fabrication substrate and/or the second fabrication substrate.

The transparent electrode TRE may include a transparent conductive material. For example, the transparent electrode TRE may include at least one transparent electrode layer including a transparent conductive material such as indium tin oxide (ITO), indium zinc oxide (IZO), indium tin zinc oxide (ITZO), zinc oxide (ZnO), or indium oxide ($In_xO_y$), and may be substantially transparent. Accordingly, at least a portion of light generated by each light emitting element LD may pass through the transparent electrode TRE and may be incident on the second light conversion layer CCL2. The light of the third color converted by the second light conversion layer CCL2 may be emitted to the outside of the light emitting element LD through the transparent electrode TRE, the first light conversion layer CCL1, the emission layer EML, and/or the first semiconductor layer SCL1.

Referring to FIG. 10, the display device DD may further include a conductive layer CDL positioned under each light emitting element LD and/or the partition wall PW. The light emitting elements LD and/or the partition wall PW may further include a transparent electrode TRE disposed between the first light conversion layer CCL1 and the second light conversion layer CCL2. For example, the display device DD may include both the conductive layer CDL according to the embodiment of FIG. 8 and the transparent electrode TRE according to the embodiment of FIG. 9.

FIGS. 11 to 23 are schematic cross-sectional views illustrating a method of manufacturing a display device DD according to an embodiment. For example, FIGS. 11 to 23 sequentially illustrate a method of manufacturing the display device DD of FIG. 8.

Referring to FIGS. 1 to 11, a first fabrication substrate FSB1 may be prepared, and a first semiconductor layer SCL1 may be formed on the first fabrication substrate FSB1.

The first fabrication substrate FSB1 may be a fabrication substrate for epitaxial growth. The first fabrication substrate FSB1 may be a commercially available single crystal substrate, but the disclosure is not limited thereto. In an embodiment, the first fabrication substrate FSB1 may be a GaAs, GaP, InP, or Si substrate. The first fabrication substrate FSB1 may include a ZnO substrate having a GaAs layer on the surface thereof. A Ge substrate having a GaAs layer on a surface thereof, a Si substrate having a GaAs layer on a Si wafer with a buffer layer therebetween, and the like may be used as the first fabrication substrate FSB1.

The first fabrication substrate FSB1 may be a substrate of various types and/or materials. For example, in case that epitaxial growth for manufacturing the light emitting elements LD may be smoothly performed, the material of the first fabrication substrate FSB1 is not particularly limited.

In an embodiment, after at least one buffer layer (or sacrificial layer) is grown and/or formed on the first fabrication substrate FSB1 by epitaxial growth, a first semiconductor layer SCL1 may be grown and/or formed on the buffer layer. The buffer layer may include a semiconductor material such as GaN, GaAs, AlAs, or AlGaAs. The buffer layer may include at least one semiconductor layer including an intrinsic semiconductor that is not doped with impurities. In an embodiment, an etching layer and/or a current blocking layer may be further formed between the first fabrication substrate FSB1 and the first semiconductor layer SCL1 according to a process method used to separate the light emitting elements LD from the first fabrication substrate FSB1 after the light emitting elements LD is manufactured.

The first semiconductor layer SCL1 may be formed on the first fabrication substrate FSB1 (or the buffer layer, the etching layer, and/or the current blocking layer formed on the first fabrication substrate FSB1). The first semiconductor layer SCL1 may be formed by epitaxial growth and may be formed by a metalorganic chemical vapor deposition (MOCVD) method, a molecular-beam epitaxy (MBE) method, a vapor phase epitaxy (VPE) method, a liquid phase epitaxy (LPE) method, or the like, but the method of forming the first semiconductor layer SCL1 is not limited thereto.

In an embodiment, the first semiconductor layer SCL1 may include a semiconductor material including a Group III (Ga, Al, In)—V (P, As) material. For example, the first semiconductor layer SCL1 may include a nitride-based semiconductor material such as GaN, AlInGaN, AlGaN, InGaN, AlN, or InN.

The first semiconductor layer SCL1 may be formed by a doping process, and thus may include a first conductivity type dopant. For example, the first semiconductor layer SCL1 may include a first conductivity type semiconductor doped with a first conductivity type dopant such as Si, Ge, and Sn.

Referring to FIG. 12, an emission layer EML may be formed on the first semiconductor layer SCL1. The emission layer EML may be formed by epitaxial growth. In case that electrons and holes recombine in the emission layer EML, light of a first color may be emitted. For example, the emission layer EML may include a single-quantum well or a multi-quantum well for generating the light of the first color. For example, the emission layer EML may be formed as multiple layers by alternately and/or repeatedly forming a GaN layer and an InGaN layer on the first semiconductor layer SCL1. The emission layer EML may be formed so that the emission layer EML emits the light of the first color (for example, blue light) by adjusting the composition ratio of indium (In) included in the InGaN layer.

Referring to FIG. 13, a first light conversion layer CCL1 may be formed on the emission layer EML. The first light conversion layer CCL1 may be formed by epitaxial growth, so that the light of the first color incident on the first light conversion layer CCL1 is converted into light of a second color. For example, the first light conversion layer CCL1 may be formed to absorb light of a first color (for example, blue light) belonging to a first wavelength band and convert the light of the first color into light of a second color (for example, green light) belonging to a second wavelength band that is a longer wavelength than the first wavelength band.

In an embodiment, the first light conversion layer CCL1 may include a single-quantum well or a multi-quantum well having a structure similar to or identical to that of the emission layer EML. For example, the first light conversion layer CCL1 may be formed as multiple layers by alternately and/or repeatedly forming a GaN layer and an InGaN layer on the emission layer EML. By adjusting the composition ratio of indium (In) contained in the InGaN layer, the first light conversion layer CCL1 may be formed so that the first light conversion layer CCL1 emits the light of the second color. For example, the first light conversion layer CCL1 may absorb the light of the first color incident from the emission layer EML and convert the light of the first color into the light of the second color.

The first light conversion layer CCL1 may be formed to include a second conductivity type dopant by a doping process. For example, the first light conversion layer CCL1 may include a second conductivity type semiconductor doped with a second conductivity type dopant such as Mg. Accordingly, the first light conversion layer CCL1 may form the second semiconductor layer SCL2 of the light emitting element LD.

Figures 14, 15:
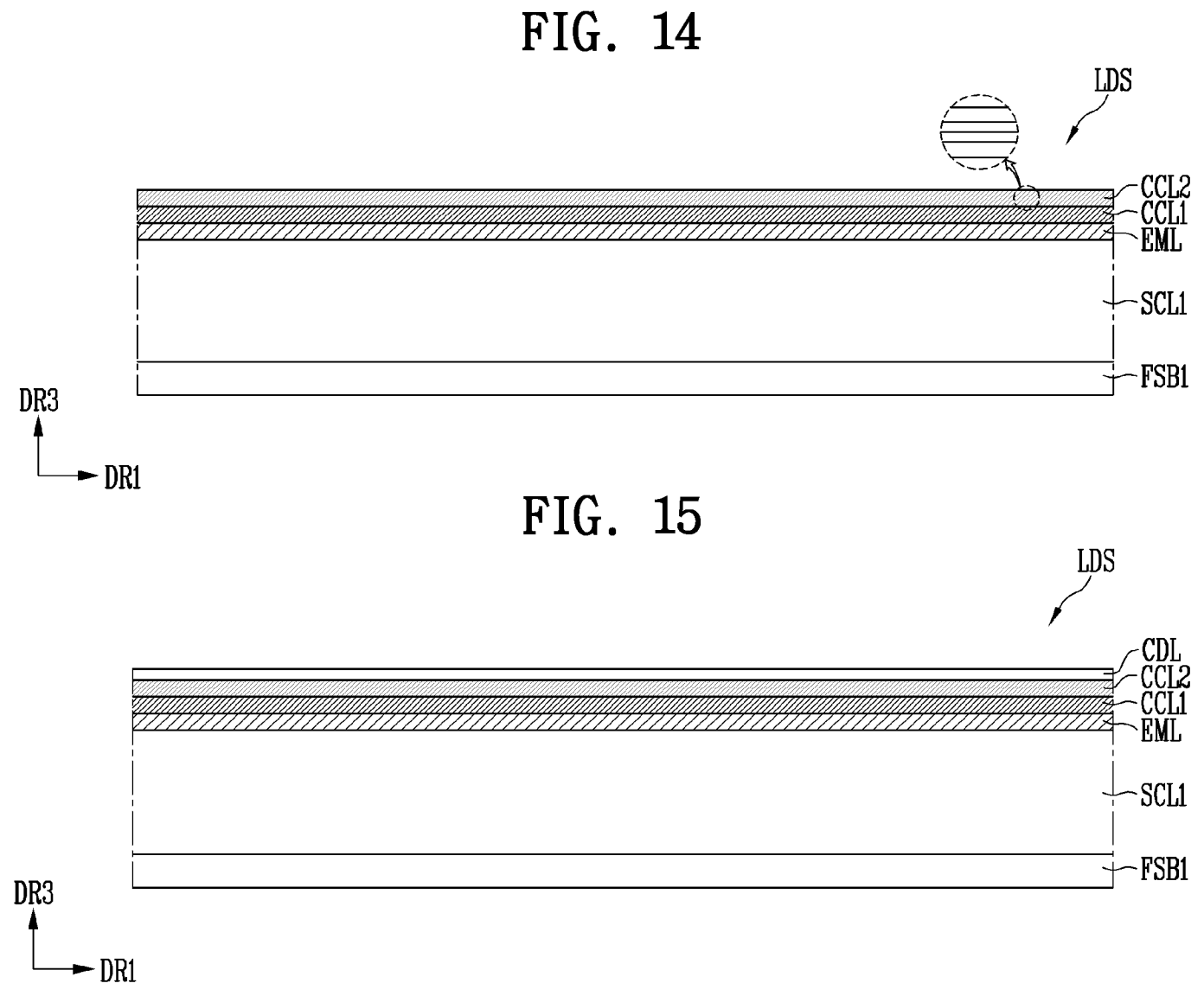

Referring to FIG. 14, a second light conversion layer CCL2 may be formed on the first light conversion layer CCL1. The second light conversion layer CCL2 may be formed by epitaxial growth, so that the light of the first color and/or the light of the second color incident on the second light conversion layer CCL2 is converted into light of a third color. For example, the second light conversion layer CCL2 may be formed to absorb the light of the first color (for example, blue light) belonging to the first wavelength band and/or the light of the second color (for example, green light) belonging to the second wavelength band, and convert the light of the first color and the light of the second color into the light of the third color (for example red light)

belonging to the third wavelength band that is a longer wavelength than the first and second wavelength bands.

In an embodiment, the second light conversion layer CCL2 may include a single-quantum well or a multi-quantum well having a structure similar to or identical to that of the emission layer EML and/or the first light conversion layer CCL1. For example, the second light conversion layer CCL2 may be formed as multiple layers by alternately and/or repeatedly forming a GaN layer and an InGaN layer on the first light conversion layer CCL1. By adjusting the composition ratio of indium (In) contained in the InGaN layer, the second light conversion layer CCL2 may be formed so that the second light conversion layer CCL2 emits the light of the third color. For example, the second light conversion layer CCL2 may absorb the light of the first color and/or the light of the second color incident from the emission layer EML and/or the first light conversion layer CCL1, and convert the light of the first color and/or the light of the second color into the light of the third color.

The second light conversion layer CCL2 may be formed to include a second conductivity type dopant by a doping process. For example, the second light conversion layer CCL2 may include a second conductivity type semiconductor doped with a second conductivity type dopant such as Mg. Accordingly, the second light conversion layer CCL2 may configure the second semiconductor layer SCL2 of the light emitting element LD together with the first light conversion layer CCL1.

By the above process, the first semiconductor layer SCL1, the emission layer EML, the first light conversion layer CCL1, and the second light conversion layer CCL2 are sequentially grown on the first fabrication substrate FSB1 to manufacture a light emitting element substrate LDS.

Referring to FIG. 15, a conductive layer CDL may be selectively applied on the light emitting element substrate LDS. The conductive layer CDL may be used as a bonding layer for bonding the first fabrication substrate FSB1 to the driving substrate (or driving substrate DRS of FIG. 16).

Figure 16:
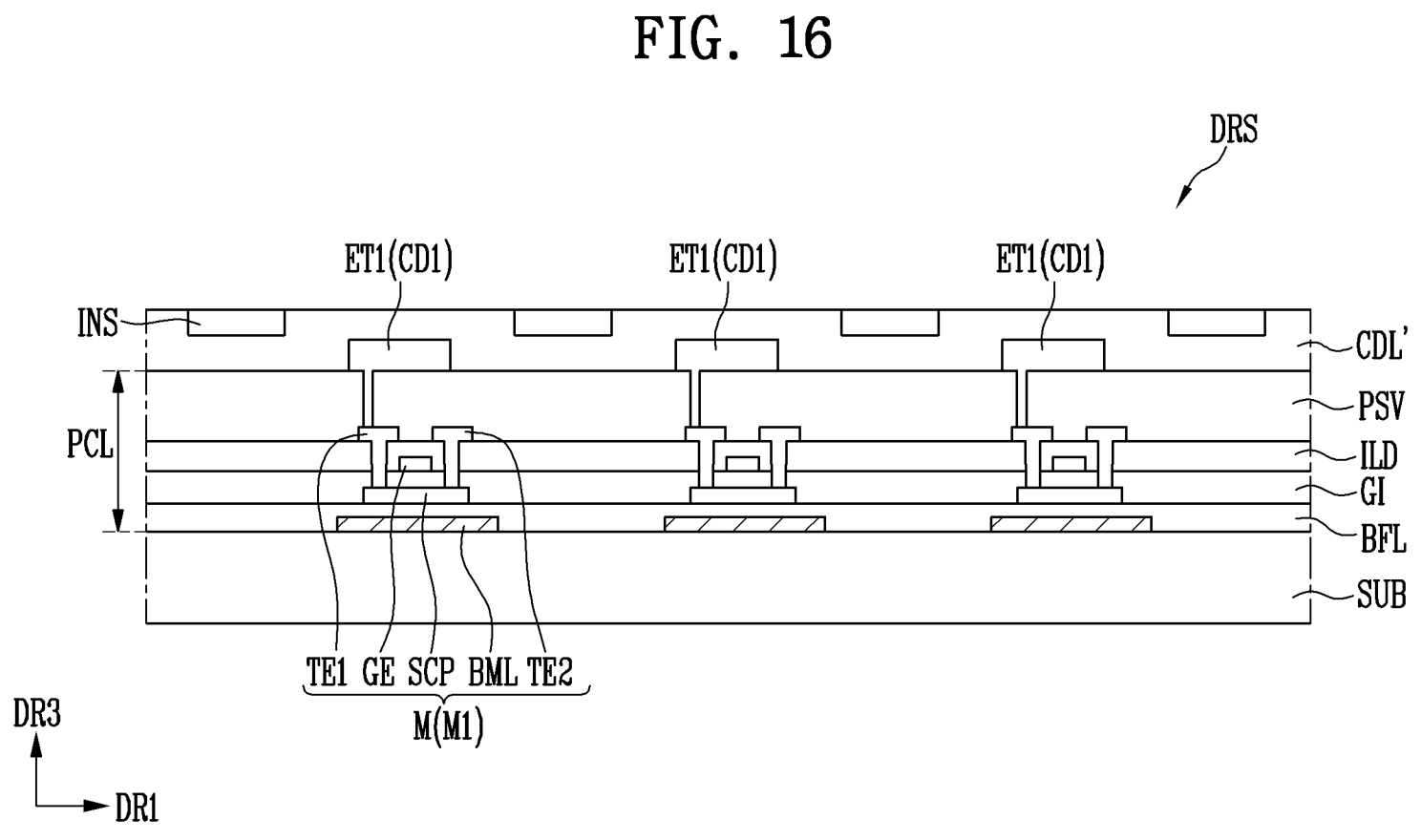

Referring to FIG. 16, the driving substrate DRS including first electrodes ET1 (or first conductive patterns CD1 of the first electrodes ET1) is prepared. For example, the driving substrate DRS may be manufactured by forming a pixel circuit part PCL on a substrate SUB and forming first electrodes ET1 (or first conductive patterns CD1 of the first electrodes ET1), a conductive layer CDL', and/or an insulating layer INS on the pixel circuit part PCL. For example, the driving substrate DRS may be a component including the substrate SUB, the pixel circuit part PCL, the first electrodes ET1 of the pixels PX, the conductive layer CDL', and the insulating layer INS. The conductive layer CDL' may be a component for forming the pad electrodes PE and/or the second conductive patterns CD2 of the first electrodes ET1. The conductive layer CDL' may also be used as a bonding layer for bonding the driving substrate DRS to the first fabrication substrate FSB1.

Figure 17:
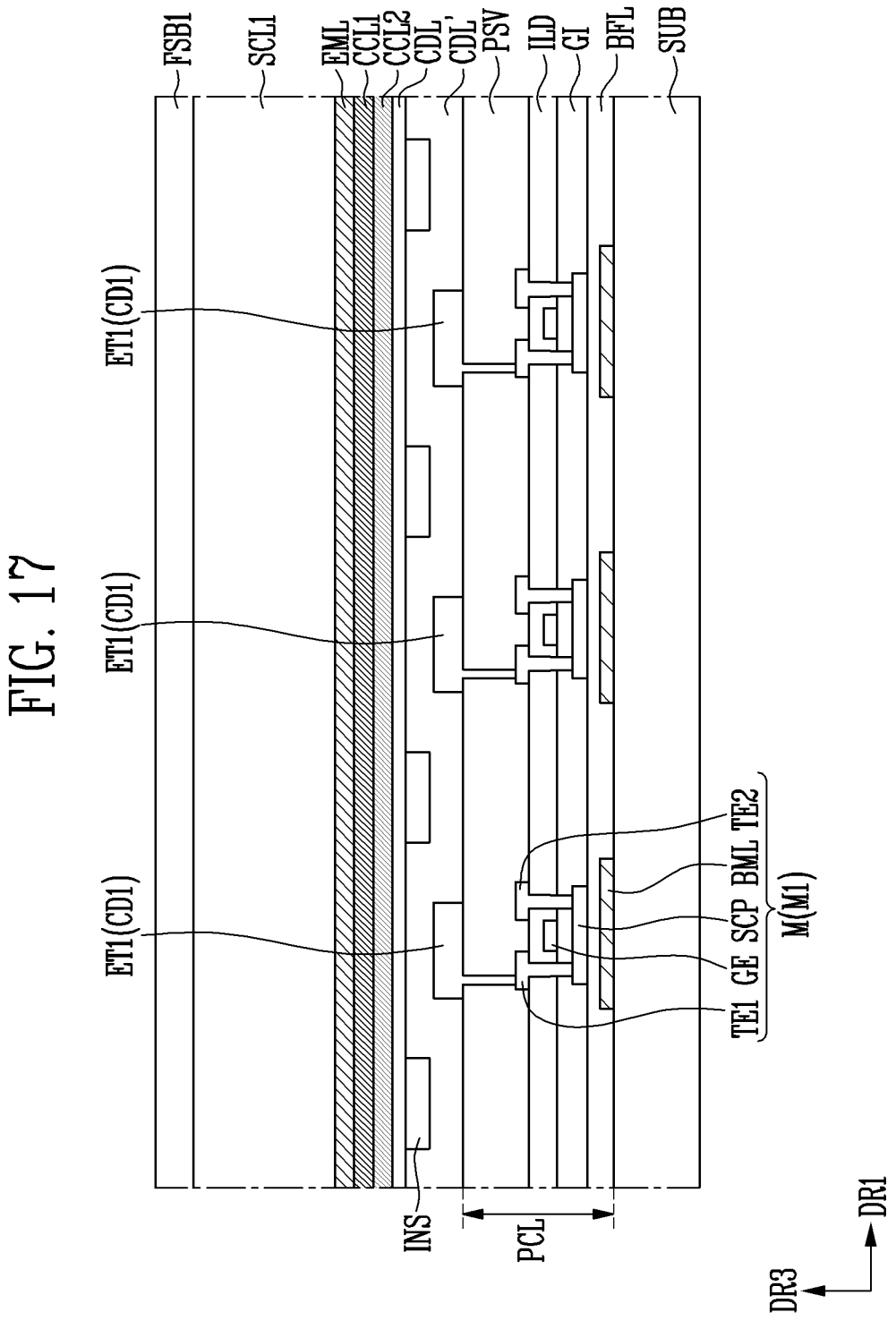

Referring to FIG. 17, the first fabrication substrate FSB1 may be disposed on the driving substrate DRS so that the second light conversion layer CCL2 and/or the conductive layer CDL face the first electrodes ET1. The driving substrate DRS and the light emitting element substrate LDS may be bonded to each other so that the second light conversion layer CCL2 is bonded to the first electrodes ET1. For example, the driving substrate DRS and the light emitting element substrate LDS may be bonded to each other so that the first electrodes ET1 are electrically connected to the second light conversion layer CCL2.

In an embodiment, in case that the driving substrate DRS and the first fabrication substrate FSB1 may be smoothly bonded to each other with only the conductive layer CDL' applied on the driving substrate DRS, the process of applying the conductive layer CDL on the first fabrication substrate FSB1 may be omitted.

Figure 18:
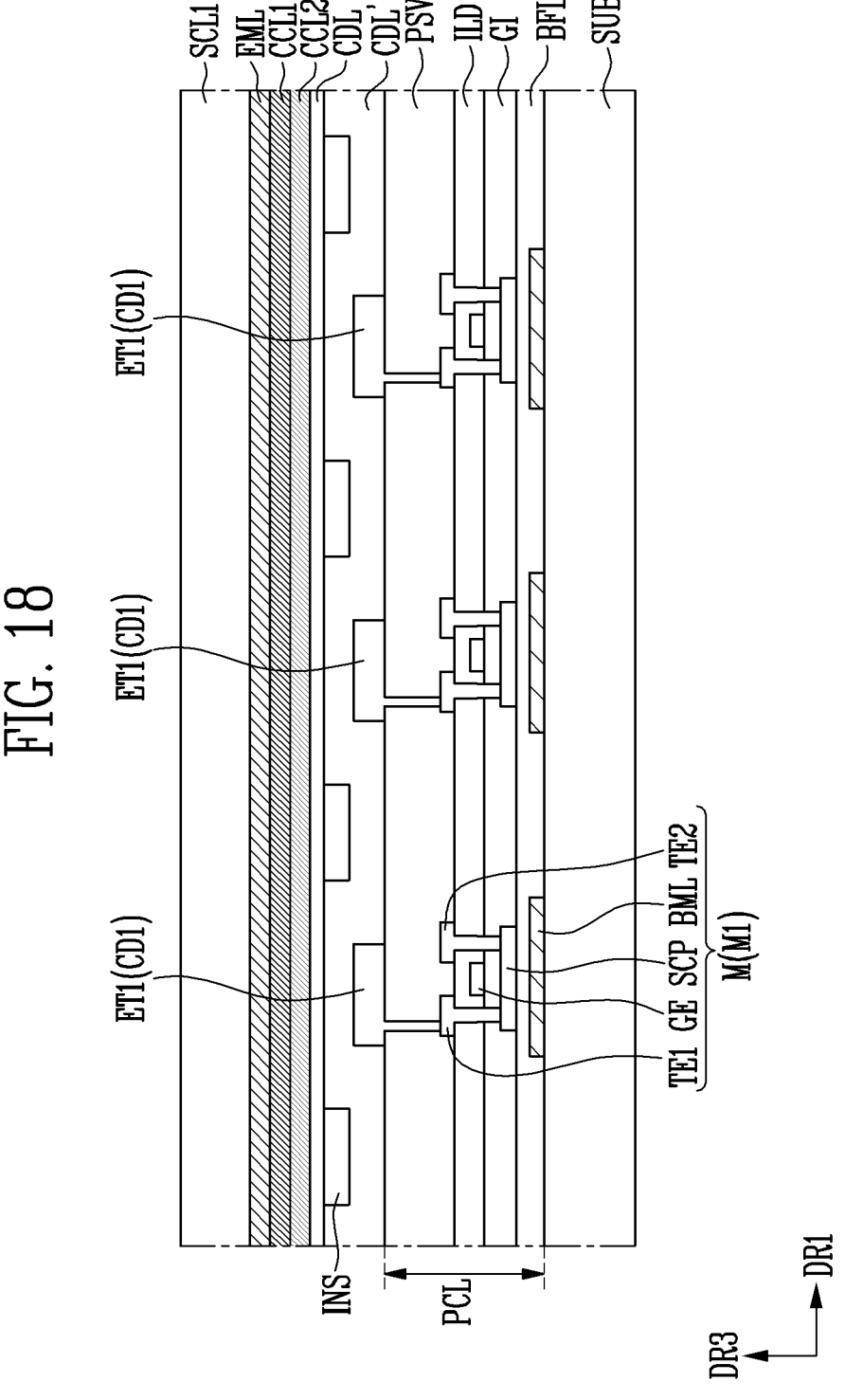

Referring to FIG. 18, the first fabrication substrate FSB1 may be removed. For example, the first fabrication substrate FSB1 may be separated from the first semiconductor layer SCL1, the emission layer EML, the first light conversion layer CCL1, and the second light conversion layer CCL2 through laser lift, electrical and/or chemical etching, or the like, and the first semiconductor layer SCL1, the emission layer EML, the first light conversion layer CCL1, and the second light conversion layer CCL2 may remain on the driving substrate DRS. In an embodiment, the first semiconductor layer SCL1 may be etched by at least a predetermined thickness.

Figure 19:
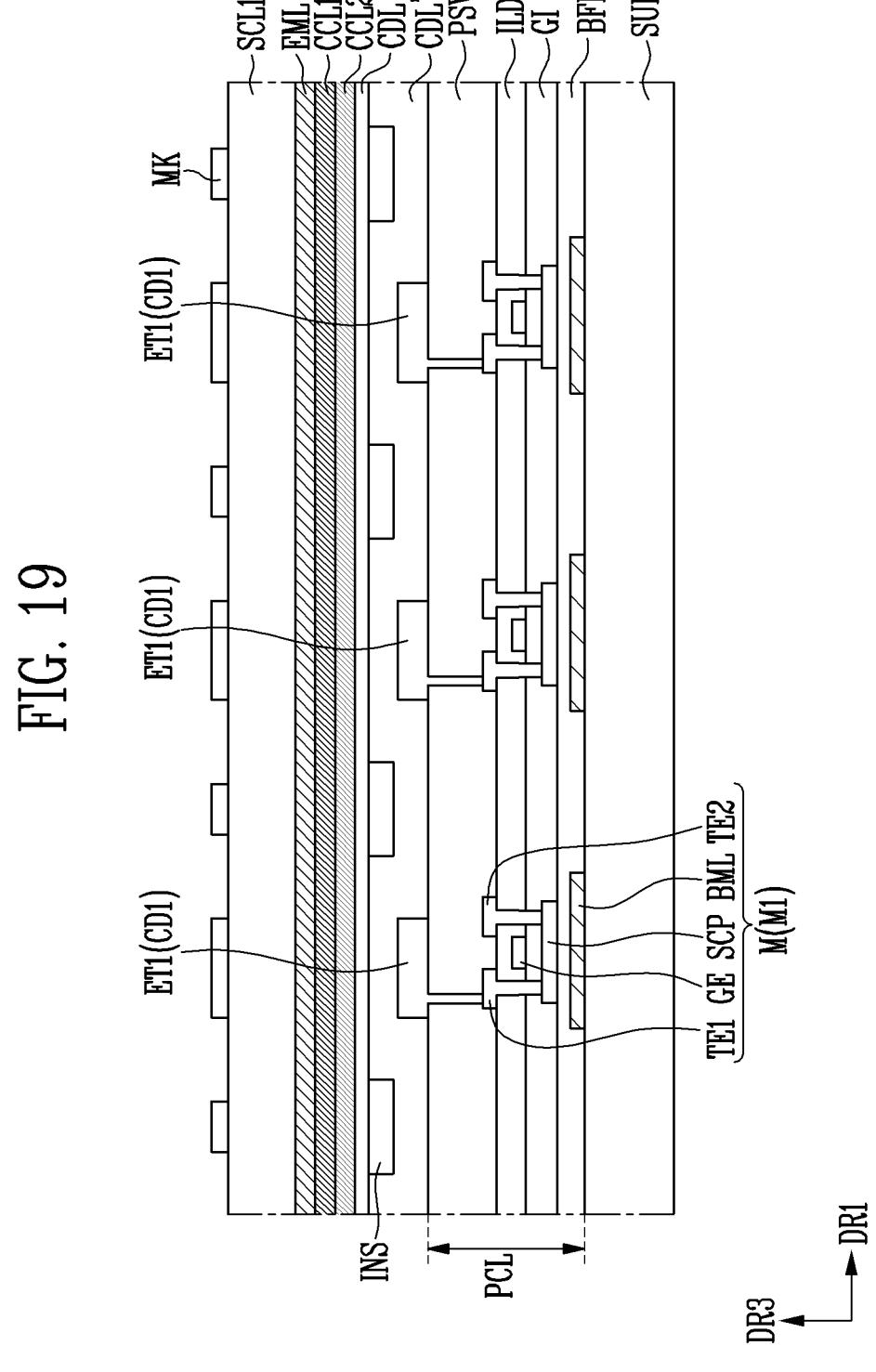

Referring to FIG. 19, a mask MK may be formed and/or disposed on the first semiconductor layer SCL1. The mask MK is used to etch the first semiconductor layer SCL1, the emission layer EML, the first light conversion layer CCL1, and the second light conversion layer CCL2 to separate the light emitting elements LD from the partition wall PW. The mask MK may have openings corresponding to the shape, size (for example, width and/or area), and/or arrangement intervals of the light emitting elements LD and/or the partition wall PW to be formed. In an embodiment, the mask MK may be a hard mask formed of $SiO_2$ or undefined silicon oxide ($SiO_x$), but the disclosure is not limited thereto.

Figure 20:
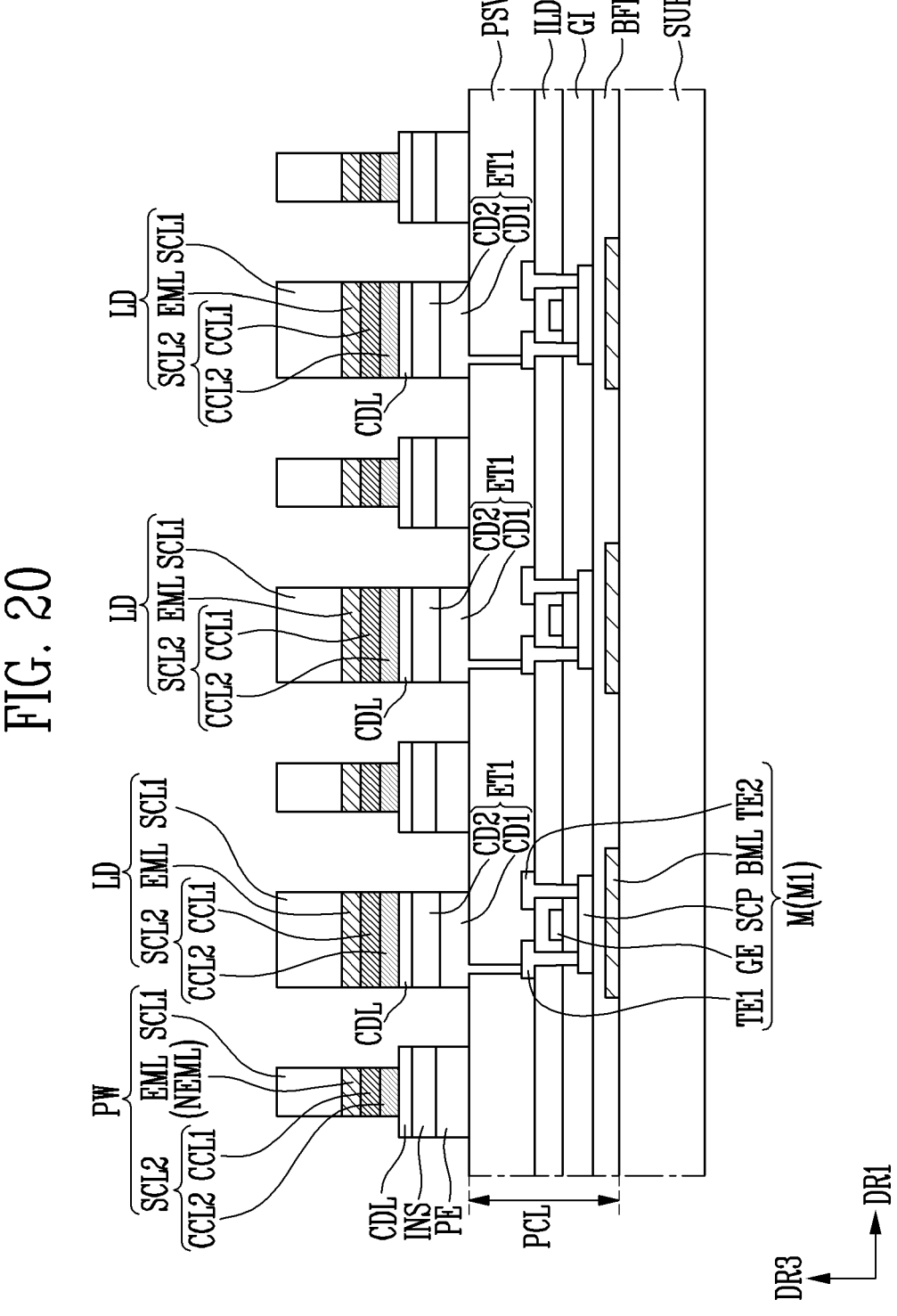

Referring to FIG. 20, the light emitting elements LD and the partition wall PW may be formed by etching the first semiconductor layer SCL1, the emission layer EML, the first light conversion layer CCL1, and the second light conversion layer CCL2 by using the mask MK. For example, the light emitting element LD may be formed on each first electrode ET1 by selective etching using the mask MK. The partition wall PW surrounding the light emitting elements LD may be formed simultaneously in the step of etching the first semiconductor layer SCL1, the emission layer EML, the first light conversion layer CCL1, and the second light conversion layer CCL2 so as to form the light emitting elements LD. For example, the light emitting elements LD and the partition wall PW may be formed simultaneously by an etching process using the mask MK.

By etching the conductive layers CDL and CDL' using a mask identical to or different from the mask MK used to etch the first semiconductor layer SCL1, the emission layer EML, the first light conversion layer CCL1, and the second light conversion layer CCL2, the pad electrodes PE and the second conductive patterns CD2 of the first electrodes ET1 are formed, and the first electrodes ET1 and the conductive layer CDL on the insulating layer INS may be separated into individual patterns.

In an embodiment, the pad electrodes PE and the insulating layer INS may be formed to have a different width and/or area from the partition wall PW. In an embodiment, the pad electrodes PE and the insulating layer INS, and the partition wall PW may be formed to have substantially the same width and/or area. For example, the relative sizes and/or positions of the pad electrodes PE, the insulating layer INS, and/or the partition wall PW are not particularly limited, and may vary according to embodiments.

After the etching process using the mask MK is completed, the mask MK may be removed.

Figure 21:
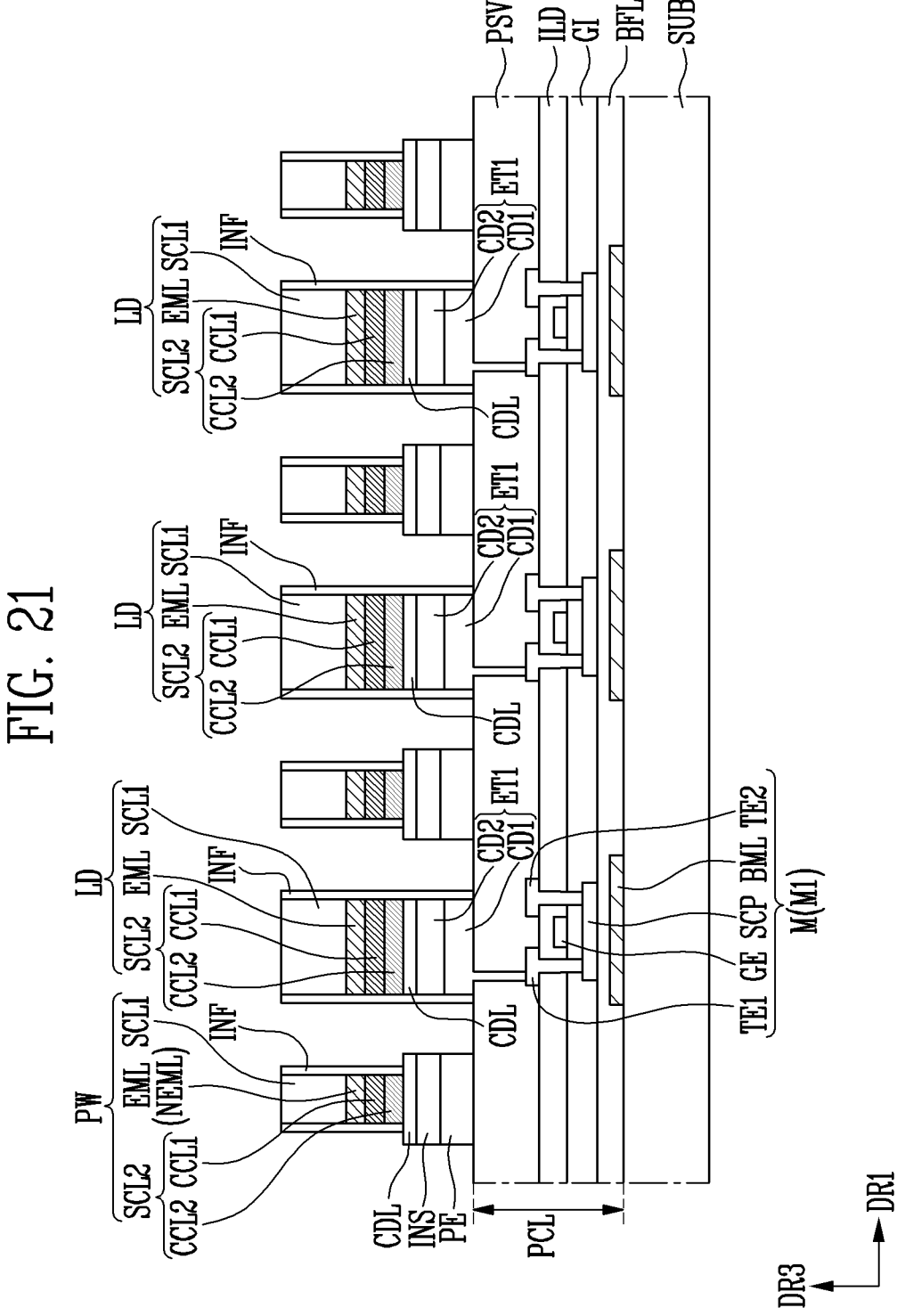

Referring to FIG. 21, the insulating films INF may be formed on the surfaces of the light emitting elements LD and the partition wall PW. For example, the insulating film INF may be formed on the surfaces of the light emitting elements LD so as to cover side surfaces of the first semiconductor layers SCL1, the emission layers EML, the first light conversion layers CCL1, and the second light conversion layers CCL2 of the light emitting elements LD. The insulating film INF may be formed on the surface of the partition wall PW so as to surround side surfaces of the first semiconductor layer SCL1, the emission layer EML, the first light conversion layer CCL1, and the second light conversion layer CCL2 of the partition wall PW.

As an example, after the insulating film INF is formed by applying a transparent insulating material, such as silicon oxide ($SiO_x$) or aluminum oxide ($Al_xO_y$), on the substrate SUB on which the light emitting elements LD and the partition wall PW are formed, the insulating layer INF or film may be etched on the upper portions of the light emitting elements LD and between the light emitting elements LD and the partition wall PW. Accordingly, the insulating film INF covering the side surfaces of the light emitting elements LD while exposing the upper surfaces of the light emitting elements LD (for example, a surface of the first semiconductor layer SCL1) may be formed.

In an embodiment, the insulating film INF may be formed to have a reduced thickness within about 0.1 micrometer. Accordingly, the insulating film INF having a reduced thickness is formed on the surfaces of the light emitting elements LD, thereby minimizing optical loss. However, the material and/or the thickness of the insulating film INF may be variously changed according to embodiments.

In a subsequent process, the second electrode ET2 may be formed on the upper surfaces of the light emitting elements LD on which the insulating film INF is not formed. Accordingly, the light emitting elements LD may contact and/or be electrically connected to the second electrode ET2.

The insulating film INF may be selectively etched on the partition wall PW. In case that the insulating film INF is etched on the partition wall PW, the upper surface of the partition wall PW may be exposed, and only the side surface of the partition wall PW may be surrounded by the insulating film INF. In case that the insulating film INF is not etched above or on the partition wall PW, the insulating film INF may entirely surround the surface including the upper surface and the side surface of the partition wall PW. Accordingly, the partition wall PW may be completely electrically isolated by the insulating layer INS and the insulating film INF.

Figure 22:
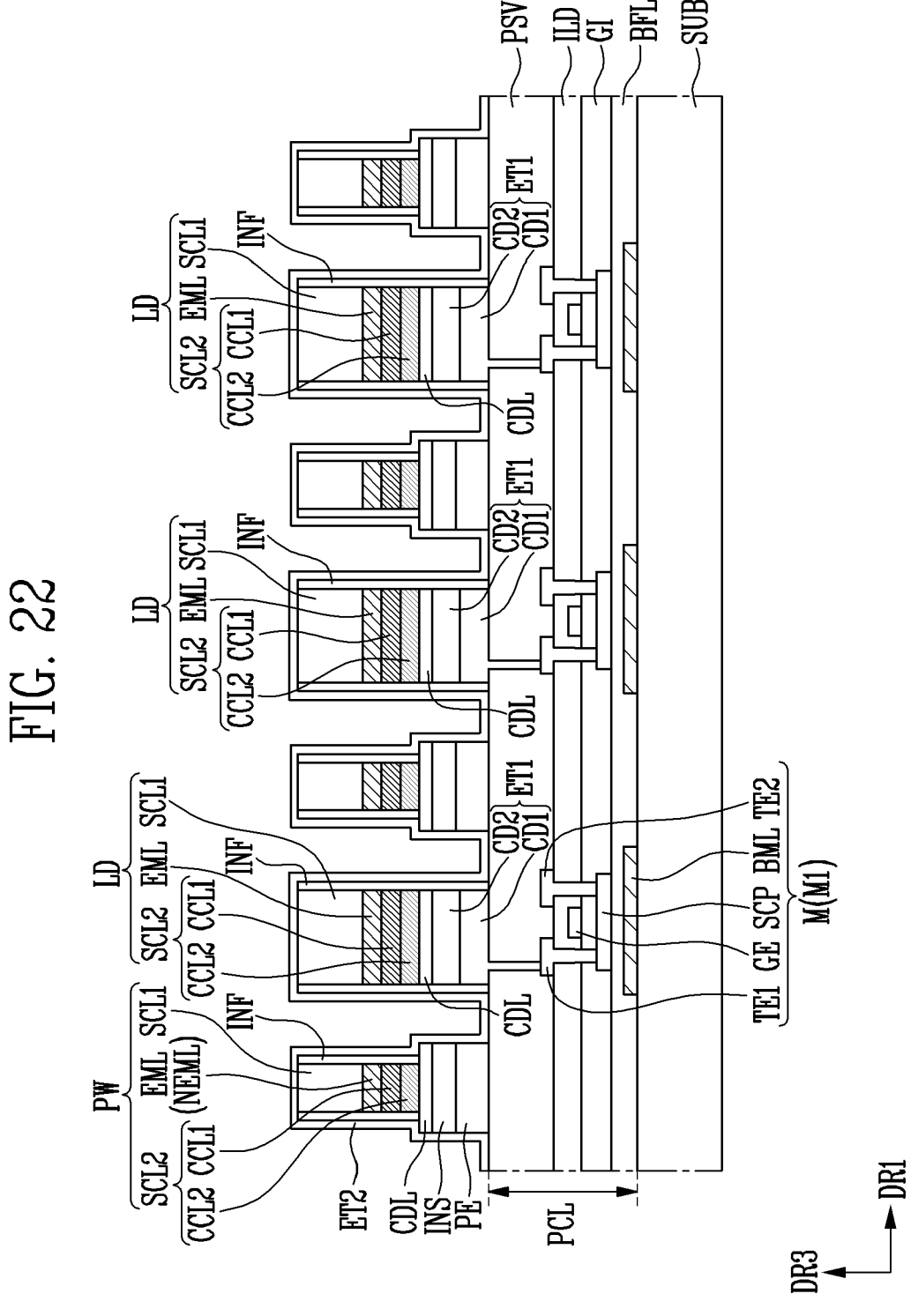

Referring to FIG. 22, a second electrode ET2 may be formed on the light emitting elements LD. In an embodiment, the second electrode ET2 may be formed on the light emitting elements LD and the partition wall PW, and may be entirely formed in the display area DA. The second electrode ET2 may be electrically connected to the pad electrodes PE and the first semiconductor layers SCL1 of the light emitting elements LD. However, the shape, size, and/or number of second electrodes ET2 provided in the display area DA may be changed according to embodiments.

In an embodiment, the second electrode ET2 may be formed to a small thickness within about 0.1 micrometers by using a transparent conductive material such as ITO, IZO, or ITZO. Accordingly, light emission efficiency of the pixels PX may be secured. However, the material and/or thickness of the second electrode ET2 may be variously changed according to embodiments.

Figure 23:
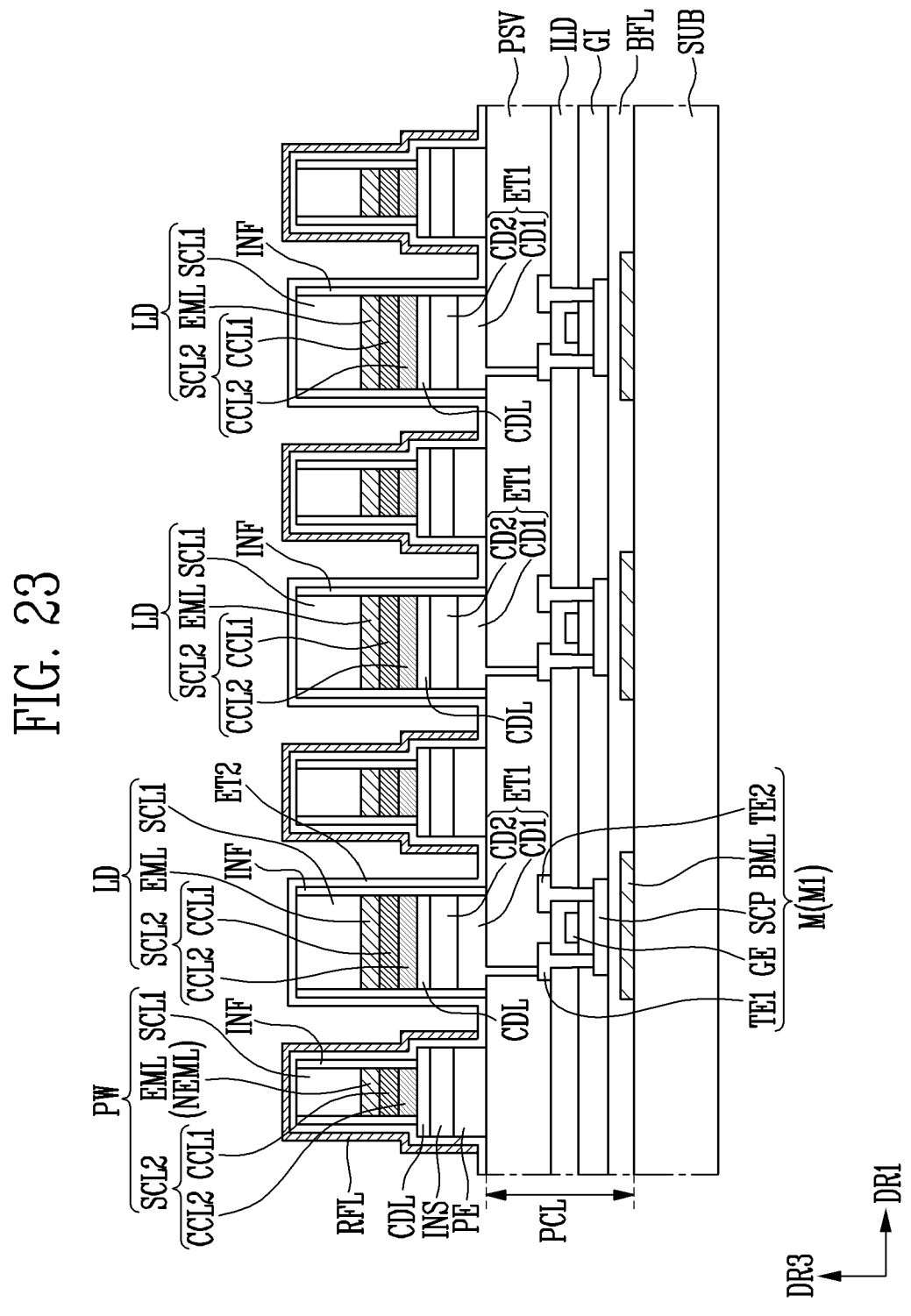

Referring to FIG. 23, a reflective film RFL may be formed on the partition wall PW. For example, after a conductive film is formed by applying a reflective conductive material such as aluminum (Al) on the substrate SUB on which the light emitting elements LD, the partition wall PW, and the second electrode ET2 are formed, the conductive film may be etched on the light emitting elements LD and/or in a region around the light emitting elements LD. Accordingly, the reflective film RFL may be formed on the partition wall PW to surround each emission area EMA.

Thereafter, the color filters CF, the black matrix BM, and/or the filler FIL illustrated in FIGS. 6 to 10 may be formed. For example, the filler FIL may be selectively formed in a space between the light emitting elements LD and the partition wall PW.

Each color filter CF may be formed and/or disposed on the second electrode ET2 so as to be positioned in each emission area EMA in which each light emitting element LD is located. For example, a first color filter CF1 may be formed and/or disposed on the light emitting element LD in the first emission area EMA1, and a second color filter CF2 may be formed and/or disposed on the light emitting element LD in the second emission area EMA2. A third color filter CF3 may be formed and/or disposed on the light emitting element LD in the third emission area EMA3.

Additionally, the black matrix BM may be selectively formed in the non-emission area NEA so as to be positioned above the partition wall PW.

The order of formation of the filler FIL, the color filters CF, and/or the black matrix BM is not particularly limited, and this may be variously changed according to embodiments.

FIGS. 24 to 31 are schematic cross-sectional views illustrating a method of manufacturing a display device DD according to an embodiment. For example, FIGS. 24 to 31 sequentially illustrate a method of manufacturing the display device DD of FIG. 10. In describing the embodiments of FIGS. 24 to 31, the components similar to or identical to those of the embodiments of FIGS. 11 to 23 are denoted by the same reference numerals, and detailed descriptions thereof will be omitted.

Figures 24, 25:
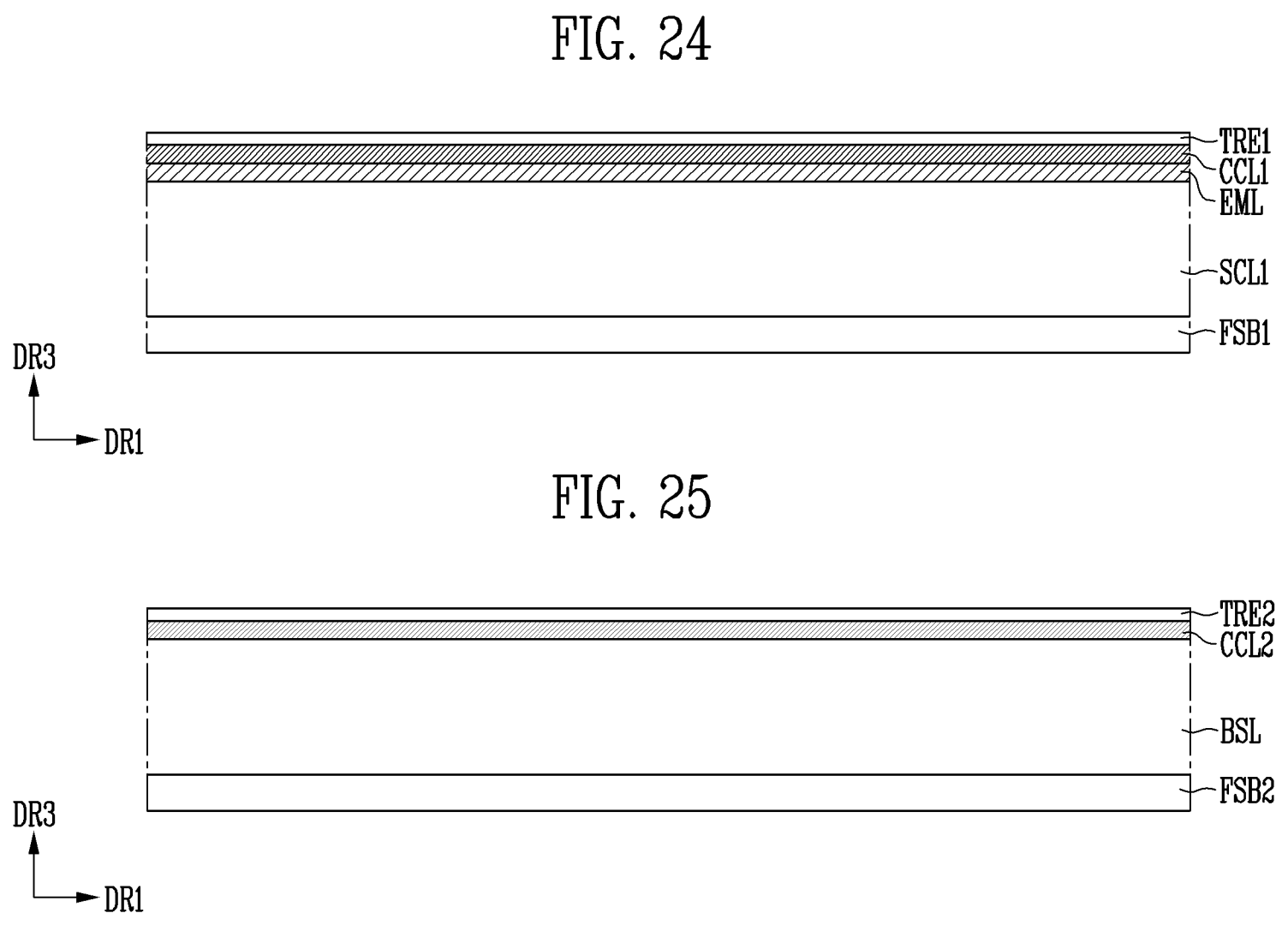

Referring to FIG. 24, the first semiconductor layer SCL1, the emission layer EML, and the first light conversion layer CCL1 may be sequentially formed on the first fabrication substrate FSB1. In an embodiment, the method of forming the first semiconductor layer SCL1, the emission layer EML, and the first light conversion layer CCL1 may be substantially identical or similar to those of the embodiments of FIGS. 11 to 13.

In an embodiment, a bonding material may be selectively applied on the first light conversion layer CCL1. For example, a first bonding material TRE1 may be applied on the first light conversion layer CCL1.

Referring to FIG. 25, at least one buffer layer BSL (or sacrificial layer) may be formed on the second fabrication substrate FSB2, and the second light conversion layer CCL2 may be formed on the buffer layer BSL.

The second fabrication substrate FSB2 may be a fabrication substrate for epitaxial growth. The second fabrication substrate FSB2 may be a commercially available single crystal substrate, but the disclosure is not limited thereto. In an embodiment, the second fabrication substrate FSB2 may be a GaAs, GaP, InP, or Si substrate. The second fabrication substrate FSB2 may include a ZnO substrate having a GaAs layer on the surface thereof. A Ge substrate having a GaAs layer on a surface thereof, a Si substrate having a GaAs layer on a Si wafer with a buffer layer therebetween, and the like may be used as the second fabrication substrate FSB2.

The second fabrication substrate FSB2 may be a substrate of various types and/or materials. For example, in case that epitaxial growth for forming the second light conversion layer CCL2 is smoothly performed, the material of the second light conversion layer CCL2 is not particularly limited. The first fabrication substrate FSB1 and the second fabrication substrate FSB2 may be substrates of the same type or material, or may be substrates of different types or materials.

In an embodiment, the buffer layer BSL may include a GaAs layer, but the disclosure is not limited thereto. In case that epitaxial growth for forming the second light conversion layer CCL2 is smoothly performed, the materials of the second fabrication substrate FSB2 and the buffer layer BSL are not particularly limited.

The second light conversion layer CCL2 may be formed by epitaxial growth, so that the light of the first color and/or the light of the second color incident on the second light conversion layer CCL2 is converted into the light of the third color. For example, the second light conversion layer CCL2 may be formed to absorb blue light and/or green light and convert the blue light and/or the green light into red light.

In an embodiment, the second light conversion layer CCL2 may be formed as multiple layers including a single-quantum well or a multi-quantum well, and may be formed of a semiconductor material different from that of the emission layer EML and/or the first light conversion layer CCL1. For example, the second light conversion layer CCL2 may be grown on the second fabrication substrate FSB2 by using a phosphide-based and/or arsenic-based compound having high light conversion efficiency for red light, including AlGaInP or AlGaInPAs.

The second light conversion layer CCL2 may be formed to include a first conductivity type dopant or a second conductivity type dopant by a doping process. For example, the second light conversion layer CCL2 may be doped to include a first conductivity type dopant such as Si, Ge, and Sn, or a second conductivity type dopant such as Mg. Accordingly, the second light conversion layer CCL2 may form the electrode layer ETL (or semiconductor layer) of the light emitting element LD.

In an embodiment, a bonding material may be applied on an upper portion of at least one of the first light conversion layer CCL1 and the second light conversion layer CCL2. For example, a first bonding material TRE1 may be applied on the first light conversion layer CCL1, and a second bonding material TRE2 may be applied on the second light conversion layer CCL2. In an embodiment, the first bonding material TRE1 and the second bonding material TRE2 may include transparent conductive materials that are identical to or different from each other.

Figure 26:
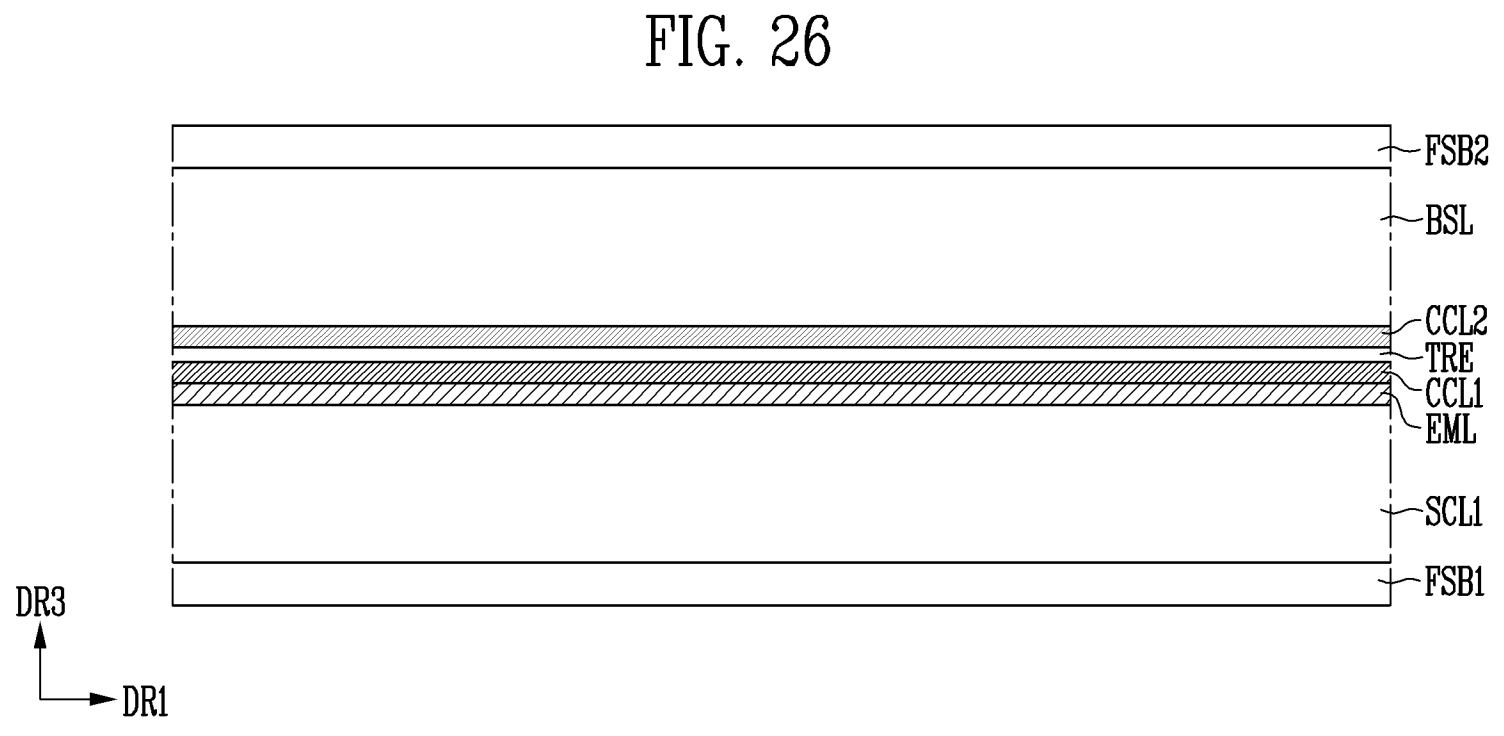

Referring to FIG. 26, the second fabrication substrate FSB2 may be disposed on the first fabrication substrate FSB1 so that the first light conversion layer CCL1 and the second light conversion layer CCL2 face each other. The first fabrication substrate FSB1 and the second fabrication substrate FSB2 may be bonded to each other by bonding the second light conversion layer CCL2 to the first light conversion layer CCL1 by using the first and/or second bonding materials TRE1 and TRE2. The first and/or second bonding materials TRE1 and TRE2 may be formed as the transparent electrode TRE by the process of bonding the first fabrication substrate FSB1 to the second fabrication substrate FSB2.

Figures 27, 28:
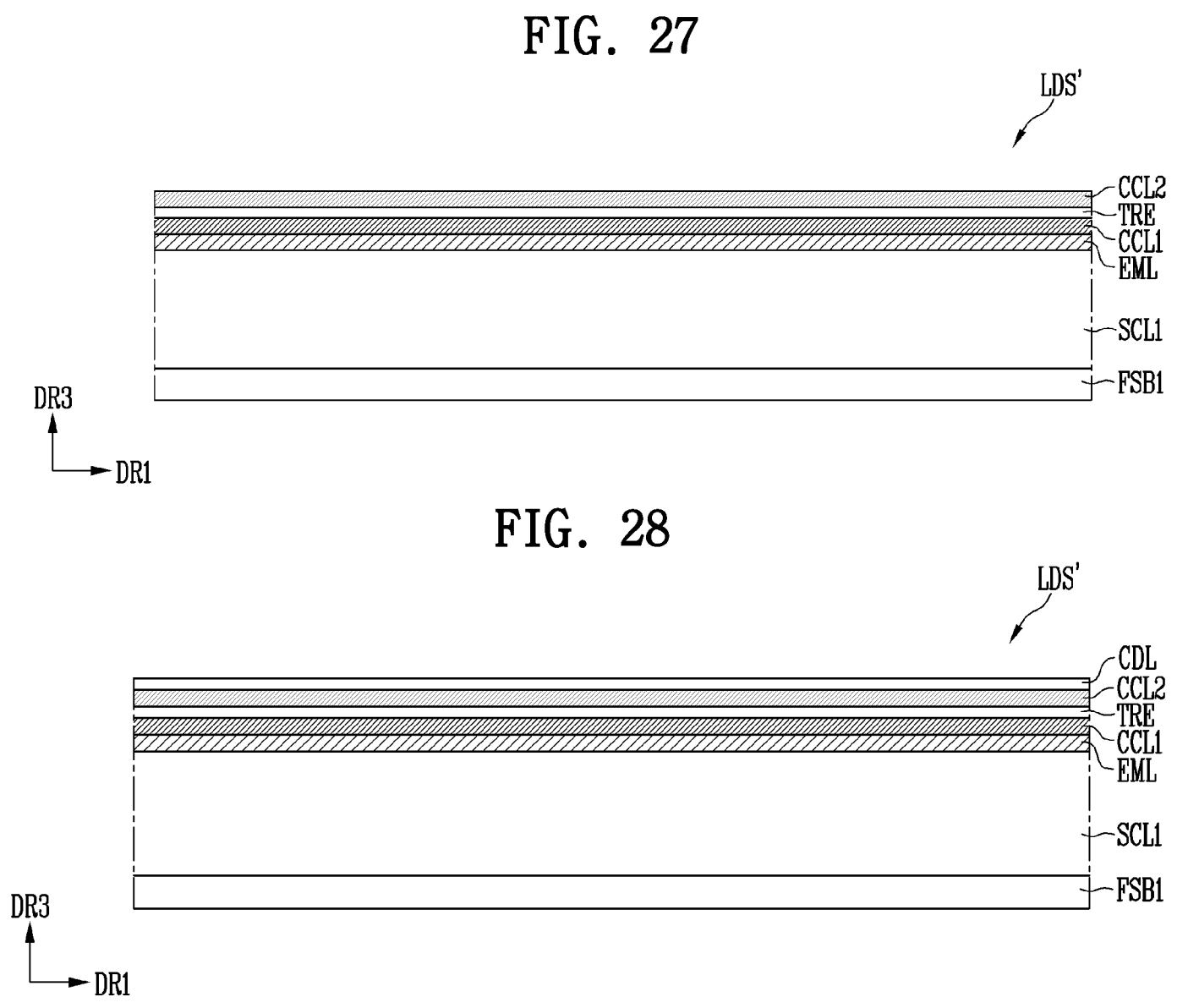

Referring to FIG. 27, the second fabrication substrate FSB2 and the buffer layer BSL may be removed from the first fabrication substrate FSB1. For example, the second fabrication substrate FSB2 and the buffer layer BSL may be separated from the second light conversion layer CCL2, and the second light conversion layer CCL2 may remain on the first fabrication substrate FSB1.

Accordingly, a light emitting element substrate LDS' on which the first semiconductor layer SCL1, the emission layer EML, the first light conversion layer CCL1, the transparent electrode TRE, and the second light conversion layer CCL2 are sequentially stacked may be manufactured on the first fabrication substrate FSB1.

Referring to FIG. 28, a conductive layer CDL may be selectively applied on the light emitting element substrate LDS'. The conductive layer CDL may be used as a bonding layer for bonding the first fabrication substrate FSB1 to the driving substrate (or driving substrate of FIG. 29).

Figure 29:
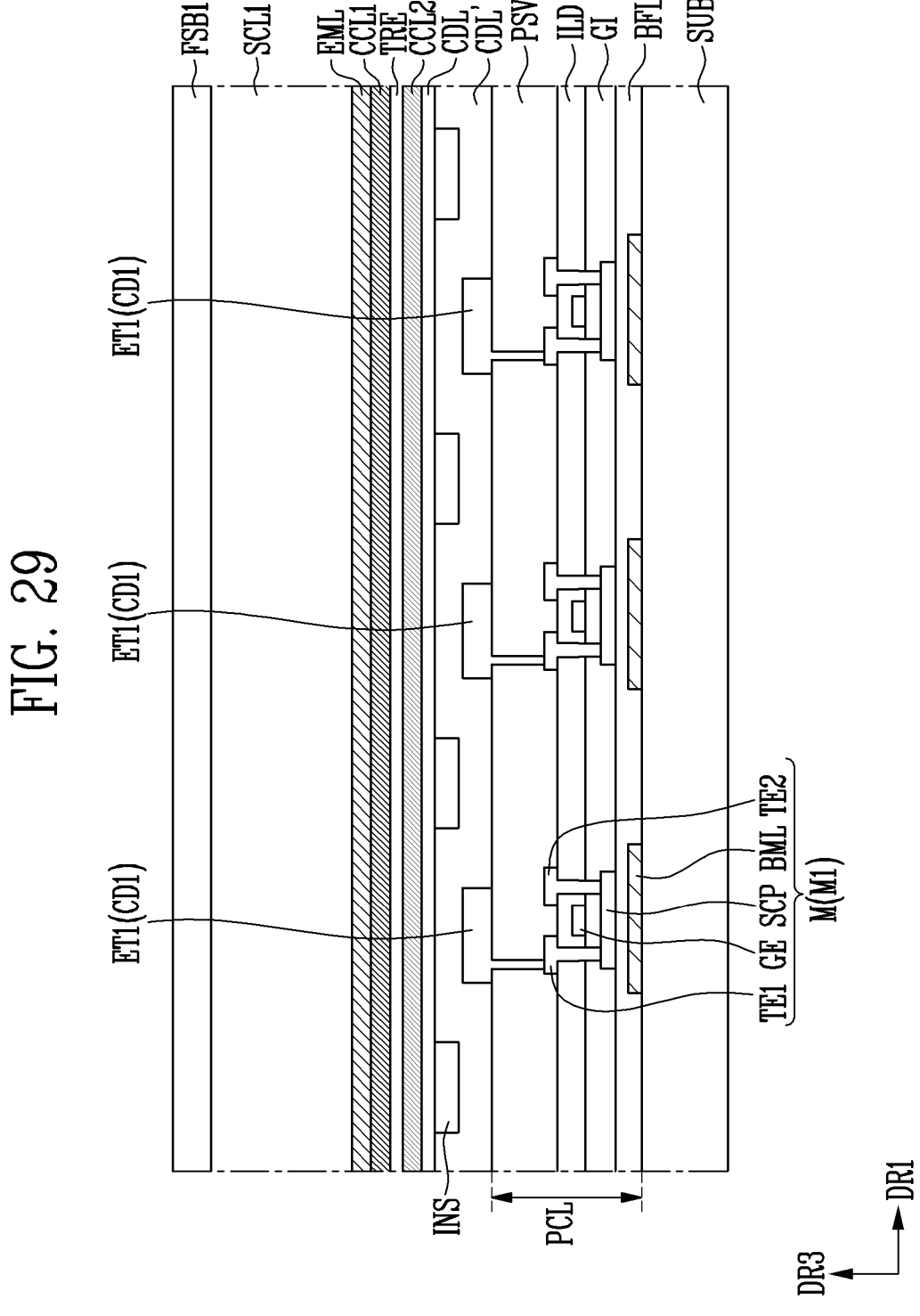

Referring to FIG. 29, as in the embodiment of FIG. 16, the driving substrate (or driving substrate DRS of FIG. 16) on which the first electrodes ET1 (or the first conductive patterns CD1 of the first electrodes ET1), the conductive layer CDL', and/or the insulating layer INS are formed may be prepared, and the first fabrication substrate FSB1 may be disposed on the driving substrate so that the second light conversion layer CCL2 and/or the conductive layer CDL face the first electrodes ET1. The driving substrate and the light emitting element substrate LDS' may be bonded to each other so that the second light conversion layer CCL2 and/or the conductive layer CDL are bonded to the first electrodes ET1. The method of bonding the light emitting element substrate LDS' to the driving substrate may be substantially identical or similar to that of the embodiment described above with reference to FIG. 17.

Figure 30:
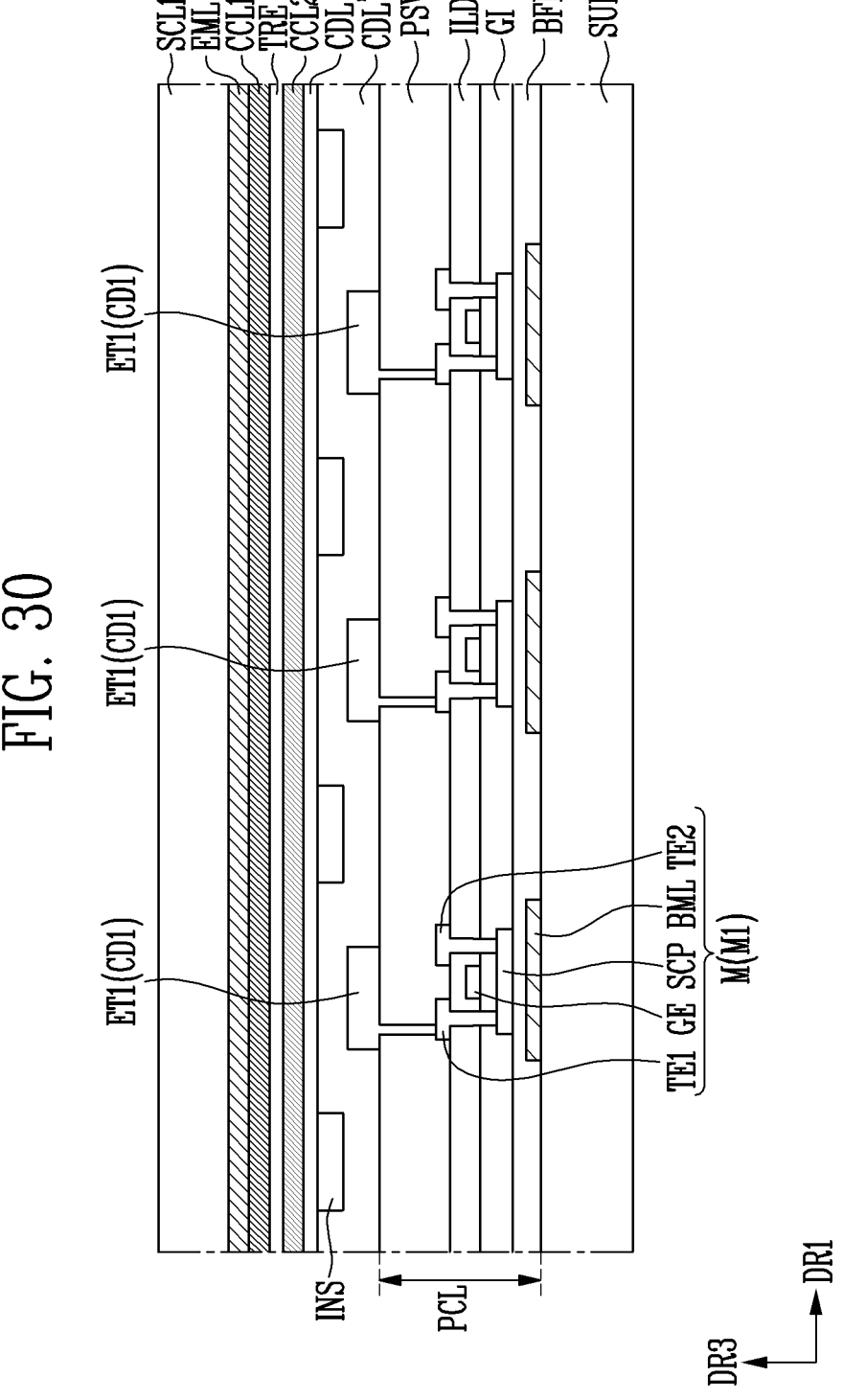

Referring to FIG. 30, the first fabrication substrate FSB1 may be removed. The first semiconductor layer SCL1 may be selectively etched by at least a predetermined thickness. The method of removing the first fabrication substrate FSB1 may be substantially identical or similar to that of the embodiment described above with reference to FIG. 18.

Figure 31:
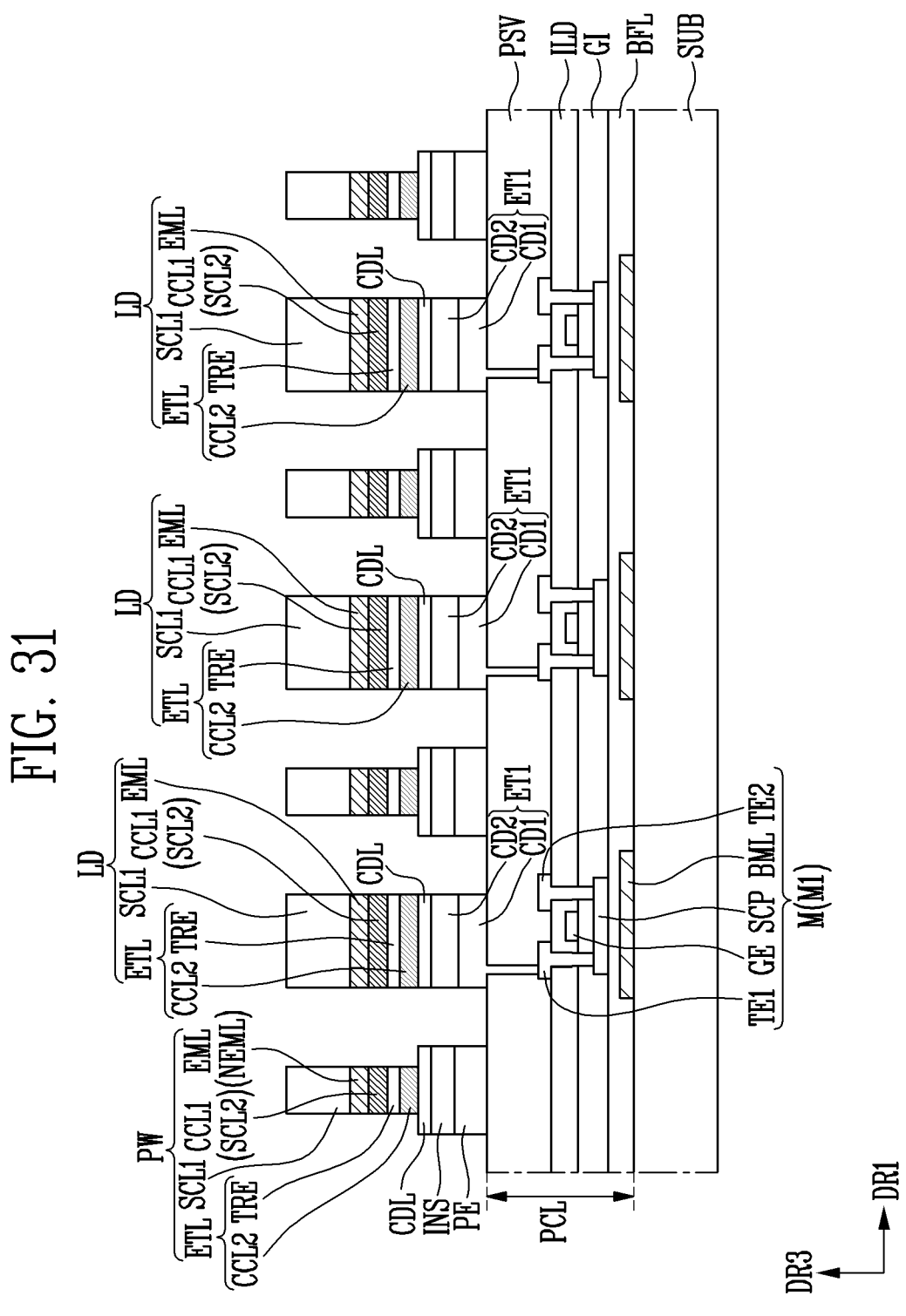

Referring to FIG. 31, the light emitting elements LD and the partition wall PW may be formed by etching the first semiconductor layer SCL1, the emission layer EML, the first light conversion layer CCL1, the transparent electrode TRE, and the second light conversion layer CCL2. The method of etching the first semiconductor layer SCL1, the emission layer EML, the first light conversion layer CCL1, the transparent electrode TRE, and the second light conversion layer CCL2 may be substantially identical or similar to those of the embodiments described above with reference to FIGS. 19 and 20.

Thereafter, the insulating films INF, the second electrode ET2, the reflective film RFL, the color filters CF, the black matrix BM, and/or the filler FIL illustrated in FIGS. 6 to 10 may formed. The method of forming the insulating films INF, the second electrode ET2, the reflective film RFL, the color filters CF, the black matrix BM, and/or the filler FIL may be substantially identical or similar to those of the embodiments described above with reference to FIGS. 21 to 23.

According to the embodiments described above, the light emitting element LD, including the emission layer EML for generating light of a first color, the first light conversion layer CCL1 for converting the light of the first color into light of a second color, and the second light conversion layer CCL2 for converting the light of the first color and/or the light of the second color into light of a third color, may be formed, and the light emitting element LD may be disposed in the pixel PX, and thus a light source for the pixel PX may be formed. Accordingly, the pixel PX may include the light emitting element LD that emits white light. For example, a part of the light of the first color generated in the emission layer EML of the light emitting element LD may be emitted to the outside of the light emitting element LD, and another part of the light of the first color may be incident on the first light conversion layer CCL1 and/or the second light conversion layer CCL2, may be converted into the light of the second color and/or the light of the third color, and may be emitted to the outside of the light emitting element LD. In an embodiment, the light of the second color and/or the light of the third color may pass through the emission layer EML and/or the first light conversion layer CCL1 and may be emitted to the outside of the light emitting element LD. Accordingly, the light of the first color, the light of the second color, and the light of the third color may be respectively emitted from the emission layer EML, the first light conversion layer CCL1, and the second light conversion layer CCL2, so that the light emitting element LD may emit white light.

According to the above-described embodiment, the color of the light emitted from the pixel PX may be easily controlled by disposing the color filter CF on the light emitting element LD (or the pixel PX), without forming a separate wavelength conversion layer (for example, a wavelength conversion layer including quantum dots corresponding to a specific color or wavelength band) on the light emitting element LD of each pixel PX. Accordingly, the structure and manufacturing process of the pixel PX including the light emitting element LD may be simplified, and the degree of integration of the light emitting elements LD and/or the pixels PX may be increased. It is also possible to reduce the thickness of the display device DD including the pixel PX and improve manufacturing efficiency.

In an embodiment, at least one of the first light conversion layer CCL1 and the second light conversion layer CCL2 of the light emitting element LD, and the emission layer EML of the light emitting element LD may be formed on the same fabrication substrate. For example, at least one of the first light conversion layer CCL1 and the second light conversion layer CCL2 may be grown on the first fabrication substrate FSB1 on which the emission layer EML is formed, based on the same material as the emission layer EML (for example, a nitride-based compound including GaN).

The first light conversion layer CCL1 may include a second conductivity type dopant to configure the second semiconductor layer SCL2 of the light emitting element LD. The second light conversion layer CCL2 may include a first conductivity type dopant or a second conductivity type dopant to configure the electrode layer ETL or the second semiconductor layer SCL2 of the light emitting element LD. For example, the second semiconductor layer SCL2 of the light emitting element LD may be integral with the first light conversion layer CCL1 and/or the second light conversion layer CCL2. Accordingly, the structure and manufacturing process of the light emitting element LD may be simplified.

According to embodiments, the partition wall PW surrounding the emission area EMA of each of the pixels PX may be formed simultaneously with the light emitting elements LD of the pixels PX. Accordingly, the structure of and the manufacturing process for the display device DD may be further simplified, and the manufacturing efficiency may be increased.

FIGS. 32 to 35 are schematic perspective views illustrating a display device according to embodiments. For example, FIGS. 32 to 35 illustrate different embodiments of an electronic device to which the display device DD according to the above-described embodiments is applicable.

Figure 32:
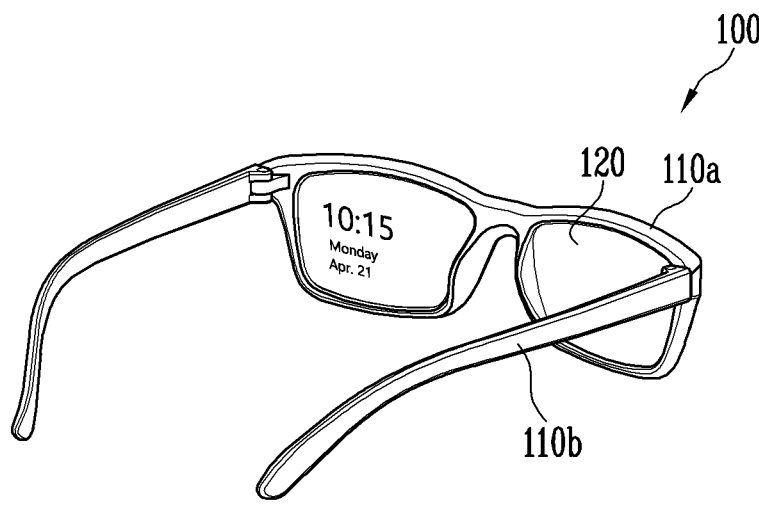
FIGS. 32 to 35 are perspective views schematically illustrating a display device according to respective embodiments of the present disclosure.

Referring to FIG. 32, the display device DD according to an embodiment may be applied to a smart glass 100 including a frame 110 and a lens unit (or lens part) 120. The smart glass 100 is a wearable electronic device that can be worn on a user's face, and may have a structure in which a portion of the frame 110 is folded or unfolded. For example, the smart glass 100 may be a wearable device for augmented reality (AR).

The frame 110 may include a housing 110a supporting the lens part 120 and a leg part 110b for wearing by a user. The leg part 110b may be folded or unfolded by being connected to the housing 110a by a hinge.

A battery, a touch pad, a microphone, and a camera may be embedded into the frame 110. A projector that outputs light, and a processor that controls an optical signal may be embedded into the frame 110.

The lens part 120 may be an optical member that transmits light or reflects light. The lens part 120 may include glass, transparent synthetic resin, or the like.

The lens part 120 may reflect an image by an optical signal transmitted from the projector of the frame 110 by the rear surface of the lens part 120 (for example, a side facing the user's eyes) so that the user's eyes can recognize the image. For example, the user may recognize information such as time and date displayed on the lens part 120. For example, the lens part 120 is a type of display device, and the display device DD according to an embodiment may be applied to the lens part 120.

Figure 33:
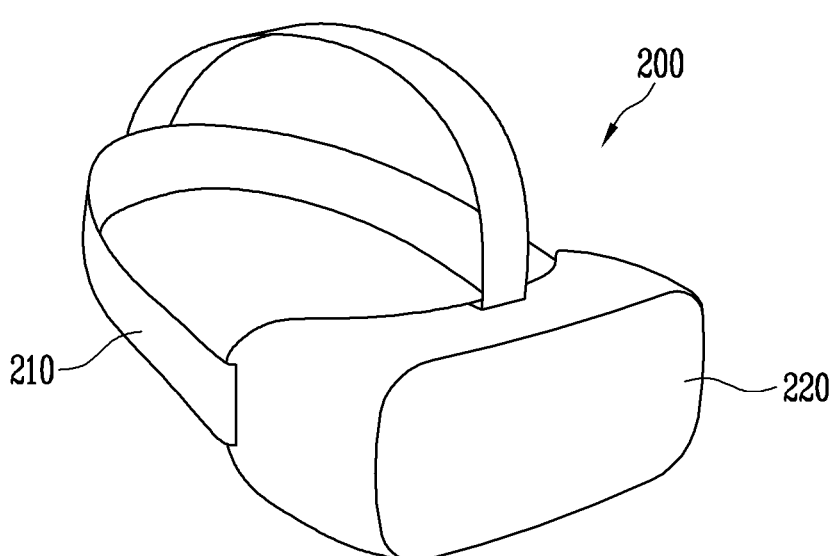

Referring to FIG. 33, the display device DD according to an embodiment may be applied to a head-mounted display (HMD) 200 including a head-mounted band 210 and a display storage case 220. The head mounted display 200 is a wearable electronic device that can be worn on the user's head.

The head-mounted band 210 is connected to the display storage case 220 to fix the display storage case 220. FIG. 33 illustrates that the head-mounted band 210 is able to surround the upper surface and both sides of the user's head, but the disclosure is not limited thereto. The head-mounted band 210 fixes the head mounted display 200 to the user's head, and may be formed in the form of an eyeglass frame or a helmet.

The display storage case 220 may accommodate the display device DD and may include at least one lens. At least one lens is a portion that provides an image to a user. For example, the display device DD according to an embodiment may be applied to a left-eye lens and a right-eye lens implemented in the display storage case 220.

Figure 34:
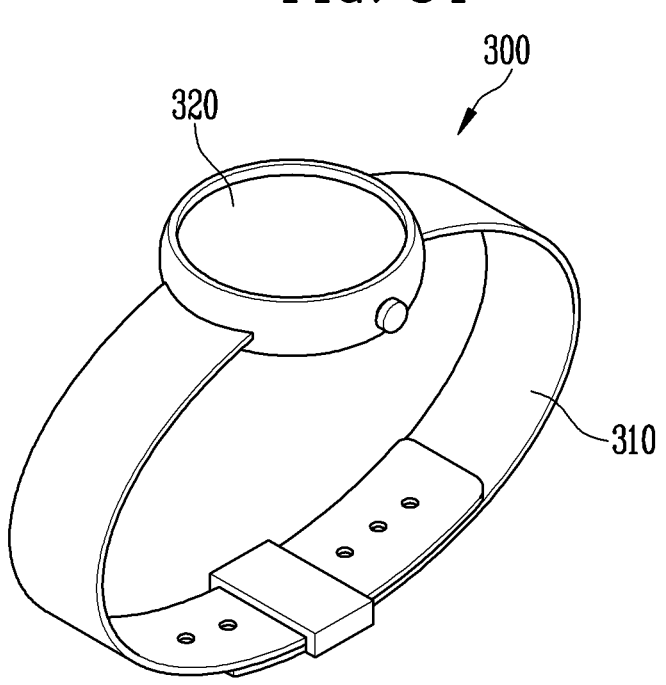

Referring to FIG. 34, the display device DD according to an embodiment may be applied to a smart watch 300 including a strap part 310 and a display part 320.

The smart watch 300 is a wearable electronic device and may have a structure in which the strap part 310 is mounted on a user's wrist. The display device DD according to an embodiment of the present invention is applied to the display part 320 so that image data including time information may be provided to the user.

Figure 35:
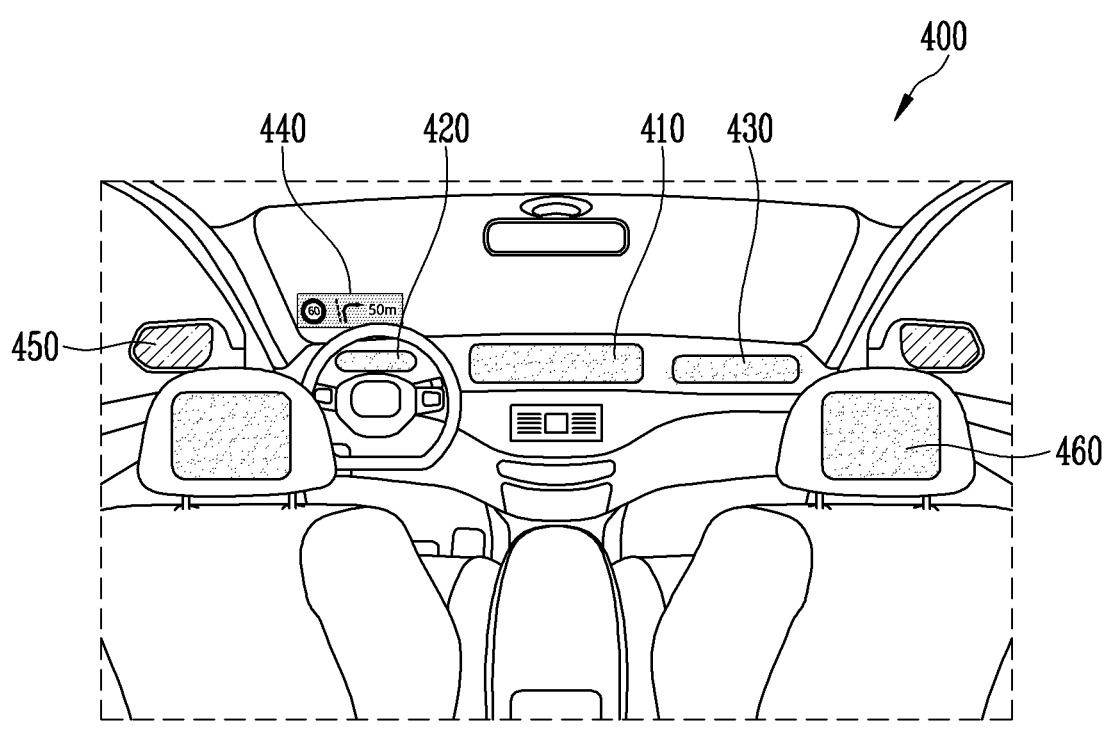

Referring to FIG. 35, the display device DD according to an embodiment may be applied to an automotive display 400. The automotive display 400 may refer to an electronic device provided inside and/or outside of a vehicle to provide image data.

According to an embodiment, the display device DD may be applied to at least one of an infotainment panel 410, a cluster 420, a co-driver display 430, a head-up display 440, a side-view mirror display 450, and a rear-seat display 460, which are provided in a vehicle.

According to the display device and the method of manufacturing the same according to embodiments, the light emitting element including the emission layer for generating light of the first color and first and second light conversion layers for converting light of the first color into light of the second color and light of the third color may be formed, and the light emitting element may be disposed in the pixel. Accordingly, the pixel may include the light emitting element emitting white light as a light source.

According to the above-described embodiments, the color of the light emitted from the pixel may be easily controlled by disposing the color filter on the light emitting element, without forming a separate wavelength conversion layer (for example, a wavelength conversion layer including quantum dots corresponding to a specific color or wavelength band) on the light emitting element of each pixel. Accordingly, the structure and manufacturing process of the pixel including the light emitting element may be simplified, and the degree of integration of the light emitting elements and/or the pixels may be increased. It is also possible to reduce the thickness of the display device including the pixel and improve manufacturing efficiency.

In an embodiment, at least one of the first and second light conversion layers of the light emitting element, and the emission layer of the light emitting element may be formed on the same fabrication substrate. At least one of the first and second light conversion layers of the light emitting element includes the first or second conductivity type dopant, and thus may be integral with the first or second conductivity type semiconductor layer of the light emitting element. Accordingly, the structure and manufacturing process of the light emitting element may be simplified.

In an embodiment, the partition wall surrounding the emission area of each pixel and the light emitting elements of the pixels may be formed at the same time. Accordingly, the structure and the manufacturing process of the display device may be further simplified, and the manufacturing efficiency may be increased.

Effects according to the embodiments are not limited by the above contents presented above, and more various effects are incorporated in the specification.

Although the technical idea of the disclosure has been described in detail according to the above-described embodiments, it should be noted that the above embodiments are for the purpose of explanation and not for the limitation thereof. In addition, those of ordinary skill in the art will appreciate that various modifications can be made thereto within the scope of the technical idea of the disclosure.

Therefore, the scope of the claimed invention should not be limited to the contents described in the detailed description of the specification, but should be determined by the appended claims. In addition, it should be construed that all changes or modifications derived from the meaning and scope of the claims and the equivalent concepts thereof fall within the scope of the disclosure.

What is claimed is:

1. A display device comprising:
a pixel including:
a first electrode;
a light emitting element disposed on the first electrode; and
a second electrode disposed on the light emitting element,
wherein the light emitting element includes:
an emission layer that generates light of a first color;
a first light conversion layer disposed between the emission layer and the first electrode to convert the light of the first color into light of a second color;

a second light conversion layer disposed between the first light conversion layer and the first electrode to convert the light of the first color or the light of the second color into light of a third color;
a first semiconductor layer disposed between the emission layer and the second electrode and including a first conductivity type dopant; and
a transparent electrode disposed between the first light conversion layer and the second light conversion layer.

2. The display device of claim 1, wherein
the emission layer includes a single-quantum well or a multi-quantum well that emits the light of the first color, and
the first light conversion layer includes a single-quantum well or a multi-quantum well that absorbs the light of the first color and emits the light of the second color and includes a second conductivity type dopant.

3. The display device of claim 2, wherein the second light conversion layer includes:
a single-quantum well or a multi-quantum well that absorbs the light of the first color or the light of the second color and emits the light of the third color; and
the second conductivity type dopant.

4. The display device of claim 1, wherein the second light conversion layer includes:
a single-quantum well or a multi-quantum well that absorbs the light of the first color or the light of the second color and emits the light of the third color; and
the first conductivity type dopant or the second conductivity type dopant.

5. The display device of claim 1, wherein the pixel further includes an insulating film disposed on a surface of the light emitting element to surround side surfaces of the emission layer, the first light conversion layer, the second light conversion layer, and the first semiconductor layer.

6. The display device of claim 1, further comprising a color filter disposed on the light emitting element.

7. The display device of claim 1, further comprising a bank disposed outside the pixel and surrounding the light emitting element.

8. The display device of claim 7, wherein
the bank includes a light emitting stack structure,
the light emitting stack structure of the bank and the light emitting element include a same material and a same stack structure.

9. The display device of claim 8, further comprising:
a pad electrode disposed under the bank; and
an insulating layer disposed between the pad electrode and the bank.

10. The display device of claim 1, wherein the first color, the second color, and the third color are blue, green, and red, respectively.

11. A display device comprising:
a pixel including:
a first electrode;
a light emitting element disposed on the first electrode; and
a second electrode disposed on the light emitting element,
wherein the light emitting element includes:
an emission layer that generates light of a first color;
a first light conversion layer disposed between the emission layer and the first electrode to convert the light of the first color into light of a second color;
a second light conversion layer disposed between the first light conversion layer and the first electrode to convert the light of the first color or the light of the second color into light of a third color;

a transparent electrode disposed between the first light conversion layer and the second light conversion layer; and a first semiconductor layer disposed between the emission layer and the second electrode and including a first conductivity type dopant, wherein the emission layer includes a nitride-based semiconductor material.

* * * * *